(12) United States Patent
Tanaka

(10) Patent No.: US 6,856,630 B2
(45) Date of Patent: Feb. 15, 2005

(54) BEAM HOMOGENIZER, LASER IRRADIATION APPARATUS, SEMICONDUCTOR DEVICE, AND METHOD OF FABRICATING THE SEMICONDUCTOR DEVICE

(75) Inventor: Koichiro Tanaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/774,637

(22) Filed: Feb. 1, 2001

(65) Prior Publication Data

US 2001/0010702 A1 Aug. 2, 2001

(30) Foreign Application Priority Data

Feb. 2, 2000  (JP) ........................................ 2000-024615

(51) Int. Cl.[7] ............................. H01S 3/10; G02B 17/00
(52) U.S. Cl. ...................... 372/9; 372/29.02; 359/366; 359/855; 359/859
(58) Field of Search .......................... 372/9, 29.02, 99; 359/366, 850, 855, 859, 861, 365

(56) References Cited

U.S. PATENT DOCUMENTS

| | | | |
|---|---|---|---|
| 4,330,363 A | | 5/1982 | Biegesen et al. |
| 4,475,027 A | | 10/1984 | Pressley |
| 4,685,780 A | * | 8/1987 | Kimura ........................ 359/851 |
| 4,692,583 A | * | 9/1987 | Kimura et al. ........... 219/121.6 |
| 4,733,944 A | | 3/1988 | Fahlen et al. |
| 4,974,919 A | | 12/1990 | Muraki et al. |
| 5,005,969 A | | 4/1991 | Kataoka |
| 5,148,326 A | | 9/1992 | Hohberg |
| 5,285,320 A | | 2/1994 | Hohberg |
| 5,440,423 A | * | 8/1995 | Ogura ........................... 359/365 |
| 5,561,081 A | | 10/1996 | Takenouchi et al. |
| 5,643,826 A | | 7/1997 | Ohtani et al. |
| 5,690,845 A | * | 11/1997 | Fuse ......................... 219/121.74 |

(List continued on next page.)

FOREIGN PATENT DOCUMENTS

| | | | | |
|---|---|---|---|---|
| DE | 197 53 344 | | 6/1999 | |
| GB | 2270196 A | * | 3/1994 | .......... H01S/3/121 |
| JP | 60-105216 | | 6/1985 | |
| JP | 63-006540 | | 1/1988 | |
| JP | 07-130652 | | 5/1995 | |
| JP | 09234579 A | * | 9/1997 | .......... B23K/26/06 |
| JP | 10-258383 | | 9/1998 | |

OTHER PUBLICATIONS

H. Endert et al., "Excimer Laser: A New Tool for Precision Micromachining," Optical and Quantum Electronics 27, 1995, pp. 1319–1335.

H. Hayashi et al., "Fabrication of Low–Temperature Bottom–Gate Poly–Si TFTs on Large–Area Substrate by Linear–Beam Excimer Laser Crystallization and Ion Doping Method," IEDM95, 1995, pp. 829–832.

Y. Helen et al., Reproducible High Field Effect Mobility Polysilicon Thin Film Transistors Involving Pulsed $Nd:YVO_4$ Laser Crystallization, IEDM99, 1999, pp. 297–300.

U.S. Appl. No. 09/741,026, including specification, drawings and filing receipt, "Laser Irradiation Apparatus and Method of Fabricating a Semiconductor Device" Koichiro Tanaka et al., Dec. 21, 2000.

*Primary Examiner*—Tom Thomas
*Assistant Examiner*—José R. Diaz
(74) *Attorney, Agent, or Firm*—Eric J. Robinson; Robinson Intellectual Property Law Office, P.C.

(57) ABSTRACT

An optical system (in FIGS. 1A and 1B) wherein a rectilinear laser beam of homogeneous energy distribution is defined for annealing a non-single crystalline semiconductor film (a surface to-be-irradiated 1108), is constructed of reflectors (1106, 1107 etc.) easily and inexpensively without including lenses of transmission type. The rectilinear laser beam can be defined having a length of at least 600 (mm) which corresponds to the shorter latus of a large-sized substrate for mass production.

18 Claims, 29 Drawing Sheets top view

U.S. PATENT DOCUMENTS

| | | | | |
|---|---|---|---|---|
| 5,775,799 A | * | 7/1998 | Forkner | 362/268 |
| 5,858,822 A | * | 1/1999 | Yamazaki et al. | 438/166 |
| 5,900,980 A | * | 5/1999 | Yamazaki et al. | 359/619 |
| 5,923,962 A | | 7/1999 | Ohtani et al. | |
| 5,966,594 A | | 10/1999 | Adachi et al. | |
| 6,021,154 A | * | 2/2000 | Unternahrer | 372/108 |
| 6,038,075 A | * | 3/2000 | Yamazaki et al. | 359/626 |
| 6,100,961 A | | 8/2000 | Shiraishi et al. | |
| 6,212,012 B1 | | 4/2001 | Tanaka | |
| 6,215,595 B1 | | 4/2001 | Yamazaki et al. | |
| 6,239,913 B1 | * | 5/2001 | Tanaka | 359/619 |
| 2001/0005606 A1 | | 6/2001 | Tanaka et al. | |
| 2003/0203549 A1 | * | 10/2003 | Yamazaki et al. | 438/166 |

* cited by examiner

Fig. 1A top view
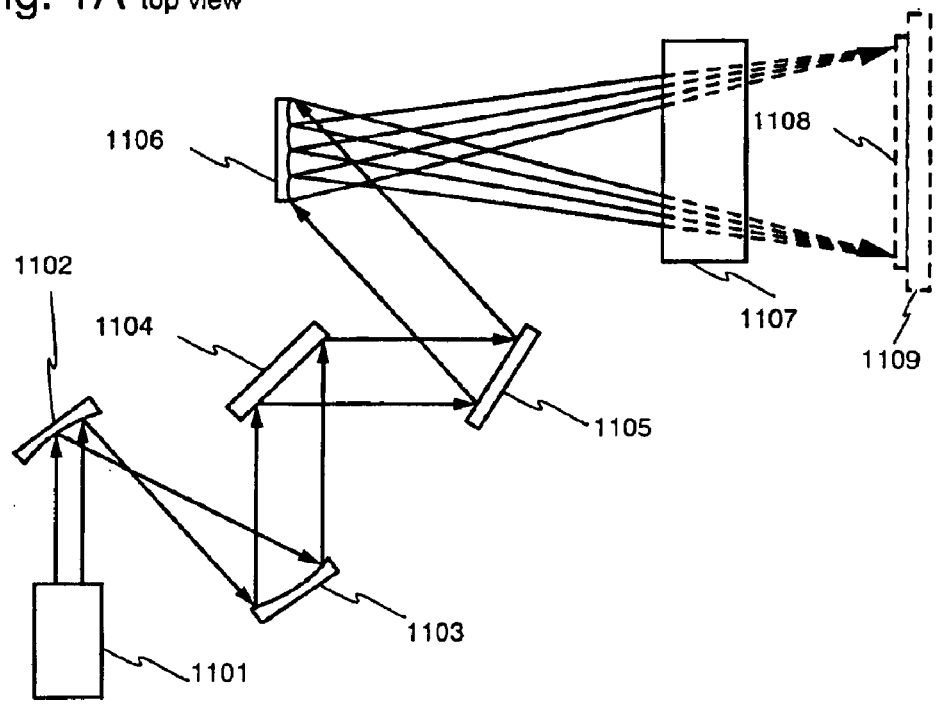
Fig. 1B side view
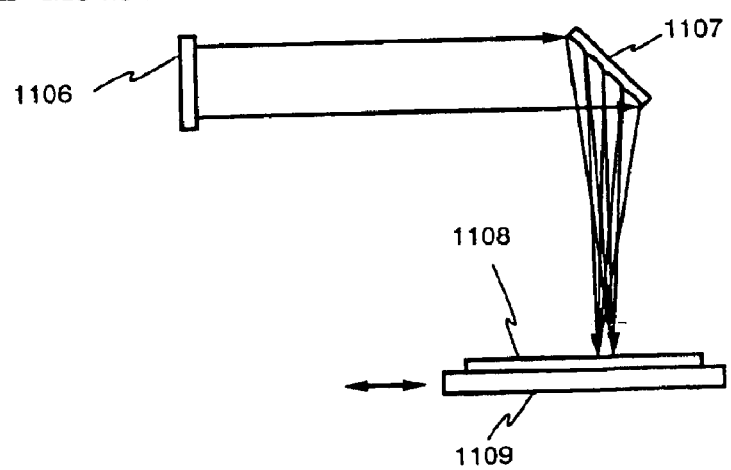

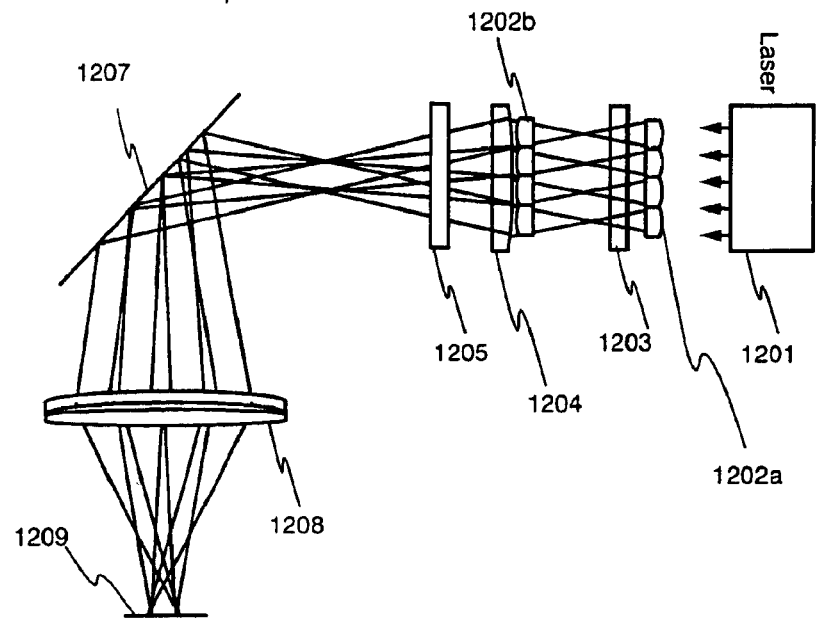
Fig. 2A side view    prior art
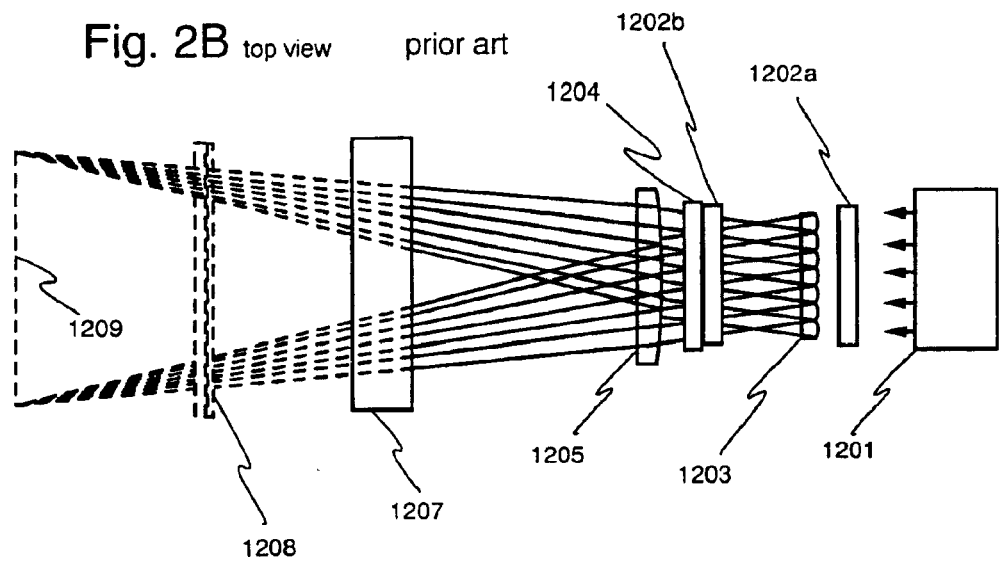
Fig. 2B top view    prior art Fig. 4A top view
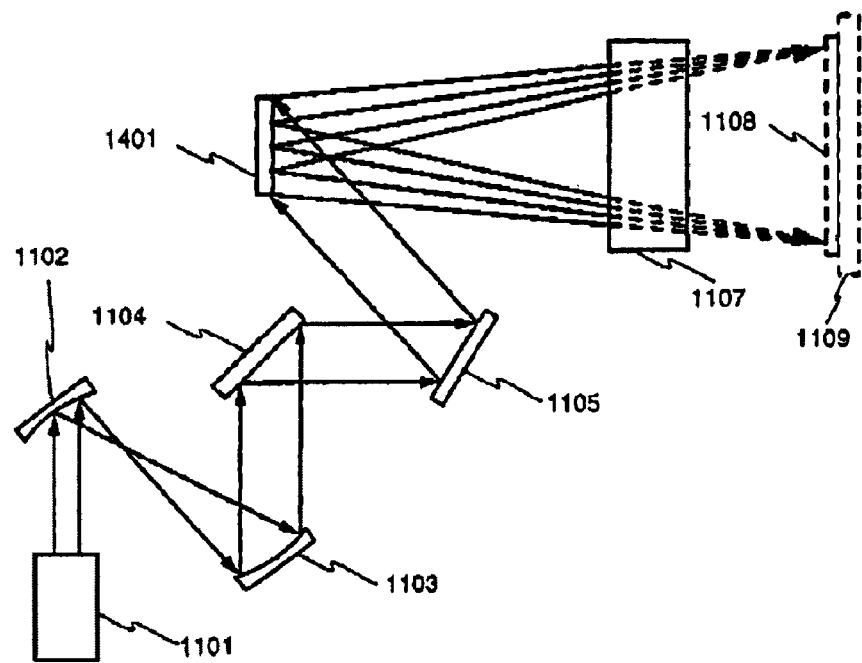
Fig. 4B side view
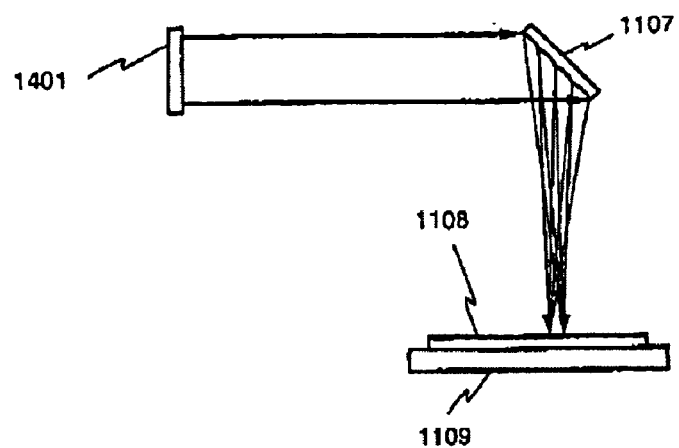

Fig. 5A top view
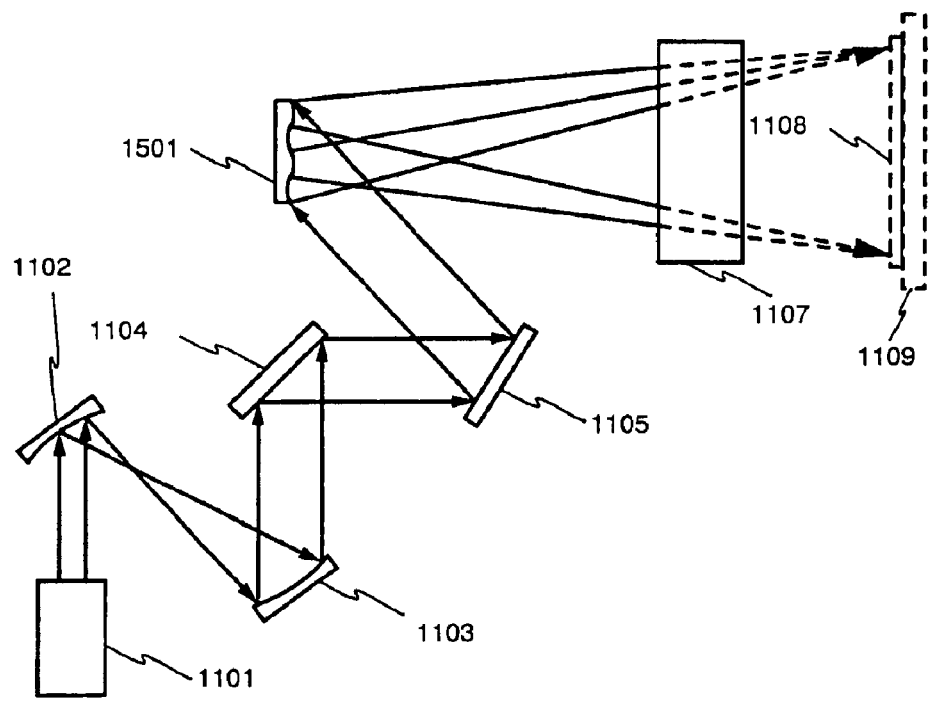
Fig. 5B side view
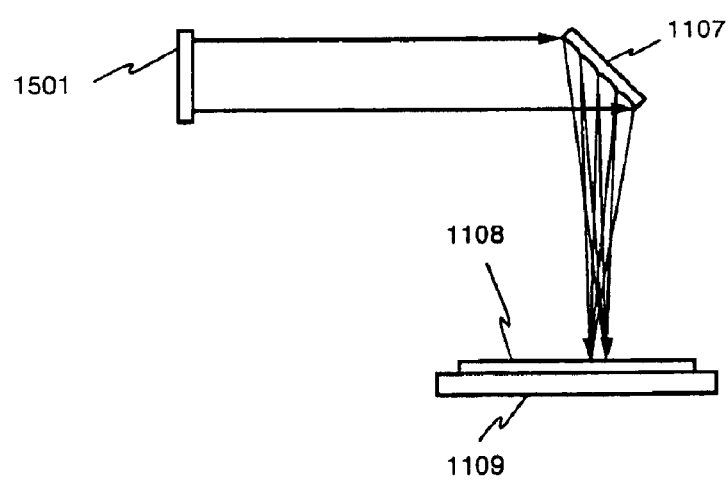

Fig. 6A top view
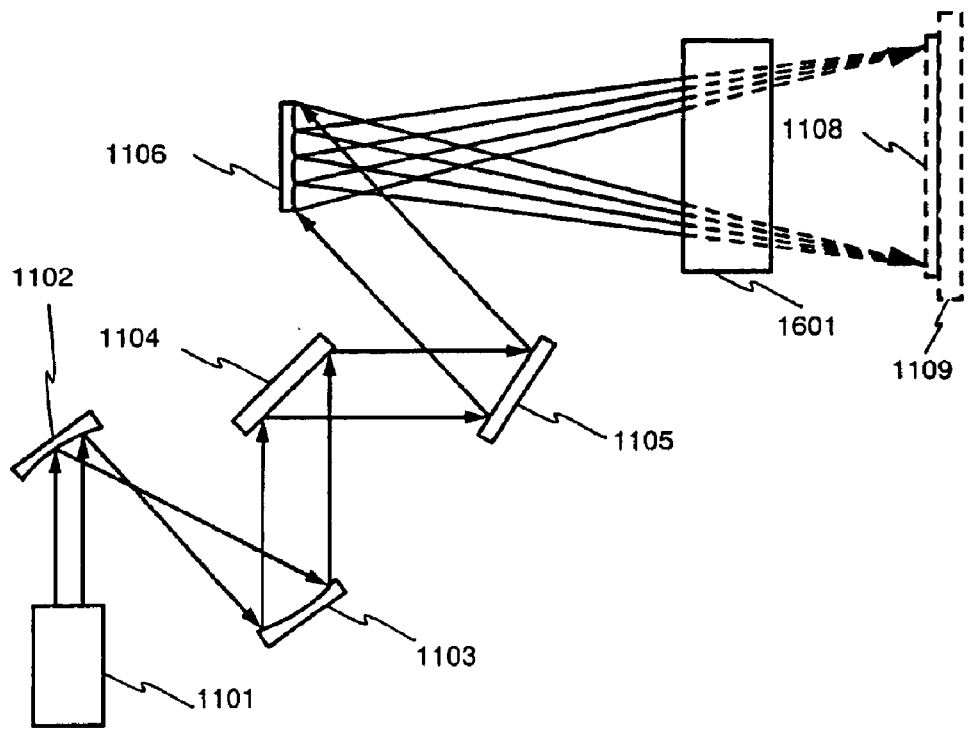
Fig. 6B side view
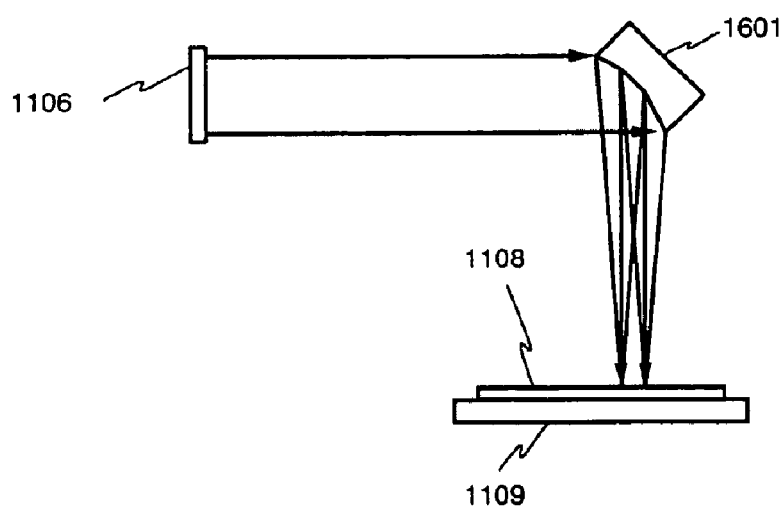

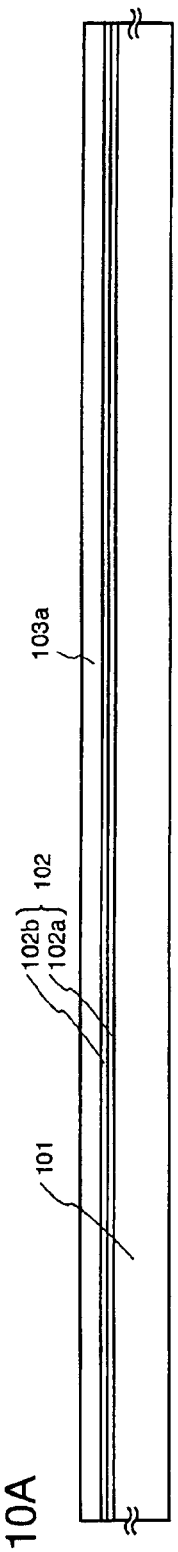
Fig. 10A
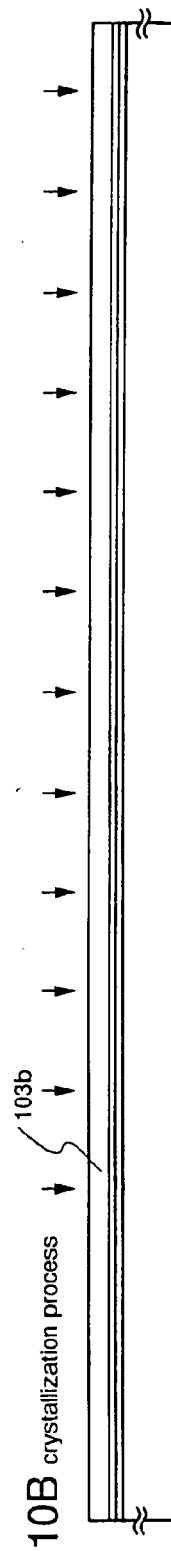
Fig. 10B crystallization process
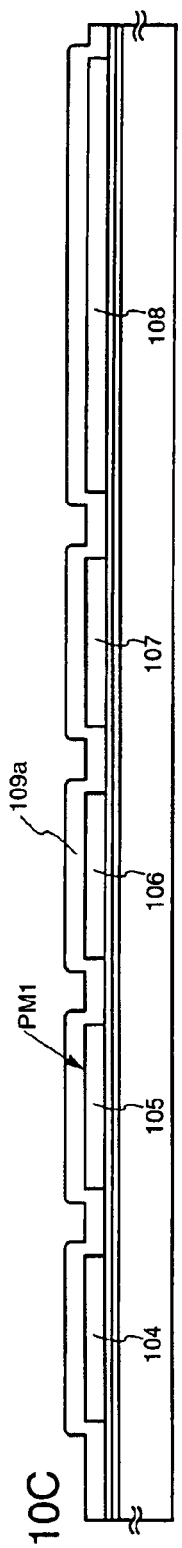
Fig. 10C
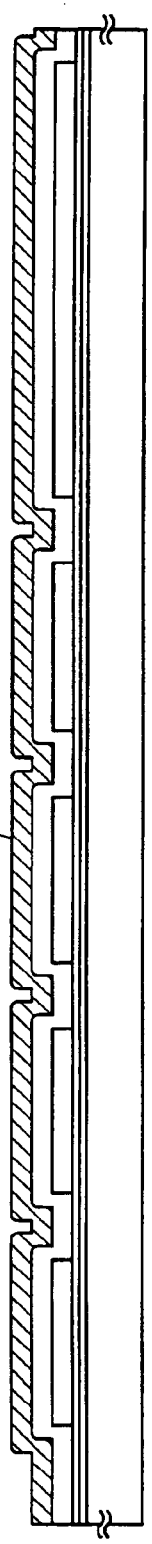
Fig. 10D

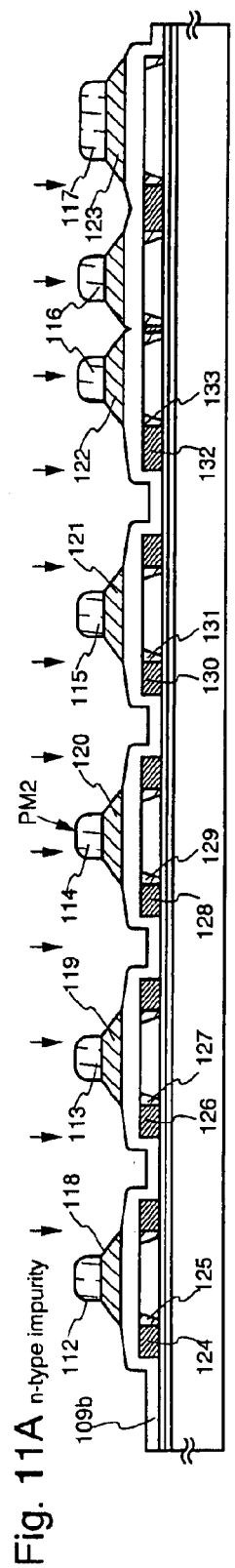
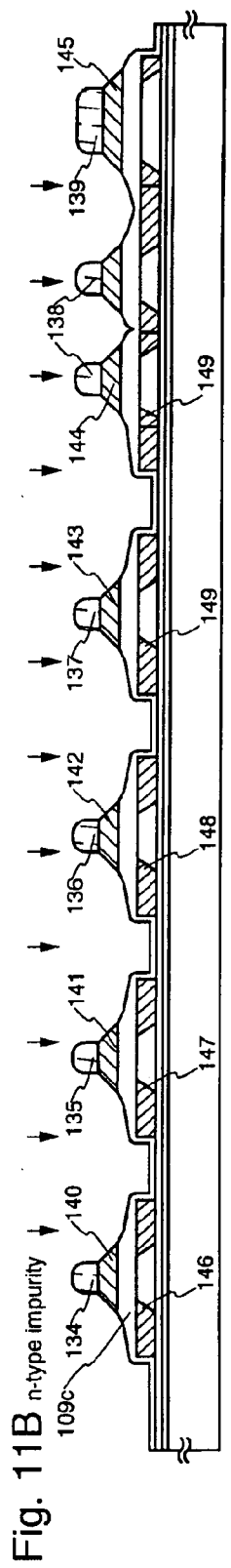
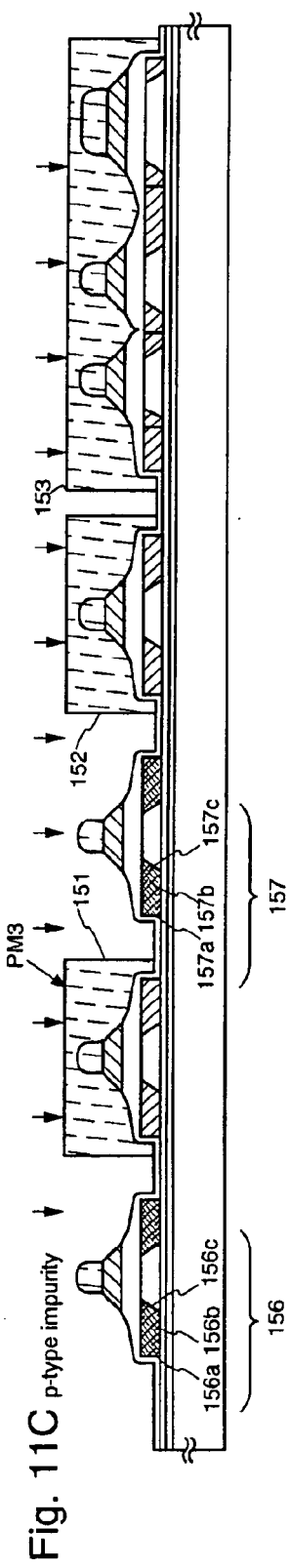

BEAM HOMOGENIZER, LASER IRRADIATION APPARATUS, SEMICONDUCTOR DEVICE, AND METHOD OF FABRICATING THE SEMICONDUCTOR DEVICE

BACKGROUND OF THE INVENTION

1. Field of the Invention

The present invention relates to an apparatus which homogenizes the energy distribution of a laser beam in a certain specified area. It relates also to a method for the homogenization. In addition, the present invention relates to a semiconductor device which has a circuit including a thin film transistor fabricated by the use of means for the homogenization. By way of example, it relates to the constructions of an electro-optical device which is typified by a liquid crystal display device, and an electric equipment in which such an electro-optical device is installed as a component. Incidentally, here in this specification, the expression "semiconductor device" shall signify general devices which can function by utilizing semiconductor properties, and it shall cover the electro-optical device and electric equipment mentioned above.

2. Description of the Related Art

In recent years, researches have been extensively made on techniques wherein an amorphous semiconductor film or a crystalline semiconductor film (namely, a semiconductor film having the crystallinity of a poly-crystalline, a micro-crystalline or the like different from a single crystal), that is, a non-single crystalline semiconductor film which is formed on an insulating substrate of glass or the like is subjected to laser annealing, thereby to be crystallized or to enhance the crystallinity. A silicon film is often employed as the semiconductor film.

As compared with a quartz substrate having heretofore been often used, the glass substrate is inexpensive and is rich in machinability, and hence, it has the merit of being capable of the easy manufacture of a large area substrate. Therefore, the researches are vigorously made. The reason why a laser is used for the crystallization by preference, is that the melting point of the glass substrate is low. The laser can give high energy to the non-single crystalline semiconductor film only without considerably changing the temperature of the substrate.

A crystalline silicon film formed by performing the laser annealing has a high mobility. Therefore, thin film transistors (TFTs) are formed by employing the crystalline silicon film, and they are actively utilized for, for example, a liquid-crystal electro-optical device of monolithic type in which the TFTs for pixel drive and for driver circuits are fabricated on one glass substrate. Since the crystalline silicon film is made up of a large number of crystal grains, it is called a "poly-crystalline silicon film" or "poly-crystalline semiconductor film".

Besides, a method wherein a beam from a pulsed lasing type laser of high power, such as excimer laser, is worked by an optical system so as to define a tetragonal spot having a size of several (cm square) or a line having a length of at least 10 (cm) on a surface to-be-irradiated, and the surface to-be-irradiated is scanned by the worked laser beam (in other words, the projected position of the laser beam is moved relatively to the surface to-be-irradiated), thereby to carry out the laser annealing, is preferably used because it is excellent in industry owing to a good mass-productivity.

Especially with the rectilinear laser beam, the whole surface to-be-irradiated can be irradiated with the laser beam by the scanning in only a direction orthogonal to the lengthwise direction of this rectilinear laser beam, unlike in the case of the spot-like laser beam with which the scanning needs to be done in the lengthwise and widthwise directions of the surface to-be-irradiated, so that the high mass-productivity is attained by the annealing with the rectilinear laser beam. The scanning of the surface to-be-irradiated in the direction orthogonal to the lengthwise direction of the rectilinear laser beam is done for the reason that the scanning direction is the most efficient. Owing to the high mass-productivity, it is currently becoming the mainstream to use for the laser annealing the rectilinear laser beam which is obtained in such a way that the laser beam of the pulsed lasing type excimer laser is worked by the appropriate optical system.

FIGS. 2A and 2B show an example of an optical system for working the cross section of a laser beam into the shape of a line on a surface to-be-irradiated. The optical system shown in FIGS. 2A and 2B is very common. The optical system functions, not only to change the cross-sectional shape of the laser beam into the rectilinear shape, but also to homogenize the energy of the laser beam on the surface to-be-irradiated. In general, an optical system which homogenizes the energy of a beam is called a "beam homogenizer". The optical system shown in FIGS. 2A and 2B is also the beam homogenizer.

When an excimer laser emitting ultraviolet radiation is used as a light source, the constituent material of the optical system may be, for example, quartz entirely. This is because a high transmission factor is attained. Besides, coatings should favorably be ones capable of attaining transmission factors of at least 99 (%) for the wavelengths of the excimer laser employed.

First, a side view in FIG. 2A will be referred to. A laser beam emergent from a laser oscillator 1201 is split in a direction orthogonal to the traveling direction of the laser beam by cylindrical lens arrays 1202a and 1202b. Here in this specification, the orthogonal direction shall be termed the "vertical direction". When a mirror is incorporated midway of the optical system, the vertical direction curves into the direction of light bent by the mirror. In the illustrated construction, the emergent laser beam is split into four. The split laser beams are once brought together into one laser beam by a cylindrical lens 1204. The laser beam is split again, and the resulting laser beams are reflected by a mirror 1207. Thereafter, the reflected laser beams are condensed into one laser beam again on a surface to-be-irradiated 1209 by a doublet cylindrical lens 1208. The expression "doublet cylindrical lens" signifies a lens which is made up of two cylindrical lenses. Thus, the energy of the rectilinear laser beam in the widthwise direction thereof is homogenized, and the width of the rectilinear laser beam is determined.

Next, a top view in FIG. 2B will be referred to. A laser beam emergent from a laser oscillator 1201 is split in a direction which is orthogonal to the traveling direction of the laser beam and which is also orthogonal to the vertical direction explained above, by a cylindrical lens array 1203. Here in this specification, the orthogonal direction shall be termed the "lateral direction". When a mirror is incorporated midway of the optical system, the lateral direction curves into the direction of light bent by the mirror. In the illustrated construction, the emergent laser beam is split into seven. Thereafter, the split laser beams are combined into one laser beam on a surface to-be-irradiated 1209 by a cylindrical lens 1205. A mirror 1207, et seq. are depicted by broken lines, which indicate exact optical paths and the exact positions of a lens 1208 and the surface to-be-irradiated 1209 in the case where the mirror 1207 is not arranged. Thus, the energy of the rectilinear laser beam in the lengthwise direction thereof is homogenized, and the length of the rectilinear laser beam in the lengthwise direction is determined.

As described above, the cylindrical lens arrays 1202a and 1202b or the cylindrical lens array 1203 serve(s) as lens means for splitting the laser beam. The homogeneity of the laser beam to be attained is determined by the number of the splitting (split laser beams).

The lenses mentioned above are made of synthetic quartz in order to conform to an excimer laser. Besides, the surfaces of the lenses are formed with coatings in order to efficiently transmit the beams of the excimer laser. Thus, a transmission factor for the excimer laser beam(s) per lens has reached at least 99 (%).

The rectilinear laser beam worked by the above construction is projected overlappingly while being gradually shifted in the widthwise direction of the laser beam, whereby the whole surface of a non-single crystalline silicon film, for example, can be subjected to laser annealing so as to be crystallized or to enhance the crystallinity thereof.

Now, there will be described a typical example of a method of fabricating a semiconductor film to-be-irradiated.

First, a "Corning 1737 Glass" substrate (manufactured by Corning Incorporated) being of 0.7 (mm) in thickness and 5 (inches square) was prepared. Using a plasma CVD equipment, an $SiO_2$ film (silicon oxide film) having a thickness of 200 (nm) was formed on the substrate, and an amorphous silicon film (hereinbelow, expressed as "a-Si film") having a thickness of 50 (nm) was formed on the surface of the $SiO_2$ film. The resulting substrate was heated at a temperature of 500 (° C.) in a nitrogen atmosphere for one (hour), thereby to lower the hydrogen content of the a-Si film. Thus, the tolerance of the a-Si film to a laser was remarkably enhanced.

An XeCl excimer laser (having a lasing wavelength of 308 (nm) and a pulse width of 30 (ns)) "L3308" manufactured by Lambda Physik, Inc. was used as a laser oscillator. The laser oscillator emits a pulsed laser beam, and is capable of producing an energy level of 500 (mJ) per pulse. The size of the laser beam is 10 (mm)×30 (mm) (both being in terms of half-value widths) at the exit of this laser beam. Here in this specification, the exit of the laser beam shall be defined on a plane perpendicular to the traveling direction of this laser beam as viewed immediately after the emergence thereof from the laser oscillator.

In general, the shape of a laser beam emitted from an excimer laser is a rectangle, and it falls within a range of about 1–5 in terms of an aspect ratio. The intensity of the laser beam demonstrates a Gaussian distribution where it is higher as the center of the laser beam comes nearer. The laser beam in the example was changed into a rectilinear laser beam having a uniform energy distribution and a size of 125 (mm)×0.4 (mm), by the optical system shown in FIGS. 2A and 2B.

According to the inventor's experiment, in the case of irradiating the above semiconductor film with the laser beam, about 1/10 of the width (half-value width) of the rectilinear laser beam was the most suitable as the pitch of the overlap. Thus, the homogeneity of the crystalline semiconductor film was enhanced. Since the half-value width was 0.4 (mm) in the example, the laser beam was projected by setting the pulse frequency of the excimer laser at 30 [Hz] and the scanning speed thereof at 1.0 [mm/s]. On this occasion, an energy density on the surface to be irradiated with the laser beam was set at 400 ($mJ/cm^2$). The method thus far explained is a very common one which is employed for crystallizing the semiconductor film by using the rectilinear laser beam.

Regarding the optical system shown in FIGS. 2A and 2B, high machining precisions are required of the cylindrical lens arrays, the cylindrical lenses and the doublet cylindrical lens. Besides, since the large number of lenses are employed, the positional adjustments among them are difficult. Therefore, a desired beam can be obtained for the first time when a considerably skilled operator makes the adjustments. In addition, since the optical system is mainly constructed of optical lenses, the deteriorations of the optical lenses attributed to the laser beams are inevitable.

By way of example, in case of employing a KrF excimer laser (at a lasing wavelength of 248 (nm)) as a light source, even when lenses made of quartz of excimer grade are adopted as the optical lenses, they have lifetimes of, at most, several years, and are very costly in consideration of the price of the optical system.

When the optical system has deteriorated, the overall transmission factor thereof lowers chiefly. This is a serious problem especially in a process for crystallizing a semiconductor film as requires high power.

Moreover, in recent years, the areas of substrates have been remarkably enlarged in order to enhance productivities. The sizes of substrates which are being developed anew and which are to be dealt with in a mass-producing plant, are being standardized as at least 600 (mm)×720 (mm). Consequently, the length of a rectilinear laser beam needs to be, at least, equal to that of the shorter latus of each of the substrates. Since the rectilinear laser beam of such a length can laser-anneal the whole surface of one large-area substrate by one time of scanning, it affords an excellent productivity and is very useful.

In contrast, in a case where the whole surface of one large-area substrate is to be laser-annealed using a rectilinear laser beam the length of which is less than that of the shorter latus of the large-area substrate, the rectilinear laser beam must be scanned a plurality of number of times. With such laser annealing, a semiconductor device cannot be fabricated at the boundary between, for example, a substrate part crystallized by the first laser-annealing scanning and a substrate part crystallized by the second laser-annealing scanning. Even if the semiconductor device is fabricated at the boundary, no satisfactory characteristics may possibly be attained.

However, when the rectilinear laser beam whose length is at least 600 (mm) is to be defined using the optical system of the prior-art example as it is, the size of the doublet cylindrical lens 1208 approximates to 600 (mm). A lens having such a size is enormously expensive, (nearly hundred million yen) and also the deterioration of the lens takes place, so that the lens is difficult of incarnation in practical use.

SUMMARY OF THE INVENTION

The present invention consists in that the construction of the optical system for forming the rectilinear laser beam as described above is entirely substituted by an optical system of reflection type. Since the construction is entirely changed into the reflection type optical system, the deteriorations of the lenses attributed to the laser beams, the influences of aberrations ascribable to the spherical lenses, etc. are eliminated. Besides, the size of the optical system can be enlarged far more easily with the reflection type optical system than with the lenses of transmission type. Thus, the elongation of the rectilinear laser beam is facilitated by the reflection type optical system. In addition, the difficulty of the adjustments can be simultaneously eliminated by the reflection type optical system.

The present invention is effective especially for laser beams of short wavelengths. In particular, although laser beams whose wavelengths are at most 250 (nm) inflict severe damages on the transmission type lenses, the damages on reflectors can be made comparatively light by forming appropriate coatings. Moreover, even when the reflector has been damaged, it can be restored into its original state by re-forming only the surface coating. On the other hand, the transmission type lens is damaged, not only at its surface coating, but also in its inner part. Therefore, when the transmission type lens has deteriorated, it must be replaced with a lens fabricated anew.

FIGS. 1A and 1B show an example of an optical system for defining a rectilinear laser beam according to the present invention. The optical system is entirely constructed of reflectors.

First, a top view in FIG. 1A will be referred to. A laser beam emergent from a laser oscillator 1101 is propagated in the direction of arrows indicated in FIG. 1A. The laser beam is expanded by parabolic mirrors 1102 and 1103. These components are unnecessary in a case where the laser beam emergent from the laser oscillator 1101 is sufficiently large.

The laser beam may well be expanded in only one direction thereof, depending upon the shape of the laser beam emergent from the laser oscillator 1101. In this case, cylindrical parabolic mirrors are employed as the parabolic mirrors 1102 and 1103. Here in this specification, the "cylindrical parabolic mirror" shall be defined as a cylindrical parabolic mirror whose reflective surface agrees with a locus that is depicted by a part of a parabola 1306 when the part of the parabola 1306 is translated in a direction perpendicular to a plane containing the parabola 1306. In other words, FIG. 3 shows a cross section of the cylindrical parabolic mirror 1301.

The optical system of the present invention comprises plane mirrors, parabolic mirrors and cylindrical parabolic mirrors in combination.

The expanded laser beam is caused to enter a reflector 1106 made up of a plurality of cylindrical parabolic mirrors, by two plane mirrors 1104 and 1105. Any desired straight lines contained on reflective surfaces possessed by the plurality of cylindrical parabolic mirrors are arranged in parallel with each other/one another. The reflector 1106 resembles a concave cylindrical lens array, but the curved surface of the former differs in shape from that of the latter. The two plane mirrors 1104, 1105 fulfill the function of causing the expanded laser beam to enter the reflector 1106 exactly. As understood from the function thereof, the two plane mirrors 1104, 1105 need not always be restrictive, but they may well be substituted by three or more plane mirrors.

Reflected light from any of the cylindrical parabolic mirrors constituting the reflector 1106 is once condensed on the focus of the parabolic surface, and it is spread into a certain specified range on a surface to-be-irradiated 1108 depicted by broken lines. Parts depicted by such broken lines in the top view are the exact optical paths of laser beams in the case where a reflector 1107 is not arranged, and the surface to-be-irradiated 1108 and a stage 1109 which are arranged in conformity with the optical paths.

The position of the focus of a parabolic mirror is determined by the shape of the parabolic surface thereof. Therefore, when the position of the focus of each of the cylindrical parabolic mirrors constituting the reflector 1106 is appropriately determined, the lights from all the cylindrical parabolic mirrors can be collected within the certain specified range. Thus, the energy distribution of the resulting rectilinear laser beam in the lengthwise direction thereof is homogenized. The reflector 1107 in the top view is similar to the reflector 1106. The laser beams are curved in a direction perpendicular to the sheet of the drawing by the reflector 1107.

An example of the reflector 1106 made up of the plurality of cylindrical parabolic mirrors is shown in FIG. 3. Referring to the figure, a reflector 1300 made up of a plurality of cylindrical parabolic mirrors includes two cylindrical parabolic mirrors 1301, 1302. As is generally known, a parabolic mirror condenses parallel light rays on one point. Therefore, when the parabolic mirror is appropriately formed, light can be reflected as indicated by an arrow in FIG. 3. Arrows in FIG. 3 indicate the traveling directions of laser beams. The extension of the reflective surface of the cylindrical parabolic mirror 1301 is depicted by a broken line 1306. A parabola is formed by the extension of the broken line 1306. The focus of the parabola lies at a point 1304, and the direction of the laser beam to enter the cylindrical parabolic mirror 1301 is chosen so that the laser beam may be condensed on the point 1304. When the laser beam is caused to enter the mirror 1301 in the direction parallel to a straight line which is in line symmetry with the parabola 1306, the laser beam can be condensed on the point 1304.

The laser beam reflected from the cylindrical parabolic mirror 1301 is spread into a certain specified range on a surface to-be-irradiated 1303. Also, the laser beam similarly reflected from the cylindrical parabolic mirror 1302 is once condensed on the focus 1305 of a parabola containing this cylindrical parabolic mirror 1302 and is thereafter spread into a certain specified range on the surface to-be-irradiated 1303. The two laser beams reflected from the two cylindrical parabolic mirrors 1301, 1302 are unified on the surface to-be-irradiated 1303. That is, the laser beams are homogenized on the surface to-be-irradiated 1303.

Next, a side view in FIG. 1B will be referred to. Laser beams reflected from a reflector 1106 are propagated to a reflector 1107, and are condensed on the respective foci of a plurality of cylindrical parabolic surfaces constituting the reflector 1107. Thereafter, the laser beams condensed on the plurality of foci are respectively spread within the same area on a surface to-be-irradiated 1108. Thus, the energy distribution of the resulting rectilinear laser beam in the widthwise direction thereof is homogenized. Even when each of the reflectors 1106, 1107 has any appropriate shape other than explained above, the same function is fulfilled. Such appropriate shapes will be detailed in the description of embodiments.

By way of example, the reflector 1107 functions to homogenize the energy of the rectilinear laser beam in the widthwise direction thereof, and hence, it need not expand the laser beams greatly. Therefore, the reflector 1107 can be substituted by a reflector 1601 (refer to FIGS. 6A and 6B) made up of a plurality of plane mirrors. The energy distribution of the rectilinear laser beam can be homogenized by collecting reflected lights from the respective plane mirrors onto an identical area. The reflector 1601 will be detailed in one of the embodiments later.

Here in this specification, a reflector which functions to split a laser beam, just as the reflector 1106 or 1107, shall be termed a "beam splitting reflector". The beam splitting reflector in this specification functions also to unify split laser beam.

When it is considered to form a rectilinear laser beam longer than 600 (mm) by adopting the optical system of the present invention, a reflector whose size becomes the largest is the reflector 1107. The reflector 1107 corresponds to the cylindrical lens array 1202a, cylindrical lens 1204, cylindrical lens array 1202b and doublet cylindrical lens 1208 in the prior-art optical system shown in FIGS. 2A and 2B. In order to form the rectilinear laser beam longer than 600 (mm) by using the prior-art optical system, the size of the doublet cylindrical lens 1208 must be made about 600 (mm). Therefore, the function of the reflector 1107 in the elongation of the rectilinear laser beam is very effective.

The other reflectors can be fabricated with comparatively small sizes in spite of the elongation of the rectilinear laser beam. Considering the easy fabrication of the optical system, therefore, lenses of the transmission type used in the prior art may well be employed for the other reflectors. However, the transmission type lenses for light whose wavelength falls within the range of ultraviolet radiation and whose power is high have the disadvantages of being very expensive and being liable to deteriorate. After all, accordingly, it is unfavorable to utilize the transmission type lenses for the optical system of the present invention.

Especially expensive in the prior-art optical system are the cylindrical lens arrays and the doublet cylindrical lens. Only these lenses may well be substituted by the construction of the optical system of the present invention because curtailment in cost is a factor indispensable to the elongation of the rectilinear laser beam. That is, the indispensable reflectors in the present invention are those 1106 and 1107. (The reflectors 1106 and 1107, however, may well be substituted by reflectors fulfilling the same functions. Examples of such reflectors will be described in the embodiments later.) The other reflectors may well be substituted by transmission type lenses so as to be replaced each time they have deteriorated. However, the optical system constructed only of the reflectors as shown in FIGS. 1A and 1B is still considered to be the most economical.

In the present invention, when the size of the laser beam is sufficient, the two parabolic mirrors 1102, 1103 for expanding the laser beam are not required. Besides, in a case where the direction of entrance of the laser beam need not be altered, for example, in a case where the laser oscillator 1101 itself can move to alter the direction of entrance of the laser beam, the plane mirrors 1104, 1105 are not required. That is, the optical subsystem for expanding the laser beam, and the optical subsystem for altering the direction of entrance of the laser beam are not always required for the present invention.

The laser oscillator 1101 combined with the optical system of the present invention should preferably emit the laser beam whose power is high and whose wavelength region is absorbed much by a semiconductor film to-be-irradiated. In a case where the semiconductor film is a silicon film, the wavelength of the laser beam to be emitted by the laser oscillator 1101 employed should preferably be at most 600 (nm) in consideration of the absorption factor of the silicon film. Laser oscillators emitting such laser beams include, for example, an excimer laser, a YAG laser (higher harmonics) and a glass laser (higher harmonics).

In addition, although high power has not been attained with present-day technology yet, laser oscillators emitting laser beams whose wavelength regions are suitable for the crystallization of the silicon film include, for example, a $YVO_4$ laser (higher harmonics), a YLF laser (higher harmonics) and an Ar laser.

An aspect of performance of the present invention consists in a beam homogenizer for forming a laser beam which is rectilinearly distributed on a surface to-be-irradiated, characterized by comprising two reflectors for beam splitting.

Another aspect of performance of the present invention consists in a beam homogenizer for forming a laser beam which is rectilinearly distributed on a surface to-be-irradiated, characterized by comprising two reflectors for beam splitting, each of said reflectors including a plurality of reflective surfaces, any of said plurality of reflective surfaces being in agreement with a locus which is depicted by a part of a parabola when the part of the parabola is translated in a direction perpendicular to a plane containing said parabola.

Still another aspect of performance of the present invention consists in a beam homogenizer for forming a laser beam which is rectilinearly distributed on a surface to-be-irradiated, characterized by comprising:

two reflectors for beam splitting;

one of said reflectors including a plurality of reflective surfaces, any of said plurality of reflective surfaces being in agreement with a locus which is depicted by a part of a parabola when the part of the parabola is translated in a direction perpendicular to a plane containing said parabola;

the other of said reflectors including a plurality of plane mirrors.

In each of the beam homogenizers, the laser beam distributed rectilinearly should preferably have a length of at least 600 (mm), for the reason that a substrate of large area can be efficiently irradiated with this laser beam.

A further aspect of performance of the present invention consists in a laser irradiation apparatus for forming a laser beam which is rectilinearly distributed on a surface to-be-irradiated, characterized by comprising:

a laser oscillator; and two reflectors for beam splitting, each including a plurality of reflective surfaces;

any of said plurality of reflective surfaces being in agreement with a locus which is depicted by a part of a parabola when the part of the parabola is translated in a direction perpendicular to a plane containing said parabola.

A still further aspect of performance of the present invention consists in a laser irradiation apparatus for forming a laser beam which is rectilinearly distributed on a surface to-be-irradiated, characterized by comprising:

a laser oscillator;

a first reflector for beam splitting, including a plurality of reflective surfaces; and a second reflector for beam splitting, including a plurality of plane mirrors;

any of said plurality of reflective surfaces being in agreement with a locus which is depicted by a part of a parabola when the part of the parabola is translated in a direction perpendicular to a plane containing said parabola.

In each of the laser irradiation apparatuses, the laser beam distributed rectilinearly should preferably have a length of at least 600 (mm), for the reason that a substrate of large area can be efficiently irradiated with this laser beam.

Also, in each of the laser irradiation apparatuses, said laser oscillator should preferably be any of an excimer laser, a YAG laser and a glass laser, for the reasons that the energy of the laser beam is absorbed at a high absorption factor by a silicon film, and that high power is easily obtained.

Besides, in each of the laser irradiation apparatuses, said laser oscillator should preferably be any of a $YVO_4$ laser, a YLF laser and an Ar laser, for the reason that the energy of the laser beam is absorbed at a high absorption factor by a silicon film.

In another aspect of performance of the present invention, a semiconductor device wherein a semiconductor film, a gate insulating film and a gate electrode are formed over an insulating surface; is characterized by comprising the fact that the semiconductor film has been irradiated with a rectilinear laser beam formed by a beam homogenizer which has two reflectors for beam splitting.

A method of fabricating the semiconductor device having the semiconductor film, gate insulating film and gate electrode over the insulating surface will be detailed in an embodiment later.

Another aspect of performance of the present invention consists in a method of fabricating a semiconductor device provided with TFTs over a substrate, characterized by comprising the steps of:

forming a non-single crystalline semiconductor film over the substrate;

emitting a laser beam;

expanding the laser beam by two cylindrical parabolic mirrors or two parabolic mirrors;

altering a traveling direction of the expanded laser beam by a plurality of plane mirrors;

splitting the laser beam of the altered traveling direction by two beam-splitting reflectors each of which includes a plurality of cylindrical parabolic mirrors, and further combining the split laser beams into one rectilinear laser beam on a surface to-be-irradiated, so as to homogenize an energy distribution of the rectilinear laser beam on the surface to-be-irradiated;

setting the substrate formed with the non-single crystalline semiconductor film, on a stage, and bringing a surface of said non-single crystalline semiconductor film into agreement with said surface to-be-irradiated; and moving the stage relatively to said rectilinear laser beam so as to scan said non-single crystalline semiconductor film under irradiation with said rectilinear laser beam, thereby to laser-anneal said non-single crystalline semiconductor film.

Still another aspect of performance of the present invention consists in a method of fabricating a semiconductor device provided with TFTs over a substrate, characterized by comprising the steps of:

forming a non-single crystalline semiconductor film over the substrate;

emitting a laser beam;

expanding the laser beam by two cylindrical parabolic mirrors or two parabolic mirrors;

splitting the expanded laser beam by two beam-splitting reflectors each of which includes a plurality of cylindrical parabolic mirrors, and further combining the split laser beams into one rectilinear laser beam on a surface to-be-irradiated, so as to homogenize an energy distribution of the rectilinear laser beam on the surface to-be-irradiated;

setting the substrate formed with the non-single crystalline semiconductor film, on a stage, and bringing a surface of said non-single crystalline semiconductor film into agreement with said surface to-be-irradiated; and moving the stage relatively to said rectilinear laser beam so as to scan said non-single crystalline semiconductor film under irradiation with said rectilinear laser beam, thereby to laser-anneal said non-single crystalline semiconductor film.

Yet another aspect of performance of the present invention consists in a method of fabricating a semiconductor device provided with TFTs over a substrate, characterized by comprising the steps of:

forming a non-single crystalline semiconductor film over the substrate;

emitting a laser beam;

expanding the laser beam by two cylindrical parabolic mirrors or two parabolic mirrors;

altering a traveling direction of the expanded laser beam by a plurality of plane mirrors;

splitting the laser beam of the altered traveling direction by a first beam-splitting reflector which includes a plurality of cylindrical parabolic mirrors, as well as a second beam-splitting reflector which includes a plurality of plane mirrors, and further combining the split laser beams into one rectilinear laser beam on a surface to-be-irradiated, so as to homogenize an energy distribution of the rectilinear laser beam on the surface to-be-irradiated;

setting the substrate formed with the non-single crystalline semiconductor film, on a stage, and bringing a surface of said non-single crystalline semiconductor film into agreement with said surface to-be-irradiated; and moving the stage relatively to said rectilinear laser beam so as to scan said non-single crystalline semiconductor film under irradiation with said rectilinear laser beam, thereby to laser-anneal said non-single crystalline semiconductor film.

A further aspect of performance of the present invention consists in a method of fabricating a semiconductor device provided with TFTs over a substrate, characterized by comprising the steps of:

forming a non-single crystalline semiconductor film over the substrate;

emitting a laser beam;

expanding the laser beam by two cylindrical parabolic mirrors or two parabolic mirrors;

splitting the expanded laser beam by a first beam-splitting reflector which includes a plurality of cylindrical parabolic mirrors, as well as a second beam-splitting reflector which includes a plurality of plane mirrors, and further combining the split laser beams into one rectilinear laser beam on a surface to-be-irradiated, so as to homogenize an energy distribution of the rectilinear laser beam on the surface to-be-irradiated;

setting the substrate formed with the non-single crystalline semiconductor film, on a stage, and bringing a surface of said non-single crystalline semiconductor film into agreement with said surface to-be-irradiated; and moving the stage relatively to said rectilinear laser beam so as to scan said non-single crystalline semiconductor film under irradiation with said rectilinear laser beam, thereby to laser-anneal said non-single crystalline semiconductor film.

A still further aspect of performance of the present invention consists in a method of fabricating a semiconductor device provided with TFTs over a substrate, characterized by comprising the steps of:

forming a non-single crystalline semiconductor film over the substrate;

emitting a laser beam;

splitting the laser beam by two beam-splitting reflectors each of which includes a plurality of cylindrical parabolic mirrors, and further combining the split laser beams into one rectilinear laser beam on a surface to-be-irradiated, so as to homogenize an energy distribution of the rectilinear laser beam on the surface to-be-irradiated;

setting the substrate formed with the non-single crystalline semiconductor film, on a stage, and bringing a surface of said non-single crystalline semiconductor film into agreement with said surface to-be-irradiated; and moving the stage relatively to said rectilinear laser beam so as to scan said non-single crystalline semiconductor film under irradiation with said rectilinear laser beam, thereby to laser-anneal said non-single crystalline semiconductor film.

A yet further aspect of performance of the present invention consists in a method of fabricating a semiconductor device provided with TFTs over a substrate, characterized by comprising the steps of:

forming a non-single crystalline semiconductor film over the substrate;

emitting a laser beam;

splitting the laser beam by a first beam-splitting reflector which includes a plurality of cylindrical parabolic mirrors, as well as a second beam-splitting reflector which includes a plurality of plane mirrors, and further combining the split laser beams into one rectilinear laser beam on a surface to-be-irradiated, so as to homogenize an energy distribution of the rectilinear laser beam on the surface to-be-irradiated;

setting the substrate formed with the non-single crystalline semiconductor film, on a stage, and bringing a surface of said non-single crystalline semiconductor film into agreement with said surface to-be-irradiated; and moving the stage relatively to said rectilinear laser beam so as to scan said non-single crystalline semiconductor film under irradiation with said rectilinear laser beam, thereby to laser-anneal said non-single crystalline semiconductor film.

In each of the methods of fabricating a semiconductor device, an oscillator for emitting the laser beam should preferably be any of an excimer laser, a YAG laser and a glass laser, for the reasons that the energy of the laser beam is absorbed at a high absorption factor by a silicon film, and that high power is easily obtained.

Besides, in each of the methods of fabricating a semiconductor device, an oscillator for emitting the laser beam should preferably be any of a $YVO_4$ laser, a YLF laser and an Ar laser, for the reason that the energy of the laser beam is absorbed at a high absorption factor by a silicon film.

BRIEF DESCRIPTION OF THE DRAWINGS

FIGS. 1A and 1B illustrate views showing an example of a laser irradiation apparatus according to the present invention;

FIGS. 2A and 2B illustrate views showing a laser irradiation apparatus in the prior art;

FIGS. 4A and 4B illustrate views showing an example of a laser irradiation apparatus according to the present invention;

FIGS. 5A and 5B illustrate views showing an example of a laser irradiation apparatus according to the present invention;

FIGS. 6A and 6B illustrate views showing an example of a laser irradiation apparatus according to the present invention;

FIGS. 10A through 10D are sectional views showing the steps of fabricating a pixel TFT, and the TFTs of a driver circuit;

FIGS. 11A through 11C are sectional views showing the subsequent steps of fabricating the pixel TFT, and the TFTs of the driver circuit.

DETAILED DESCRIPTION OF THE PREFERRED EMBODIMENTS

[Embodiment Mode]

Figure 3:
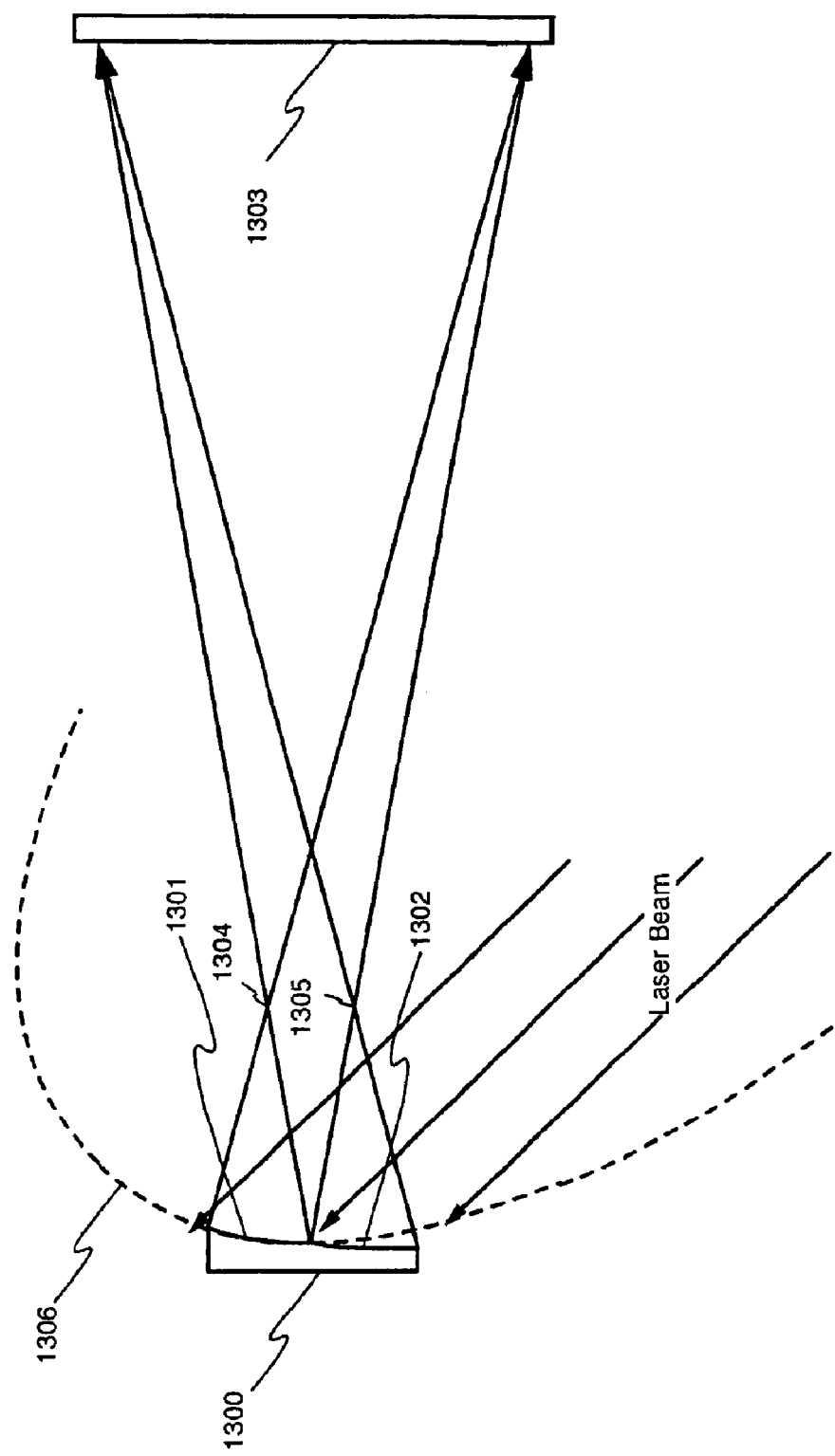
FIG. 3 is a view showing the shape of a reflector which is included in an optical system according to the present invention.

First, a glass substrate ("Corning 1737 Glass") of 127 (mm)×127 (mm)×0.7 (mm) is prepared. The substrate sufficiently endures temperatures up to 600 (° C.). On the glass substrate, a silicon oxide film is formed as a base film to a thickness of 200 (nm). Further, an amorphous silicon film is formed on the silicon oxide film to a thickness of 55 (nm). Both the films are formed by sputtering. Alternatively, they may well be formed by plasma CVD.

The substrate formed with the films is heated in a nitrogen atmosphere of 450 (° C.) for one (hour). The heating step serves to lower the hydrogen content of the amorphous silicon film. When hydrogen contained in the amorphous silicon film is of large amount, this film cannot endure laser energy, and hence, the heating step is carried out. The hydrogen content of the film should properly be in the order of $10^{20}/cm^3$. Here, the expression "$10^{20}/cm^3$" signifies that hydrogen atoms exist in the number of $10^{20}/cm^3$.

In this embodiment, an XeCl excimer laser "L3308" manufactured by Lambda Physik, Inc. is used as a laser oscillator 1101 (in FIGS. 1A and 1B). The excimer laser is a pulse laser. The maximum energy of the excimer laser is 500 (mJ) per pulse, the lasing wavelength thereof is 308 (nm), and the maximum frequency thereof is 300 (Hz). When the energy fluctuation of the individual pulses of the pulse laser is confined within ±10 (%), preferably within ±5 (%), during the laser processing of one substrate, homogeneous crystallization can be effected.

The fluctuation of laser energy levels stated here is defined as follows: The average value of the laser energy levels in the time period of the irradiation of one substrate is set as a criterion, and the difference between the minimum energy or maximum energy and the average value in the time period is indicated in terms of %.

The irradiation of the amorphous silicon film with laser beams is done on a stage 1109. An optical system is adjusted so as to focalize the laser beams on the surface of the film (surface to-be-irradiated 1108). The adjustments of the optical system for exactly focalizing the laser beams are made in accordance with a procedure stated below.

First, the foci of respective parabolic mirrors 1102 and 1103 are brought into agreement, whereupon a laser beam emergent from the laser oscillator 1101 is expanded. Further, the expanded laser beam is introduced centrally of a reflector 1106 by two plane mirrors 1104 and 1105. The inclination of the reflector 1106 is finely adjusted, thereby to determine the rough position of a rectilinear laser beam on the surface to-be-irradiated 1108. Thus, the energy distribution of the rectilinear laser beam in the lengthwise direction thereof is satisfactorily adjusted. However, the optical distance between the reflector 1106 and the surface to-be-irradiated 1108 is adjusted to a predetermined distance beforehand. This distance need not be strictly set.

Next, the energy distribution of the rectilinear laser beam in the widthwise direction thereof is adjusted. Initially, the inclination of a reflector 1107 is adjusted by the eye. On this occasion, the adjustments are roughly made so that the laser beams may define one line on the surface to-be-irradiated 1108. When the inclination deviates from an appropriate position extremely, the laser beams are not unified on the surface to-be-irradiated 1108. Subsequently, the amorphous silicon film is irradiated with the laser beams, and the projection traces of the laser beams are examined. If the laser beams are not focalized precisely, their projection traces will have a somewhat larger width. In this state, the plurality of laser beams split by the reflector 1107 are not completely placed on one another on the surface to-be-irradiated 1108, and no homogeneous beam is formed. On such an occasion, the inclination of the reflector 1107 is finely adjusted so that the plurality of laser beams may be placed on one another to the utmost. In a case where the laser beams are not unified successfully by the adjustment of only the inclination of the reflector 1107, the height of the stage 1109 is finely adjusted.

In order to heighten the homogeneity of the energy distribution of the rectilinear laser beam, the height of the stage 1109 and the inclination of the reflector 1107 may be precisely adjusted. In this manner, the optical system of the present invention has only the two parts to be finely adjusted, so that it can be adjusted very easily.

In contrast, the prior-art optical system as shown in FIGS. 2A and 2B have the five parts to be finely adjusted for determining the homogeneity of the energy distribution of the rectilinear laser beam, namely, the cylindrical lens arrays 1202a, 1202b, 1203, the cylindrical lenses 1204, 1205, the doublet cylindrical lens 1208, the mirror 1207 and a stage.

It is understood from the above that a time period required for the optical adjustments is remarkably shortened by the present invention. When the homogeneous rectilinear laser beam as desired has been obtained by the foregoing procedure, the whole surface of the semiconductor film fabricated as stated before is successively irradiated with the laser beam.

The irradiation with the laser beam is carried out, for example, while the stage 1109 shown in FIGS. 1A and 1B is being moved in the directions of arrows so as to scan the surface to-be-irradiated 1108. On this occasion, the energy density of the laser beam and the speed of the scanning on the surface to-be-irradiated 1108 may be properly determined by the operator of the optical system. As an approximate aim, the energy density lies within a range of 200 $(mJ/cm^2)$-1000 $(mJ/cm^2)$. When the scanning speed is appropriately chosen so that the widths of the successive rectilinear laser beams may overlap each other within a range of 90 (%) or more, homogeneous laser annealing is effected at a high possibility. The optimum scanning speed depends upon the pulse frequency of the laser oscillator 1101, and may be considered proportional to the frequency.

In this way, a laser annealing process is completed. A large number of substrates can be processed by repeating the process. A liquid crystal display of active matrix type, for example, can be fabricated by utilizing the substrate. The fabrication may be done in accordance with a known method by the operator.

Since the optical system of the present invention can easily create the rectilinear laser beam exceeding a length of 600 (mm), it is suited for incorporation into a line of mass production. The laser oscillator 1101 to be used is one of high power whose energy density is sufficient even when the laser beam is elongated. The necessary power should preferably be at least 1 (J) per pulse though it depends also upon the width of the rectilinear laser beam and the wavelength of the laser beam.

In the above example, the excimer laser is employed as the laser oscillator 1101. Alternatively, the higher harmonics of a YAG laser or those of a glass laser are preferably utilized for the reasons that a similar high power is attained, and that the energy of the laser beam is absorbed much by the silicon film. Other laser oscillators suitable for the crystallization of the silicon film are a $YVO_4$ laser, a YLF laser, an Ar laser, etc. The wavelength regions of these laser beams are absorbed much by the silicon film.

Although the amorphous silicon film is mentioned as the non-single crystalline semiconductor film in the above example, it is readily conjectured that the present invention will be applicable to other non-single crystalline semiconductor films. By way of example, the non-single crystalline semiconductor film may well be a compound semiconductor film having an amorphous structure, such as an amorphous silicon-germanium film. Alternatively, the non-single crystalline semiconductor film may well be a poly-crystalline silicon film as will have its processing method exemplified in the embodiments later.

[Embodiment 1]

In this embodiment, an example of an optical system different from the foregoing optical system shown in FIGS. 1A and 1B will be mentioned.

FIGS. 4A and 4B show the example of the optical system in this embodiment. Excepting a reflector 1401, the construction of the optical system shown in FIGS. 4A and 4B is quite the same as that of the optical system shown in FIGS. 1A and 1B (including the reflector 1106). Therefore, regarding those parts of the optical system shown in FIGS. 4A and 4B as which the corresponding parts of the optical system shown in FIGS. 1A and 1B can be utilized as they are, the same numerals as in FIGS. 1A and 1B shall be assigned also in FIGS. 4A and 4B.

Referring to FIGS. 4A and 4B, until a laser beam reaches the reflector 1401, it passes along quite the same optical path as in the optical system shown in FIGS. 1A and 1B. The reflector 1401 is made up of a plurality of cylindrical parabolic mirrors likewise to the reflector 1106. Whereas the reflector 1106 is an aggregate of concave mirrors, the reflector 1401 is an aggregate of convex mirrors. Both 1106 and 1401 differ in this point. Therefore, the laser beam entering the reflector 1401 as shown by arrows in FIGS. 4A and 4B is reflected, and the reflected laser beams travel while being spread in the directions of arrows indicated in the figure. Then, the laser beams are spread into a certain specified range on a surface to-be-irradiated 1108.

Figure 7:
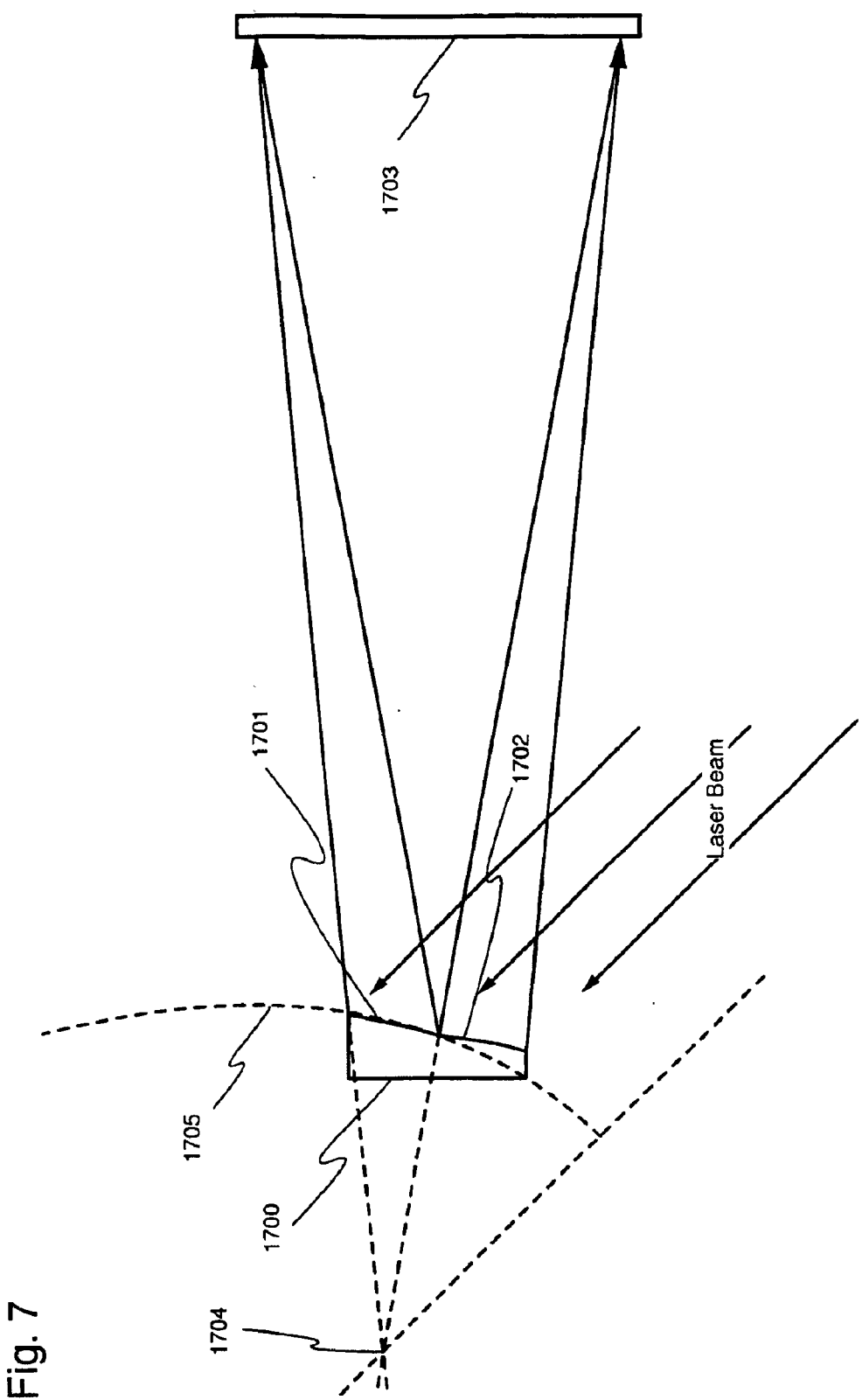
FIG. 7 is a view showing the shape of a reflector which is included in an optical system according to the present invention.

FIG. 7 shows the details of the shape of the reflector 1401. FIG. 7 is a view seen in the same direction as in FIGS. 4A and 4B. Although the reflector 1401 includes the four cylindrical parabolic mirrors in FIG. 4A, a reflector 1700 including two cylindrical parabolic mirrors (1701, 1702) will be illustrated for the sake of brevity in FIG. 7.

Referring to FIG. 7, the cylindrical parabolic mirror 1701 can be indicated as a part of a parabola 1705 which has a focus at a point 1704. When a straight line bisecting the parabola 1705 and the direction of entrance of a laser beam are made parallel to each other, the laser beam is reflected from the cylindrical parabolic mirror 1701 while being spread about the focus 1704. The reflected laser beam is spread into a certain specified range on a surface to-be-irradiated 1703.

Likewise, the laser beam reflected from the cylindrical parabolic mirror 1702 is spread into a certain specified range on the surface to-be-irradiated 1703. The reflective surfaces of the cylindrical parabolic mirrors 1701, 1702 are adjusted so that both the laser beams reflected therefrom may reach the same area of the surface to-be-irradiated 1703. Thus, the laser beam having entered the reflector 1700 is homogenized on the surface to-be-irradiated 1703.

The optical system described in this embodiment is utilized for laser-annealing a semiconductor film in accordance with, for example, the method explained with reference to FIGS. 1A and 1B. A liquid crystal display of active matrix type, for example, can be fabricated by utilizing the laser-annealed semiconductor film. The fabrication may be done in accordance with a known method by the operator of the optical system.

[Embodiment 2]

In this embodiment, an example of another optical system different from Embodiment 1 will be mentioned.

FIGS. 5A and 5B show the example of the optical system in this embodiment. Excepting a reflector 1501, the construction of the optical system shown in FIGS. 5A and 5B is quite the same as that of the optical system shown in FIGS. 1A and 1B (including the reflector 1106). Therefore, regarding those parts of the optical system shown in FIGS. 5A and 5B as which the corresponding parts of the optical system shown in FIGS. 1A and 1B can be utilized as they are, the same numerals as in FIGS. 1A and 1B shall be assigned also in FIGS. 5A and 5B.

Referring to FIGS. 5A and 5B, until a laser beam reaches the reflector 1501, it passes along quite the same optical path as in the optical system shown in FIGS. 1A and 1B. The reflector 1501 is made up of a plurality of cylindrical parabolic mirrors likewise to the reflector 1106. Whereas the reflector 1106 is an aggregate of concave mirrors, the reflector 1501 is an aggregate of convex mirrors and concave mirrors. In the example of FIGS. 5A and 5B, the convex mirrors and the concave mirrors are alternately arranged. Both 1106 and 1501 differ in this point. The laser beam entering the reflector 1501 as shown by arrows in FIGS. 5A and 5B is reflected, and the reflected laser beams travel in the directions of arrows indicated in the figure. Then, the laser beams are spread into a certain specified range on a surface to-be-irradiated 1108.

Even when the concave mirrors and the convex mirrors coexist, the reflector 1501 can be endowed with the same function as that of the reflector 1106 or 1401. The reflector 1501 can be formed by the coexistence of the shapes of the reflective surfaces detailed in conjunction with FIGS. 3 and 7. Although the convex mirrors and the concave mirrors are alternately arranged in the reflector 1501, mirrors may well be arranged in the sequence of, for example, the convex, convex, concave and concave mirrors, or the concave, convex, convex and concave mirrors.

The optical system described in this embodiment is utilized for laser-annealing a semiconductor film in accordance with, for example, the method explained with reference to FIGS. 1A and 1B. A liquid crystal display of active matrix type, for example, can be fabricated by utilizing the laser-annealed semiconductor film. The fabrication may be done in accordance with a known method by the operator of the optical system.

[Embodiment 3]

In this embodiment, an example of another optical system different from Embodiments 1 and 2 will be mentioned.

FIGS. 6A and 6B show the example of the optical system in this embodiment. Excepting a reflector 1601, the construction of the optical system shown in FIGS. 6A and 6B is quite the same as that of the optical system shown in FIGS. 1A and 1B (including the reflector 1107). Therefore, regarding those parts of the optical system shown in FIGS. 6A and 6B as which the corresponding parts of the optical system shown in FIGS. 1A and 1B can be utilized as they are, the same numerals as in FIGS. 1A and 1B shall be assigned also in FIGS. 6A and 6B.

Referring to FIGS. 6A and 6B, until laser beams reach the reflector 1601, they pass along quite the same optical paths as in the optical system shown in FIGS. 1A and 1B. Unlike the reflector 1106, the reflector 1601 is made up of a plurality of plane mirrors. Reflected lights from the individual plane mirrors are combined into one beam on a surface to-be-irradiated 1108. Thus, the reflector 1601 can be endowed with the same function as that of the reflector 1107. Since the reflector 1601 homogenizes the energy distribution of a rectilinear laser beam in the widthwise direction thereof, it need not expand the laser beams. Accordingly, the reflector 1601 may be made up of the plane mirrors.

Figure 8:
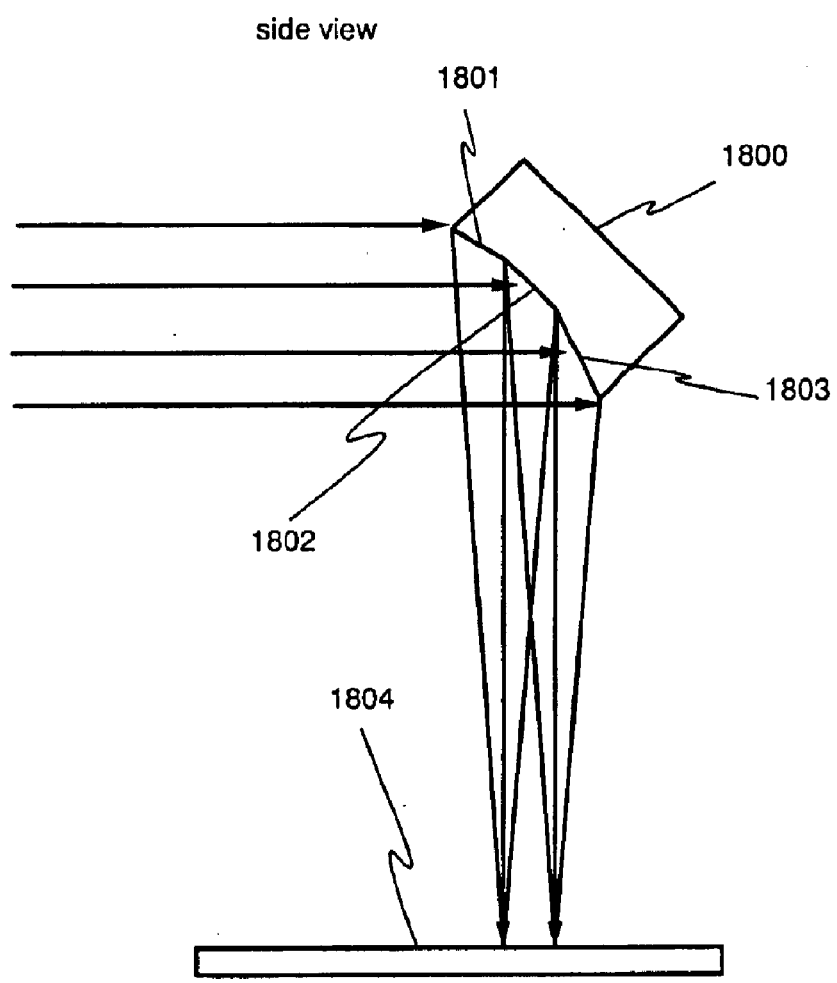
FIG. 8 is a view showing the shape of a reflector which is included in an optical system according to the present invention.

An enlarged view of the reflector 1601 is shown as a reflector 1800 in FIG. 8. Laser beams are reflected by a plurality of plane mirrors 1801, 1802 and 1803 constituting the reflector 1800, and the reflected laser beams are condensed on the same area of a certain plane 1804. Thus, the energy distributions of the laser beams can be homogenized on the certain plane 1804 by the reflector 1800.

The reflector 1601 explained in this embodiment can be performed in optional combination with any of the optical systems described with reference to FIGS. 1A and 1B and in Embodiments 1 and 2.

[Embodiment 4]

In this embodiment, there will be mentioned an example in which a poly-crystalline silicon film is irradiated with a laser beam. First, the poly-crystalline silicon film is fabricated by a method as explained below.

A substrate of "Corning Glass 1737" is employed as a glass substrate. A silicon oxide film being 200 (nm) thick, and an amorphous silicon film being 50 (nm) thick are successively formed on one surface of the glass substrate. Processes for forming the films may be plasma CVD, sputtering, etc. Thereafter, the amorphous silicon film is crystallized by thermal annealing. The thermal annealing is carried out by, for example, exposing the amorphous silicon film to a nitrogen atmosphere of 600 (° C.) for 24 (hours).

Alternatively, the amorphous silicon film may well be crystallized by RTA or the like method. Besides, the amorphous silicon film may well be crystallized by a method described in the official gazette of Japanese Patent Laid-Open No. 7-130652. An example in the latter case will be explained below.

Initially, an amorphous semiconductor film having a thickness of 25–100 (nm) is formed on the base film (for example, a silicon oxide film being 200 (nm) thick) of a glass substrate. Applicable as the amorphous semiconductor film is any of an amorphous silicon film, an amorphous silicon-germanium (a-SiGe) film, an amorphous silicon carbide (a-SiC) film, an amorphous silicon-tin (a-SiSn) film, etc. Such an amorphous semiconductor film may be formed so as to contain hydrogen about 0.1–40 (%) based on the total number of atoms contained in this amorphous semiconductor film. By way of example, the amorphous silicon film is formed having a thickness of 55 (nm). Subsequently, a layer containing a catalyst element is formed by spin coating in which the resulting substrate is coated with a solution containing the catalyst element at a concentration of 10 (ppm) in terms of weight, while being rotated by a spinner. Usable as the catalyst element is any of nickel (Ni), germanium (Ge), iron (Fe), palladium (Pd), tin (Sn), lead (Pb), cobalt (Co), platinum (Pt), copper (Cu), gold (Au), etc. The layer containing the catalyst element may be formed to a thickness of 1–5 (nm) by the spin coating, or alternatively by printing, spraying, a bar coater method, sputtering or vacuum evaporation.

In a process for crystallization, a heat treatment is carried out at 400–500 (° C.) in a nitrogen atmosphere for about one (hour), thereby to decrease the hydrogen content of the amorphous silicon film to or below 5 (%) based on the total number of atoms contained in this amorphous silicon film. The heat treatment is not always necessary in a case where the amorphous silicon film as formed has already had the hydrogen content of or below 5 (%). Subsequently, thermal annealing is performed at 550–600 (° C.) in a nitrogen atmosphere for 1–8 (hours) by employing an annealing furnace. A poly-crystalline semiconductor film formed of a poly-crystalline silicon film can be obtained by the above steps. However, when the poly-crystalline semiconductor film fabricated by the thermal annealing is observed with an optical microscope, amorphous regions remaining locally are sometimes noted. In such a case, an amorphous component having a broad peak at 480 (cm$^{-1}$) is similarly observed by Raman spectroscopy. It is therefore applicable as effective means that, after the thermal annealing, the poly-crystalline semiconductor film is processed by the laser annealing according to this embodiment, thereby to enhance the crystallinity of this film.

Next, a method in which a layer containing a catalyst element is formed by sputtering will be explained as another example of crystallization employing the catalyst element. Likewise to the foregoing, an amorphous semiconductor film having a thickness of 25–100 (nm) is formed on the base film of a glass substrate. Subsequently, an oxide film being about 0.5–5 (nm) thick is formed on the surface of the amorphous semiconductor film. Although the oxide film of such a thickness may well be positively formed by plasma CVD, sputtering or the like, it may be formed by heating the resulting substrate to 100–300 (° C.) and then exposing the surface of the amorphous semiconductor film to an oxygen atmosphere which is turned into plasma, or by exposing the surface of the amorphous semiconductor film to a solution which contains hydrogen peroxide ($H_2O_2$). Alternatively, the oxide film can be formed in such a way that ozone is produced by projecting ultraviolet light into an oxygen containing atmosphere, and that the amorphous semiconductor film is exposed to the ozone atmosphere.

The layer containing the catalyst element is formed on the amorphous semiconductor film thus formed with the thin oxide film on its surface by the sputtering. Although the thickness of the layer is not restricted, it may be about 10–100 (nm). By way of example, it is an effective method to form a nickel (Ni) film by employing Ni as a target. With the sputtering, some of high energy particles made of the catalyst element and accelerated by an electric field come flying to the side of the substrate, and they are implanted into the vicinity of the surface of the amorphous semiconductor film or into the oxide film formed on the surface of this semiconductor film. Although the proportion of the high energy particles which come flying to the substrate side differs depending upon conditions for creating plasma and the biased state of the substrate, the dose of the catalyst element which is implanted into the vicinity of the surface of the amorphous semiconductor film or into the oxide film should preferably be set on the order of $1 \times 10^{11} - 1 \times 10^{14}$ (/cm$^2$).

Thereafter, the layer containing the catalyst element is selectively removed. In the exemplified case where the layer is formed of the Ni film, it can be removed with a solution of nitric acid or the like. Alternatively, when the substrate is processed with an aqueous solution containing hydrofluoric acid, the Ni film and the oxide film formed on the amorphous semiconductor film can be simultaneously removed. Anyway, the dose of the catalyst element in the vicinity of the surface of the amorphous semiconductor film is set on the order of $1 \times 10^{11} - 1 \times 10^{14}$ (/cm$^2$) beforehand. Further, a crystallizing process based on thermal annealing is performed as in the foregoing, whereby a poly-crystalline semiconductor film can be obtained. The poly-crystalline semiconductor film is subjected to laser annealing by an apparatus and a method according to the present invention.

The laser irradiation apparatus to be employed is any of the apparatuses described with reference to FIGS. 1A and 1B and used in Embodiments 1–3. Besides, the laser irradiation method may be the same as described with reference to FIGS. 1A and 1B. Since, however, the subject for irradiation in this embodiment is somewhat different from the foregoing one shown in FIGS. 1A and 1B, such conditions as the energy density and scanning speed of the laser beam on the surface to-be-irradiated must be properly determined by the operator of the apparatus.

An active matrix substrate can be completed on the basis of the poly-crystalline semiconductor film prepared by the above fabricating method. However, in the case where the catalyst element promoting the crystallization of silicon is used in the crystallizing process, the catalyst element in slight amounts (on the order of $1\times10^{17}$–$1\times10^{19}$/cm$^3$) remain in insular semiconductor layers. Of course, TFTs can be finished up even in such a state, but the remaining catalyst element should more preferably be removed from, at least, the channel forming regions of the TFTs. An expedient for removing the catalyst element is one which utilizes a gettering action based on phosphorus (P).

A gettering treatment based on phosphorus (P) for this purpose can be simultaneously performed by the step of activating semiconductor layers. The density of phosphorus (P) necessary for gettering may be substantially equal to the impurity densities of heavily-doped n-type impurity regions, and the catalyst element can be segregated from the channel forming regions of the n-channel TFT and p-channel TFT into the impurity regions containing phosphorus (P), by the thermal annealing of the activating step. As a result, the catalyst element on the order of $1\times10^{17}$–$1\times10^{19}$/cm$^3$ is segregated in the impurity regions. Since the TFTs thus fabricated have a decreased OFF-current value and a good crystallinity, they attain a high field-effect mobility and can achieve favorable characteristics.

[Embodiment 5]

Figure 9:
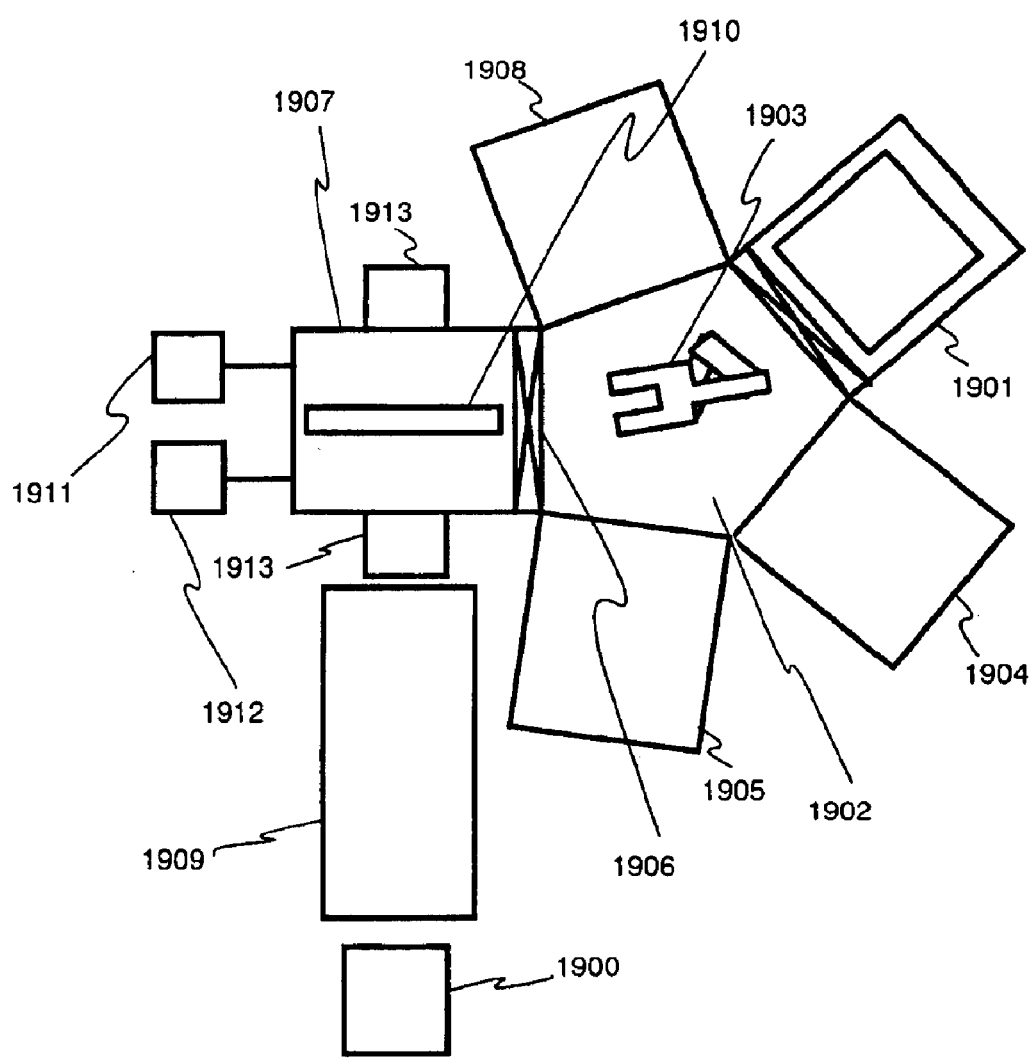
FIG. 9 is a view showing an example of a laser irradiation apparatus for mass production.

In the present embodiment, an example of the laser irradiation apparatus for mass production will be described with reference to FIG. 9. FIG. 9 is a top view of the laser irradiation apparatus. An example of the laser irradiation apparatus can be applied to a basic size having 600×720 mm, or more.

A substrate on which a non-single crystalline silicon film is formed is carried from a load/unload chamber 1901 by the use of a carrying robot arm 1903 mounted in a transfer chamber 1902. The non-single crystalline silicon film may be formed in accordance with the above-mentioned example. First, the substrate is aligned in an alignment chamber 1904 and then is carried to a pre-heat chamber 1905. In the pre-heat chamber 1905, the substrate is previously heated to a desired temperature of about 300° C., for example, by the use of an infrared lamp heater. The heating of the substrate is performed for the purpose of supplying energy of the laser beam in the case that the energy density of the laser beam is not sufficient to perform laser annealing on the non-single crystalline semiconductor film. Thereafter, the substrate is placed in a laser irradiation chamber 1907 via a gate valve 1906 and then the gate valve 1906 is closed.

A laser beam is emitted by the laser oscillator 1900 described in the embodiment mode and then is bent downward 90 degrees by a reflection mirror 1107(a reflection mirror 1601 may be used) placed directly above a quartz window 1910 via an optical system 1909 disclosed in the present invention, and is transformed into a rectilinear laser beam at a surface to-be-irradiated in the laser irradiation chamber 1907 via the quartz window 1910. The laser beam is applied to the substrate placed at the irradiate surface. It is recommended that the above-mentioned optical system be used as the optical system 1909, or the one similar to the optical system may be used. It is preferable to use an excimer grade quartz window because high transmissivity and high durability against the laser beam can be obtained.

The laser irradiation chamber 1907 is evacuated by a vacuum pump 1911 to make the atmosphere of the laser irradiation chamber 1907 a high vacuum of about $10^{-3}$ Pa before the irradiation of the laser beam, or the atmosphere of the laser irradiation chamber 1907 is made a desired atmosphere by the vacuum pump 1911 and a gas bomb 1912. As described above, the above atmosphere may be He, Ar, H$_2$, or the mixed gas of them. Or, the atmosphere of the laser irradiation chamber 1907 may not be controlled.

Then, the substrate is scanned by a moving mechanism 1913 under irradiation with the laser beam. At this time, an infrared lamp (not shown) may be applied to the spot irradiated with the rectilinear laser beam. This can overcome the energy shortage of the laser beam.

After the laser beam irradiation is finished, the substrate is carried to a cooling chamber 1908 to be allowed to cool slowly and then is returned to the load/unload chamber 1901 via the alignment chamber 1904. In this manner, many substrates can be annealed with laser by repeating these actions.

The embodiment 5 can be used in combination with the embodiment mode and another embodiments of the present invention.

[Embodiment 6]

Embodiment 6 of the present invention will be explained using FIGS. 10 to 12. A method of manufacturing a pixel TFT and a storage capacitor of a pixel portion, and a driver circuit TFT formed in the periphery of the pixel portion, at the same time is explained in detail here in accordance with process steps.

In FIG. 10A, a glass substrate made of, e.g., barium borosilicate glass, aluminum borosilicate glass, typically Corning Corp. #7059 or #1737 glass, or a quartz substrate is used as a substrate 101. In the case where a glass substrate is employed, heat treatment may be performed in advance at a temperature lower than the glass strain temperature by about 10 to 20° C. A base film 102 is then formed from an insulating film such as a silicon oxide film, a silicon nitride film, or a silicon oxynitride film on the surface of the substrate 101 on which the TFTs are formed, in order to prevent diffusion of the impurity. For example, a lamination layer is formed from a silicon oxynitride film 102a from SiH$_4$, NH$_3$ and N$_2$O to a thickness of 10 to 200 nm (preferably between 50 and 100 nm) by plasma CVD, and a hydrogenated silicon oxynitride film 102b from SiH$_4$ and N$_2$O to a thickness of 50 to 200 nm (preferably between 100 and 150 nm) by plasma CVD. A two layer structure is shown for the base film 102 here, but a single layer film of the above insulating films, or a lamination film having more than two layers may also be formed.

The silicon oxynitride film is formed using a parallel plate type plasma CVD method. For forming the silicon oxynitride film 102a, SiH$_4$ of 10 SCCM, NH$_3$ of 100 SCCM and N$_2$O of 20 SCCM are introduced to a reaction chamber, the substrate temperature is set to 325° C., the reaction pressure is 40 Pa, the discharge power density is set to 0.41 W/cm$^2$, and the discharge frequency is 60 MHz. On the other hand, for the hydrogenated silicon oxynitride film 102b, SiH$_4$, N$_2$O, and H$_2$ are introduced to the reaction chamber at 5 SCCM, 120 SCCM, and 125 SCCM, respectively, the substrate temperature is set to 400° C., the reaction pressure is 20 Pa, the discharge power density is set to 0.41 W/cm$^2$, and the discharge frequency is 60 MHz. These films can be formed in succession by changing the substrate temperature and switching the reaction gasses.

The silicon oxynitride film 102a thus formed has a density of $9.28\times10^{22}$/cm$^3$, has a slow etching rate of approximately 63 nm/min when etched by a mixed solution containing 7.13% ammonium bifluoride (NH$_4$HF$_2$) and 15.4% ammonium fluoride (NH$_4$F) (Stella Chemifa Corp., product name LAL500) at 20° C. If this type of film is used in the base film, then the base film is effective in preventing diffusion of alkaline metal elements from the glass substrate into the semiconductor layer formed on the base film.

Next, a semiconductor layer 103a having an amorphous structure is formed by a method such as plasma CVD or sputtering to a thickness of 25 to 100 nm (preferably between 30 and 70 nm). Semiconductor films having an amorphous structure include amorphous semiconductor layers and micro-crystalline semiconductor films, and a chemical compound semiconductor film having an amorphous structure such as an amorphous silicon germanium film may also be applied. In the case where an amorphous silicon film is formed by plasma CVD, it is possible to form both the base film 102 and the amorphous semiconductor layer 103a in succession. For example, as stated above, after forming the silicon oxynitride film 102a and the hydrogenated silicon oxynitride film 102b successively by plasma CVD, the amorphous semiconductor layer 103a can be formed in succession without exposure to the atmosphere by switching the reaction gasses from $SiH_4$, $N_2O$, and $H_2$ to $SiH_4$ and $H_2$ or only $SiH_4$. As a result, it becomes possible to prevent contamination of the surface of the hydrogenated silicon oxynitride film 102b, and a dispersion in the characteristics of the manufactured TFTs and fluctuations in their threshold voltage can be lowered.

A crystallization process is then performed, and a crystalline semiconductor layer 103b is manufactured from the amorphous semiconductor layer 103a. The crystallization method disclosed in the present invention can be applied as the method. In the case where the above mentioned glass substrate or a plastic substrate having inferior heat resistance is used, it is preferable to apply the laser annealing method disclosed in the present invention. In this laser annealing process, first it is preferable to release hydrogen contained in the amorphous semiconductor layer which becomes an object for the laser irradiation, and if the crystallization is performed after the amount of hydrogen contained is made equal to or less than 5 atom % by performing heat treatment at 400 to 500° C. for approximately 1 hour, then roughness of the film surface can be prevented.

Further, $SiH_4$ and argon (Ar) are used in a reaction gas in a process of forming an amorphous silicon film by plasma CVD, and if the substrate temperature is set from 400 to 450° C. at the time of film deposition, then the concentration of hydrogen contained within the amorphous silicon film can also be made equal to or less than 5 atom %. The heat treatment for releasing hydrogen becomes unnecessary in this case.

The laser irradiation apparatus disclosed in the present invention is used, thereby the crystalline semiconductor layer 103b as shown in FIG. 10B can be obtained.

Then, resist pattern is formed using a photolithography technique employing a first photomask PM1 on the crystalline semiconductor layer 103b. The crystalline semiconductor layer is then partitioned into island-like shapes by dry etching, forming the island-like semiconductor layers 104 to 108, as shown in FIG. 10C. A gas mixture of $CF_4$ and $O_2$ is used in the dry etching of the crystalline silicon film.

An impurity element which imparts p-type conductivity may then be added at a concentration of about $1 \times 10^{16}$ to $5 \times 10^{17}$ atoms/cm$^3$ to the entire surface of the island-like semiconductor layers, with an aim of controlling the threshold voltage (Vth) of the TFTs. Elements existing in periodic table group 13, such as boron (B), aluminum (Al), and gallium (Ga) are known as impurity elements which will impart p-type conductivity with respect to semiconductors. Ion injection and ion doping (or ion shower doping) can be used as the method of adding the impurity element, though ion doping is suitable for processing a large area substrate. Boron (B) is added by ion doping using diborane ($B_2H_6$) as a source gas. This type of impurity element injection is not always necessary and may be omitted without any hindrance. In particular, it is a method appropriately used in order to keep the threshold voltage of an n-channel TFT within a predetermined range.

A gate insulating film 109a is formed with a thickness of 40 to 150 nm from an insulating film containing silicon by plasma CVD or sputtering. In Embodiment 6, a 120 nm thick silicon oxynitride film is used to form the gate insulating film. Further, since a silicon oxynitride film formed by adding $O_2$ to $SiH_4$ and $N_2O$ has a reduced fixed charge density within the film, it is a preferable material for this type of use. Furthermore, a silicon oxynitride film made from $SiH_4$, $N_2O$ and $H_2$ has a lowered defect density in the interface with the gate insulating film, which is preferable. Of course, the gate insulating film is not limited to such a silicon oxynitride film, and other insulating films containing silicon may also be used, in a single layer or a multiple layer structure. For example, when using a silicon oxide film, it can be formed by plasma CVD with a mixture of TEOS (tetraethoxysilane) and $O_2$, at a reaction pressure of 40 Pa, with the substrate temperature set from 300 to 400° C., and by discharging at a high frequency (13.56 MHz) electric power density of 0.5 to 0.8 W/cm$^2$. Good characteristics as a gate insulating film can be obtained by subsequently performing thermal annealing of the silicon oxide film thus manufactured at 400 to 500° C.

A heat resistant conductive layer 111 for forming a gate electrode is then formed to a thickness of 200 to 400 nm (preferably between 250 and 350 nm) on the first shape gate insulating film 109a, as shown in FIG. 10D. The heat resistant conductive layer may be formed by a single layer and may also be a lamination structure composed of a plurality of layers such as a two layers or three layers structure, if necessary. In this specification, the heat resistant conductive layer contains an element chosen from the group consisting of Ta, Ti, and W or an alloy of the above elements, or an alloy film of a combination of said elements. These heat resistant conductive layers are formed by sputtering or CVD, and it is preferable to reduce the impurity concentration contained in order to make the resistance low. In particular, it is preferable to make the concentration of oxygen equal to or less than 30 ppm. A 300 nm thick W film is formed in Embodiment 6. The W film may be formed by sputtering with W as a target, and can also be formed by thermal CVD using tungsten hexafluoride ($WF_6$). Whichever is used, it is necessary to be able to make the film become low resistance in order to use as the gate electrode, and it is preferable that the resistivity of the W film be made equal to or less than 20 $\mu\Omega$cm. The resistivity can be lowered by enlarging the crystals of the W film, but for cases in which there are a many impurity elements such as oxygen within the W film, crystallization is inhibited, and the film becomes high resistance. Thus a W target having a purity of 99.9999% is used in sputtering, and by additionally forming the W film taking sufficient care so as not to introduce any impurities from within the gas phase at the time of film deposition, a resistivity of 9 to 20 $\mu\Omega$cm can be achieved.

When using a Ta film in the heat resistant conductive layer 111, it is possible to form the Ta film similarly by sputtering. Ar is used in the sputtering gas for the Ta film. Further, if an appropriate amount of Xe and Kr are added to the gas at the time of sputtering, then the internal stress of the film formed is relaxed, and film peeling can be prevented. The resistivity of an α phase Ta film is about 20 $\mu\Omega$cm, and it can be used in the gate electrode, but the resistivity of a β phase Ta film is about 180 $\mu\Omega$cm and it is unsuitable for the gate electrode. A TaN film possesses a crystal structure which is close to that of the α phase Ta film, and therefore an α phase Ta film can easily be obtained provided that a TaN film is formed under the Ta film. Further, although not shown in the figures, it is effective to form a silicon film doped by phosphorous (P) to a thickness of about 2 to 20 nm under the heat resistant conductive layer 111. By doing that, improving the adhesion and preventing oxidation of the conductive film formed on top, at the same time alkaline metal elements contained in the heat resistant conductive layer 111 in microscopic amounts can be stopped from diffusing into the first shape gate insulating film 109$a$ by doing so. Whichever is used, it is preferable that the resistivity of the heat resistant conductive layer 111 be in a range from 10 to 50 $\mu\Omega$cm.

Next, masks 112 to 117 are resists formed by a photolithography technique using a second photomask PM2. A first etching process is then performed. The etching is performed in Embodiment 6 using an ICP etching apparatus, using $Cl_2$ and $CF_4$ as etching gasses, inputting an RF (13.56 MHz) power of 3.2 W/cm$^2$ at 1 Pa of pressure to form a plasma. A 224 mW/cm$^2$ RF (13.56 MHz) power is also introduced to the substrate side (sample stage), and therefore a negative self bias voltage is effectively applied. The etching speed of the W film is approximately 100 nm/min under these conditions. The etching time in order to exactly etch the W film is estimated based on this etching speed, further an etching time for the first etching process is set at 20% more greater than the estimated etching time.

Conductive layers having a first tapered shape 118 to 123 are formed by the first etching process. The angle of the tapered portions is formed from 15 to 30 degrees. In order to perform etching without leaving any residual, over etching is performed in which the etching time is increased by a ratio of about 10 to 20%. The selectivity of a silicon oxynitride film (the first shape gate insulating film 109$a$) with respect to the W film is between 2 and 4 (typically 3), and therefore the exposed surface of the silicon oxynitride film is etched on the order of 20 to 50 nm by the over etching process, and a second shape gate insulating film 109$b$, in which a tapered shape is formed in near the edge portion of the conductive layer having the first tapered shape, is formed.

A first doping process is then performed so that impurity elements with one conductivity type are added into the island-like semiconductor layers. A process of adding an impurity element which imparts n-type conductivity is performed here. The masks 112 to 117 for forming the first shape conductive layers are left as it is, and with the first tapered shape conductive layers 118 to 123 are used as a mask, the impurity element which imparts n-type conductivity is added by ion doping in a self-aligning manner. The ion doping is performed using a dose amount of $1\times10^{13}$ to $5\times10^{14}$ atoms/cm$^2$ and with the acceleration voltage set between 80 and 160 keV in order for the n-type conductivity imparting impurity element to be added so as to pass through the tapered portion in the edge portion of the gate electrode and through the gate insulating film, and so as to reach the semiconductor layers placed below. An element residing in periodic table group 15 is used as the impurity element which imparts n-type conductivity, typically phosphorous (P) or arsenic (As), and phosphorous (P) is used here. The impurity element which imparts n-type conductivity is added to first impurity regions 124, 126, 128, 130, and 132 here by the ion doping process at a concentration in the range of $1\times10^{20}$ to $1\times10^{21}$ atoms/cm$^3$. Although there is not necessarily a uniform concentration within second impurity regions (A) formed below the tapered portion, the n-type conductivity imparting impurity element is added within a range of $1\times10^{17}$ to $1\times10^{20}$ atoms/cm$^3$.

The change in concentration of the n-type conductivity imparting impurity element contained in a portion of second impurity regions (A) 125, 127, 129, 131, and 133 overlapping at least the first shape conductive layers 118 to 123 reflects the change in thickness of the tapered portion. In other words, the concentration of phosphorous (P) added to the second impurity regions (A) 125, 127, 129, 131, and 133 gradually becomes low from the edge portion of the conductive layers toward the inside in the region overlapping with the first shape conductive layers. The concentration of phosphorous (P) reaching the semiconductor layers changes due to the difference in a film thickness of the tapered portion.

Then, a second etching process is performed as shown in FIG. 11B. The etching process is also similarly performed by an ICP etching apparatus with a mixed gas of $CF_4$ and $Cl_2$ used in the etching gas, the etching is performed with an RF power of 3.2 W/cm$^2$ (13.56 MHz), a bias power of 45 mW/cm$^2$ (13.56 MHz), and at a pressure of 1.0 Pa. Conductive layers 140 to 145 having a second shape formed under this conditions are formed. A tapered portion is formed in each edge portions, and this becomes a tapered shape in which the thickness gradually increases from the edge portion toward the inside. Compared with the first etching process, the ratio of anisotropic etching becomes greater in the substrate side by the amount that the applied bias power is reduced, and the angle of the tapered portion becomes from 30 to 60°. Further, the surface of the second shape gate insulating film 109$b$ is etched on the order of 40 nm, newly forming a third shape gate insulating film 109$c$.

An impurity element which imparts n-type conductivity is then doped at conditions of a dose amount lower than that of the first doping process, and at a high acceleration voltage. For example, the acceleration voltage is set between 70 and 120 keV, and doping is performed with a dose amount of $1\times10^{13}$ atoms/cm$^2$, so as to make the impurity concentration in a region overlapping with the second shape semiconductor layers 140 to 145 be from $1\times10^{16}$ and $1\times10^{18}$ atoms/cm$^3$. Second impurity regions (B) 146 to 150 are thus formed.

Impurity regions 156 and 157 with an opposite conductivity type are then formed in the island-like semiconductor layers 104 and 106 which form p-channel TFTs. The second shape conductive layers 140 and 142 are used as a mask in this case as well, and an impurity element which imparts p-type conductivity is added. The impurity regions are formed in a self-aligning manner. The island-like semiconductor layers 105, 107, and 108, which form n-channel TFTs, are covered over their entire surfaces by resist masks 151 to 153, formed using a third photomask PM3. Impurity regions 156 and 157 formed here are formed by ion doping using diborane ($B_2H_6$). The concentration of the p-type conductivity imparting impurity element in the impurity regions 156 and 157 is set so as to become $2\times10^{20}$ to $2\times10^{21}$ atoms/cm$^3$.

The impurity regions 156 and 157 can be seen as being divided into three regions containing n-type conductivity imparting impurity elements. Third impurity regions 156$a$ and 157$a$ contain the impurity element which imparts n-type conductivity at a concentration of $1\times10^{20}$ to $1\times10^{21}$ atoms/cm$^3$, fourth impurity regions (A) 156$c$ and 157$c$ contain the impurity element which imparts n-type conductivity at a concentration of $1\times10^{17}$ and $1\times10^{20}$ atoms/cm$^3$, and fourth impurity regions (B) 156$c$ and 157$c$ contain a concentration of the n-type conductivity imparting impurity element from $1\times10^{16}$ and $5\times10^{18}$ atoms/cm$^3$. However, the concentration of impurity element which imparts p-type conductivity is set so as to be equal to or greater than $1\times10^{19}$ atoms/cm$^3$ in the impurity regions 156b, 156c, 157b, and 157c, and in the third impurity regions 156a and 157a, the concentration of the p-type conductivity imparting impurity element is made to be from 1.5 to 3 times as high, and therefore no problems will develop when the third impurity regions function as a source region and a drain region of a p-channel TFT. Further, a portion of the fourth impurity regions (B) 156c and 157c is formed so as to overlap with a portion of the second tapered shape conductive layer 140 or 142.

Figure 12A:
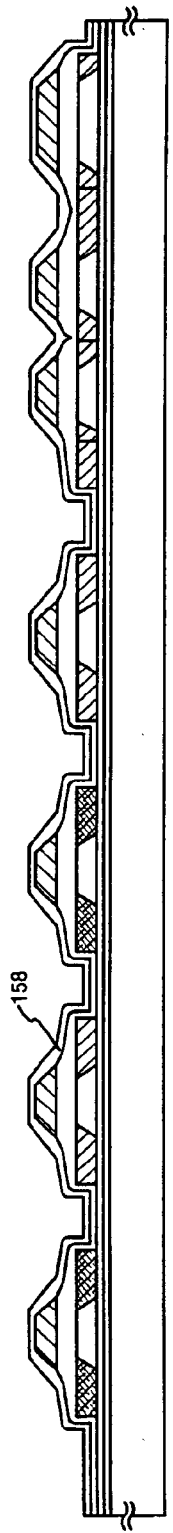
FIGS. 12A and 12B are sectional views showing the still subsequent steps of fabricating the pixel TFT, and the TFTs of the driver circuit.

Next, as shown in FIG. 12A, a first interlayer insulating film 158 is formed on the gate electrode and the gate insulating film. The first interlayer insulating film may be formed by a silicon oxide film, a silicon oxynitride film, a silicon nitride film, or a lamination film of a combination of these films. Whichever is used, the first interlayer insulating film 158 is formed from an inorganic insulating material. The film thickness of the first interlayer insulating film 158 is set from 100 to 200 nm. When using a silicon oxide film here, it can be formed by plasma CVD with a mixture of TEOS and $O_2$, at a reaction pressure of 40 Pa, with the substrate temperature set from 300 to 400° C., and by discharging at a high frequency (13.56 MHz) electric power density of 0.5 to 0.8 W/cm$^2$. Further, when using a silicon oxynitride film, the silicon oxynitride film may be manufactured by plasma CVD from $SiH_4$, $N_2O$, and $NH_3$, and the silicon oxynitride film may be manufactured from $SiH_4$ and $N_2O$. The manufacturing conditions in this case are a reaction pressure of 20 to 200 Pa, a substrate temperature set from 300 to 400° C., and the film can be formed by applying a high frequency (60 MHz) electric power density of 0.1 to 1.0 W/cm$^2$. Further, a hydrogenated silicon oxynitride film manufactured from $SiH_4$, $N_2O$, and $H_2$ may also be applied. It is also possible to manufacture a silicon nitride film from $SiH_4$, and $NH_3$ similarly by plasma CVD.

A process of activating the n-type and p-type conductivity imparting impurity element added at their respective concentrations is then performed. Thermal annealing using an annealing furnace is performed for this process. In addition, laser annealing and rapid thermal annealing (RTA) can also be applied. As the laser annealing method, the method disclosed on the present invention may be used. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 550° C. in Embodiment 6. Further, it is preferable to apply laser annealing when a plastic substrate having a low heat resistance temperature is used as the substrate 101.

After the activation process, the gas atmosphere is changed and heat treatment is performed for 1 to 12 hours at 300 to 450° C. in an atmosphere containing 3 to 100% hydrogen, performing hydrogenation of the island-like semiconductor layers. This process is one of terminating from $10^{16}$ to $10^{18}$/cm$^3$ of dangling bonds in the island-like semiconductor layers by hydrogen which is thermally excited. Plasma hydrogenation (using hydrogen excited by a plasma) may also be performed as another means of hydrogenation. Whichever is used, it is preferable to reduce the defect density within the island-like semiconductor layers 104 to 108 to $10^{16}$/cm$^3$ or less, and hydrogen may be imparted on the order of 0.01 to 0.1 atom %.

Thereafter, a second interlayer insulating film 159 made of an organic resin is formed to a thickness of 1.0 to 1.5 $\mu$m. The organic resin used may be polyimide, acrylic, polyamide, BCB (benzocyclobutene) or the like. In this embodiment, after coating onto the substrate, a thermal polymerization type polyimide was used for formation by firing at 300° C.

In this way, the second interlayer insulating film is formed of an organic insulator material, thereby the surface can be finely flatten. Further, an organic resin material generally has a low dielectric constant, therefore the parasitic capacitance can be reduced. However, it absorbs moisture and is not suitable as a protecting film, so that it is used in combination with the first interlayer insulating film 158 formed by a film such as a silicon oxide film, a silicon oxynitride film, or a silicon nitride film.

Next, a resist mask is formed with a predetermined pattern using a fourth photomask PM4, and contact holes are formed in each of the island-like semiconductor layers in order to reach the impurity regions formed as source regions or drain regions. The contact holes are formed by dry etching. In this case, a second interlayer insulating film 159 made from an organic resin material is etched using a gas mixture of $CF_4$, $O_2$, and He. Afterward, the first interlayer insulating film 158 is etched in succession using an etching gas of $CF_4$ and $O_2$. In addition, the contact holes can be formed by etching the third shape gate insulating film 109c, where the etching gas is switched to $CHF_3$ in order to increase the selectivity with the island-like semiconductor layers.

A conductive metallic film is then formed by sputtering or vacuum evaporation, and a resist mask pattern is formed by a fifth photomask PM5. Source lines 160 to 164 and drain lines 165 to 168 are formed by etching. A pixel electrode 169 is formed with the drain lines. A pixel electrode 171 denotes a pixel electrode belonging to the adjacent pixel. Although not illustrated, the wirings in this embodiment are formed as follows. A Ti film having a thickness of 50 to 150 nm is formed to be in contact with the impurity regions in the island-shaped semiconductor layers functioning as the source/drain regions. Aluminum (Al) films with a thickness of 300 to 400 nm (shown by reference numerals 160a to 169a in FIG. 12B), are formed on the Ti film, and further transparent conductive films with a thickness of 80 to 120 nm (shown by reference numerals 160b to 169b in FIG. 12B) are overlaid thereon. An indium oxide zinc oxide alloy ($In_2O_3$—ZnO) or zinc oxide (ZnO) is the material applied suitably to the transparent conductive film, and in addition, a material such as zinc oxide in which gallium (Ga) has been added (ZnO:Ga) in order to increase the transmittivity of visible light and to increase the conductivity can also be used preferably.

The substrate, having the driver circuit TFTs and the pixel TFTs of the pixel portion on the same substrate, can thus be completed by using 5 photomasks. A first p-channel TFT 200, a first n-channel TFT 201, a second p-channel TFT 202, and a second n-channel TFT 203 are formed in the driver circuit, and a pixel TFT 204 and a storage capacitor 205 are formed in the pixel portion. This type of substrate is referred to as an active matrix substrate throughout this specification for convenience.

In the first p-channel TFT 200 of the driver circuit, a conductive layer having the second tapered shape functions as a gate electrode 220. The structure of the island-like semiconductor layer 104 has a channel forming region 206, a third impurity region 207a which functions as a source region or a drain region, a fourth impurity region (A) 207b which forms an LDD region not overlapping the gate electrode 220, and a fourth impurity region (B) 207c which forms an LDD region overlapping a portion of the gate electrode 220.

In the first n-channel TFT 201, a conductive layer having the second tapered shape functions as a gate electrode 221. The structure of the island-like semiconductor layer 105 has a channel forming region 208, a first impurity region 209a which functions as a source region or a drain region, a second impurity region (A) 209b which forms an LDD region not overlapping the gate electrode 221, and a second impurity region (B) 209c which forms an LDD region overlapping a portion of the gate electrode 221. The length of the portion in which the second impurity region (B) 209c overlaps the gate electrode 221 is set from 0.1 to 0.3 μm with respect to a channel length of 2 to 7 μm. This length is controlled by the thickness of the gate electrode 221 and by the angle of the tapered portion. By forming this type of LDD region in an n-channel TFT, the high electric field which develops near the drain region is relieved, and the development of hot carriers is blocked, then deterioration of the TFT can be prevented.

In the second p-channel TFT 202 of the driver circuit, a conductive layer having the second tapered shape similarly functions as a gate electrode 222. The structure of the island-like semiconductor layer 106 has a channel forming region 210, a third impurity region 211a which functions as a source region or a drain region, a fourth impurity region (A) 211b which forms an LDD region not overlapping the gate electrode 222, and a fourth impurity region (B) 211c which forms an LDD region overlapping a portion of the gate electrode 222.

In the second n-channel TFT 203 of the driver circuit, a conductive layer having the second tapered shape functions as a gate electrode 223. The structure of the island-like semiconductor layer 107 has a channel forming region 212, a first impurity region 213a which functions as a source region or a drain region, a second impurity region (A) 213b which forms an LDD region not overlapping the gate electrode 223, and a second impurity region (B) 213c which forms an LDD region overlapping a portion of the gate electrode 223. The length of the portion in which the second impurity region (B) 213c overlaps the gate electrode 223 is set similar to that of the second n-channel TFT 201, from 0.1 to 0.3 μm.

Figure 12B:
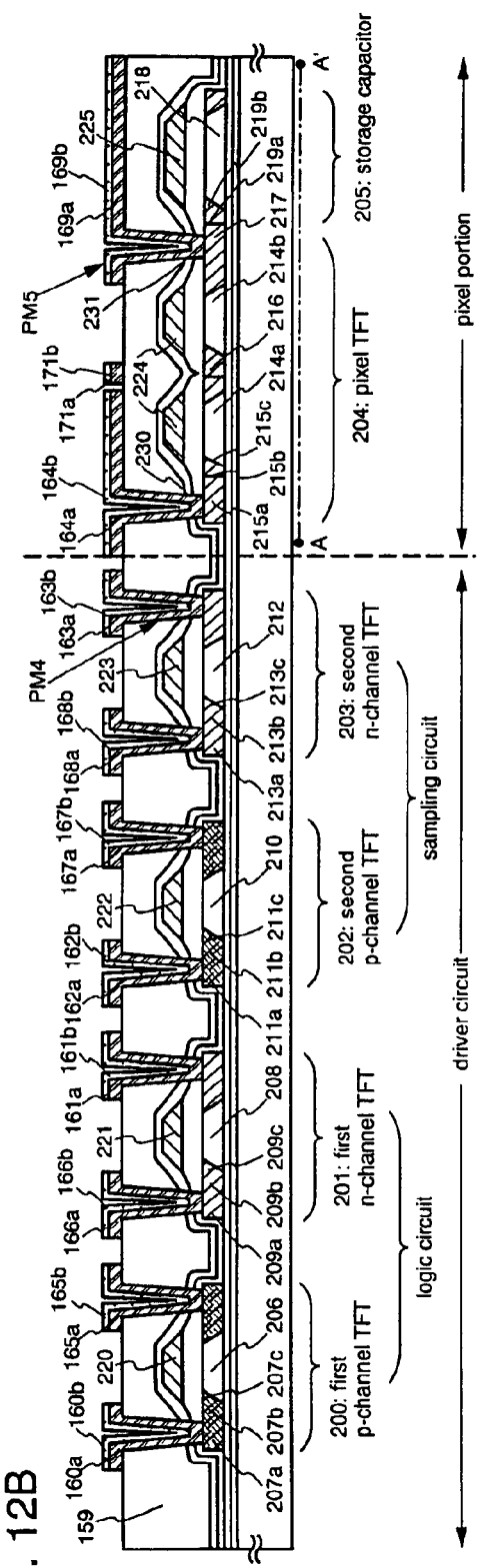

The driver circuit is formed by logic circuits such as a shift register circuit and a buffer circuit, and a sampling circuit formed by an analog switch. In FIG. 12B, TFTs for forming these circuits are shown by a single gate structure in which one gate electrode is formed between a source and drain pair, but a multi-gate structure in which a plurality of gate electrodes are formed between source and drain pairs may also be used.

In the pixel TFT 204, a conductive layer having the second tapered shape functions as a gate electrode 224. The structure of the island-like semiconductor layer 108 has channel forming regions 214a and 214b, first impurity region 215a and 217 which function as source regions or drain regions, a second impurity region (A) 215b which forms an LDD region not overlapping the gate electrode 224, and a second impurity region (B) 215c which forms an LDD region overlapping a portion of the gate electrode 224. The length of the portion in which the second impurity region (B) 215c overlaps the gate electrode 224 is set from 0.1 to 0.3 μm. Further, a storage capacitor is formed from: a semiconductor layer which extends from the first impurity region 217 and has a second impurity region (A) 219a, a second impurity region (B) 219b, and a region 218 to which is not added impurity elements determining the conductivity type; an insulating layer formed by the same layer as the gate insulating film having the third shape; and a capacitor wiring 225 formed from the second tapered shape conductive layer.

Figure 18:
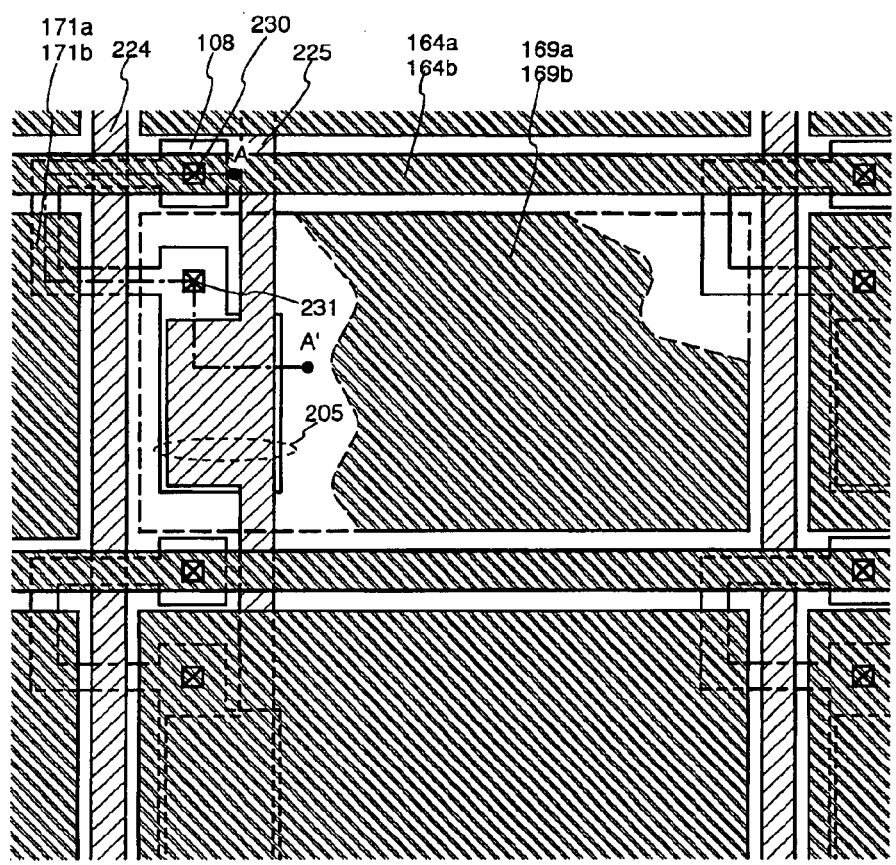
FIG. 18 is a top view showing one pixel of a pixel unit.

FIG. 18 is a top view showing approximately one pixel of the pixel portion. A cross section along the line A–A' shown in the figure corresponds to the cross sectional diagram of the pixel portion shown in FIG. 12B. In the pixel TFT 204, a gate electrode 224 intersects, though a gate insulating film not shown in the figure, with the island-like semiconductor layer 108 formed below and stretches over a plurality of island-like semiconductor layers furthermore to serve as the gate wiring. Although not shown in the figure, a source region, a drain region, and an LDD region are formed in the island-like semiconductor layers, as explained by FIG. 12B. Further, reference numeral 230 denotes a contact portion of the source wiring 164 and the source region 215a, reference numeral 231 denotes a contact portion of the pixel electrode 169 and a drain region 217. The storage capacitor 205 is formed by a region in which the semiconductor layer extending from the drain region 217 of the pixel TFT 204 and the capacitor wiring 225 overlap, through the gate insulating film. An impurity element for controlling valence electrons is not added in the semiconductor layer 218 in this structure.

A structure such as that above optimizes the structure of the pixel TFT and TFTs consisting each circuits of the driver circuit in response to the specifications required, and it is possible to increase the operating performance and the reliability of the semiconductor device. In addition, by forming the gate electrode using a conductive material having heat resistance, the LDD regions, and source regions and drain regions are easily activated. Moreover, when forming the LDD region overlapping the gate electrode through the gate insulating film, in particular it can be expected that the relieving effect for the electric field formed in the vicinity of the drain region will increase by forming the LDD region to possess a concentration gradient of an impurity element added with the aim of controlling the conductivity type.

Figure 16A:
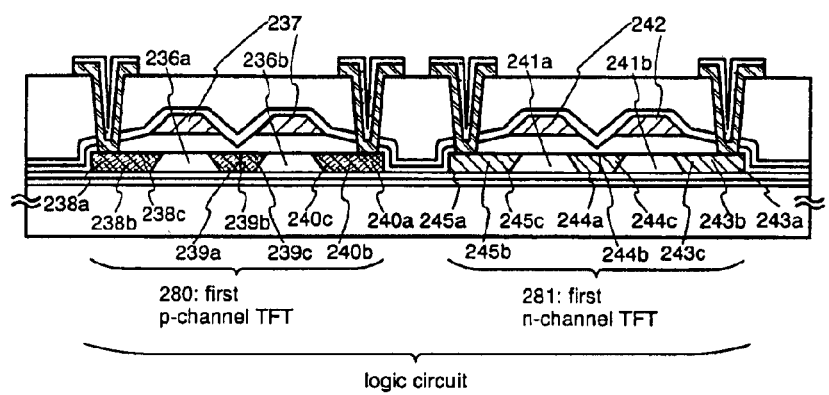
FIGS. 16A and 16B are sectional views showing the constructions of the TFTs of the driver circuit.

For a case of an active matrix type liquid crystal display device, the first p-channel TFT 200 and the first n-channel TFT 201 are used to form circuits such as a shift register circuit, a buffer circuit, and a level shifter circuit which place importance on high speed operation. In FIG. 12B, these circuits are denoted as a logic circuit portion. The second impurity region (B) 209c of the first n-channel TFT 201 becomes a structure which places importance on counter-acting hot carriers. In addition, in order to increase withstand voltage and stabilize operation, the TFTs of the logic circuit portion may also be formed by a first p-channel TFT 280 and a first n-channel TFT 281, as shown by FIG. 16A. These TFTs have a double gate structure in which two gate electrodes are formed between one source and drain pair, and this type of TFT can be similarly manufactured by using the processes of Embodiment 6. The structure of the first p-channel TFT 280 has channel forming regions 236a and 236b, third impurity regions 238a, 239a, and 240a which function as source or drain regions, fourth impurity regions (A) 238b, 239b, and 240b which become LDD regions, and fourth impurity regions (B) 238c, 239c, and 240c which become LDD regions overlapping a portion of a gate electrode 237 in the island-like semiconductor layer. The structure of the first n-channel TFT 281 has channel forming regions 241a and 241b, first impurity regions 243a, 244a, and 245a which function as source or drain regions, second impurity regions (A) 243b, 244b, and 245b which become LDD regions, and second impurity regions (B) 243c, 244c, and 245c which become LDD regions overlapping a portion of a gate electrode 242 in the island-like semiconductor layer. A channel length is set on the range from 3 to 7 μm, and an overlapping length in the channel length direction of the LDD region overlapping with the gate electrode is set in the range from 0.1 to 0.3 μm.

Figure 16B:
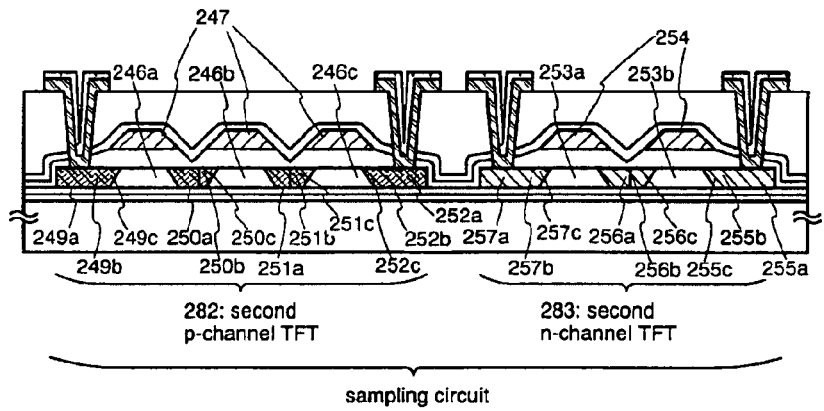

Further, in a sampling circuit structured by analog switches, similarly structured second p-channel TFTs 202 and second n-channel TFTs 203 can be applied. The sampling circuit places importance on measures against hot carriers and low Off current operation therefore the TFT of this circuit may be formed by a second p-channel TFT 282 and a second n-channel TFT 283 as shown by FIG. 16B. The second p-channel TFT 282 has a triple gate structure in which three gate electrodes are formed between one source and drain pair, and this type of TFT can be similarly manufactured by using the processes of Embodiment 6. The structure of the second p-channel TFT 282 has channel forming regions 246a, 246b, and 246c, third impurity regions 249a, 250a, 251a, and 252a which function as source or drain regions, fourth impurity regions (A) 249b, 250b, 251b, and 252b which become LDD regions, and fourth impurity regions (B) 249c, 250c, 251c, and 252c which become LDD regions overlapping a portion of a gate electrode 247. The structure of the second n-channel TFT 283 has channel forming regions 253a and 253b, first impurity regions 255a, 256a, and 257a which function as source or drain regions, second impurity regions (A) 255b, 256b, and 257b which become LDD regions, and second impurity regions (B) 255c, 256c, and 257c which become LDD regions overlapping a portion of a gate electrode 254. A channel length is set on the range from 3 to 7 µm, and an overlapping length in the channel length direction of the LDD region overlapping with the gate electrode is set in the range from 0.1 to 0.3 µm.

Thus, whether to use a single gate structure for the structure of the TFT gate electrode, or to use a multi-gate structure in which a plurality of gate electrodes are formed between one source and drain pair, may be suitably determined by the operator, in accordance with the circuit characteristics. A reflecting type liquid crystal display device can then be manufactured by using the active matrix substrate completed in Embodiment 6.

[Embodiment 7]

Examples of using heat-resistant conductive materials such as W and Ta as materials for the gate electrode were shown in Embodiment 6. The reason for using these materials resides in that it is necessary to activate the impurity element that was doped into the semiconductor layer for the purpose of controlling the conductive type after the formation of the gate electrode by thermal annealing at between 400° C. and 700° C. By implementing this step, it is necessary that the gate electrode has heat-resistivity. However, this type of heat-resistant conductive material has a sheet resistivity of about 10Ω, and hence is not always suitable for a display device having a screen size of a 4-inch class or more. This is because if a gate wiring to be connected to the gate electrode is formed of the same material, then the length of the lead wiring on the substrate inevitably becomes large. Thus, the problem of a wiring delay caused by the influence of wiring resistance cannot be ignored.

Figure 13A:
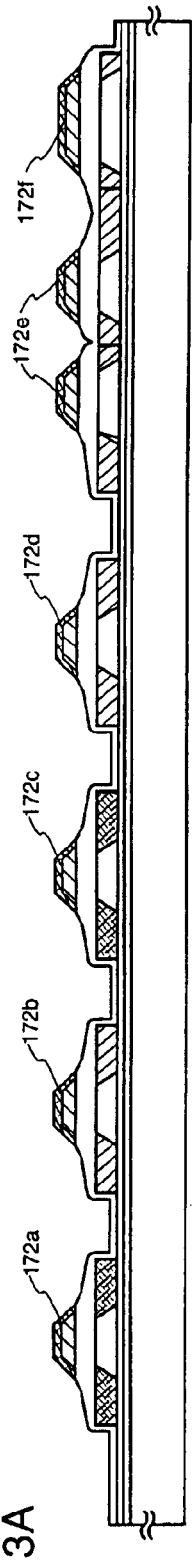
FIGS. 13A, 13B and 13C are sectional views showing the steps of fabricating a pixel TFT, and the TFTs of a driver circuit.

For example, 480 gate wirings and 640 source wirings are formed when the pixel density is VGA, and 768 gate wirings and 1024 source wirings are formed in the case of XGA. The screen size of the display region becomes 340 mm for a 13-inch class in diagonal length, and becomes 460 mm for an 18-inch class. In this embodiment, as a means of realizing this kind of liquid crystal display device, a method of forming the gate wiring from low-resistant conductive material such as Al and copper (Cu) will be explained using FIG. 13.

First, similar to Embodiment 6, the steps shown in FIGS. 10A to 11C will be performed. Then a step of activating the impurity element doped into the respective island semiconductor layers for the purpose of controlling the conductive type is performed. This step is performed by thermal annealing using an annealing furnace. In addition, laser annealing or rapid thermal annealing (RTA) can also be employed. The thermal annealing process is performed at 400° C. to 700° C., typically 500° C. to 600° C. in a nitrogen atmosphere which has an oxygen concentration of 1 ppm or less, preferably 0.1 ppm or less. In this embodiment, heat treatment is performed for 4 hours at 500° C.

Through this heat treatment, conductive layers 140 to 145 having a second tapered shape, come to have conductive layers (C) 172a to 172f formed to a thickness of 5 to 80 nm from the surfaces. For example, when the conductive layers having a second tapered shape are tungsten (W), tungsten nitride (WN) is formed, and tantalum nitride (TaN) is formed when the conductive layers are tantalum (Ta). Further, a step of hydrogenating the island semiconductor layers is performed by heat treatment at 300 to 450° C. for between 1 and 12 hours in an atmosphere containing between 3 and 100% hydrogen. This step is one for terminating dangling bonds in the semiconductor layers with thermally excited hydrogen. Plasma hydrogenation (using hydrogen excited by a plasma) may be performed as another means of hydrogenation. (See FIG. 13A) After the activation and hydrogenation steps are completed, a gate wiring is formed from a low-resistant conductive material comprising aluminum (Al) or copper (Cu) as a main component. The gate wiring is formed from the low-resistant conductive layer comprising such a material. For example, an aluminum film containing between 0.1 and 2% by weight of titanium (Ti) is formed as the low-resistant conductive layer on the entire surface (not shown). The low-resistant conductive layer may be formed with a thickness of 200 to 400 nm (preferably 250 to 350 nm). Then, a predetermined resist pattern is formed, the conductive layer is etched in order to form gate wirings 173 and 174. At this time, a capacitor wiring 175 which is connected with a storage capacitor provided in a pixel portion, is formed from the same material. When the low-resistant conductive layer comprises aluminum (Al) as a main component, by wet etching using a phosphoric acid-based etching solution, the gate wiring can be formed while maintaining the selective workability with the base. A first interlayer insulating film 176 is formed in the same way as that of Embodiment 6. (See FIG. 13B)

Figure 13C:
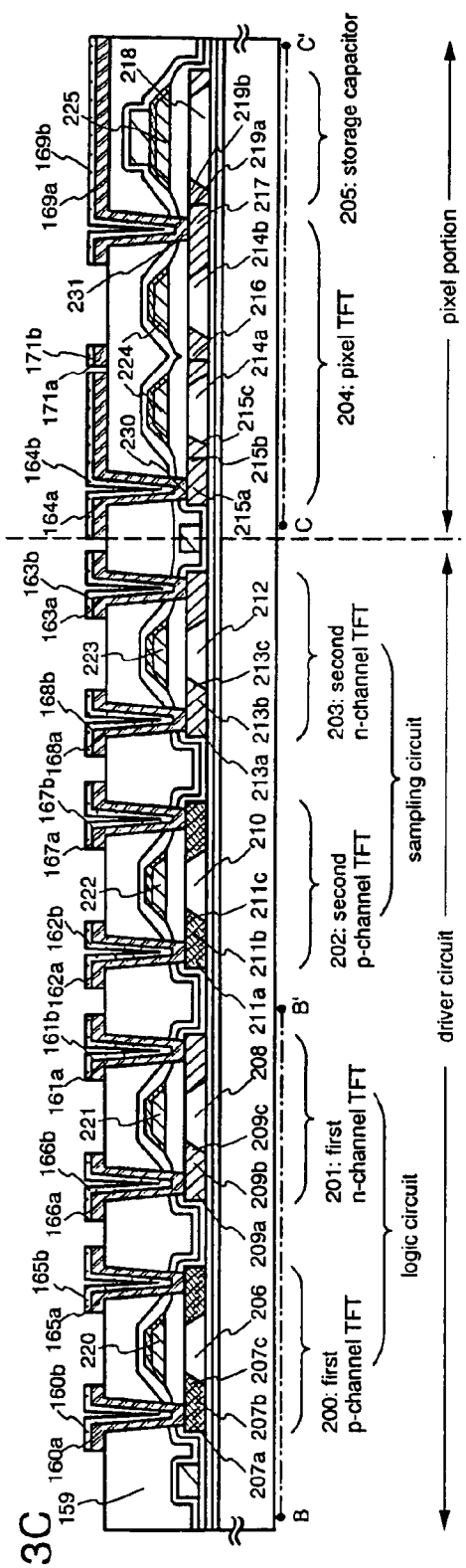
Figure 14A:
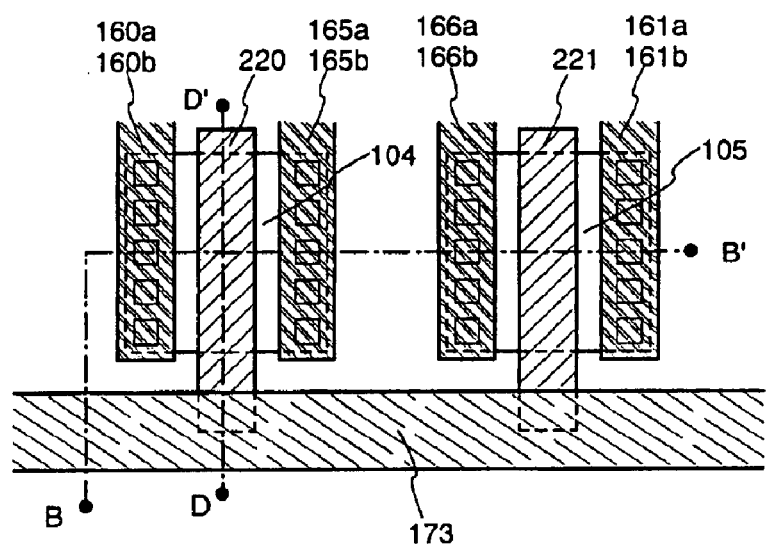
FIGS. 14A and 14B are top views showing the structures of the TFTs of the driver circuit and the pixel TFT.
Figure 14B:
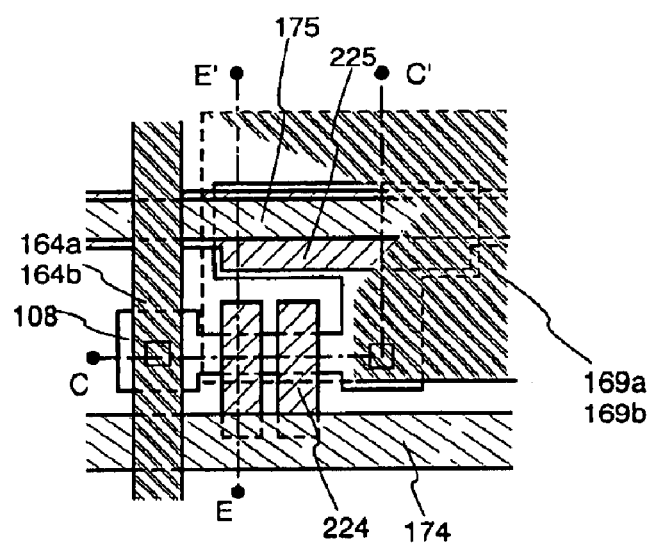
Figure 15A:
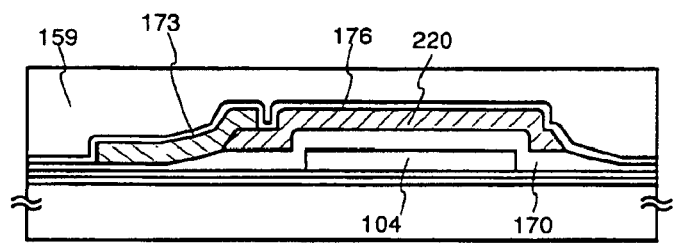
FIGS. 15A and 15B are sectional views showing the structures of the TFTs of the driver circuit and the pixel TFT.
Figure 15B:
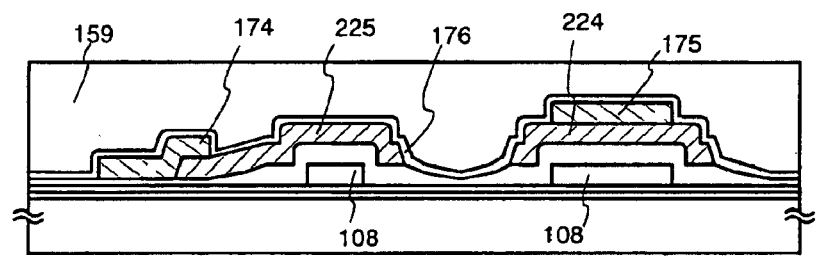

Thereafter, similar to Embodiment 6, by forming the second interlayer insulating film 159 made of an organic insulating material, source wirings 160 to 164, and drain wirings 165 to 168, pixel electrodes 169 and 171, the active matrix substrate can thus be completed. FIGS. 14A and 14B show top views of this state, and the cross sections taken along the line B–B' of FIG. 14A and the line C–C' of FIG. 14B correspond to the B–B' and C–C' cross sections, respectively, in FIG. 13C. Although the gate insulating film, the first interlayer insulating film, and the second interlayer insulating film are omitted from the FIGS. 14A and 14B, the source and drain regions of the island semiconductor layers 104, 105, and 108 not shown in the figure are connected to the source wirings 160, 161 and 164, and drain wirings 165, 166 and the pixel electrode 169 through contact holes. Further, the cross sections taken along the line D–D' of FIG. 14A and the line E–E' of FIG. 14B are shown in FIGS. 15A and 15B, respectively. The gate wiring 173 is formed overlapping the gate electrodes 220, and the gate wiring 174 is formed overlapping the gate electrode 225 in the outside of the island semiconductor layers 104 and 108. Thus, the gate electrode and the low-resistant conductive layer are in close contact to be electrically communicated without contact holes. By forming the gate wiring from a low-resistant conductive material in this way, the wiring resistance can be sufficiently reduced. Accordingly, the present invention can be applied to a display device that has a pixel portion (screen size) of 4-inch class or more.

[Embodiment 8]

The active matrix substrate manufactured in Embodiment 6 is applicable for a reflection type display device as it is. On the other hand, in the case of applying it to a transmission type liquid crystal display device, it is appropriate to form the pixel electrodes provided in each pixel of the pixel portion with transparent electrodes. A method of manufacturing an active matrix substrate corresponding to the transmission type liquid crystal display device is explained in with references to FIG. 17.

Figure 17A:
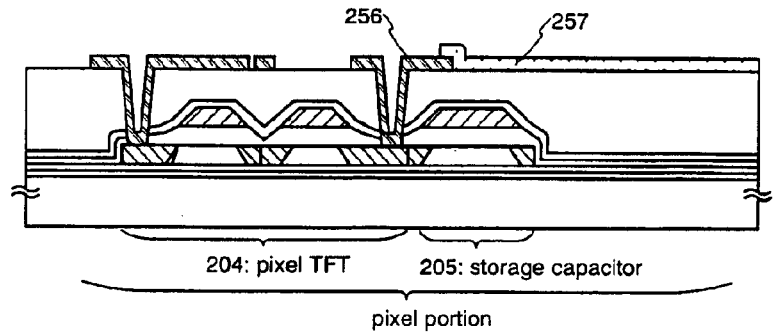
FIGS. 17A and 17B, and FIGS. 17C and 17D are sectional views showing the constructions of the pixel TFT, respectively.
Figure 17B:
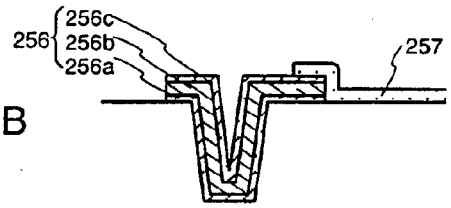

The active matrix substrate is manufactured in the same way as Embodiment 6. In FIG. 17A, a conductive metallic film is formed by sputtering or vacuum evaporation to form a source wiring and a drain wiring. This structure will be explained in detail with reference to FIG. 17B using the drain wiring 256 as an example. A Ti film 256a is formed at a thickness of between 50 and 150 nm, and then a contact is formed with a semiconductor film that forms the source or the drain region in an island semiconductor layer. Next an aluminum (Al) film 256b is formed at a thickness of between 300 and 400 nm overlapping on the Ti film 256a. Further, a Ti film 256c or a titanium nitride (TiN) film is formed at a thickness of between 100 and 200 nm to thereby form a three-layer structure. Then a transparent conductive film is formed on the entire surface. A pixel electrode 257 is formed by a patterning process and an etching process, using a photomask. The pixel electrode 257 is formed on a second interlayer insulating film made of an organic resin material and sets aside a portion for overlapping with the drain wiring 256 of the pixel TFT 204 without contact holes in order to form an electrical connection.

Figure 17C:
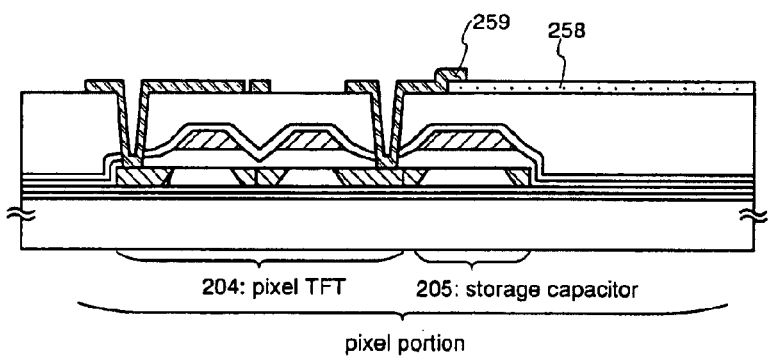
Figure 17D:
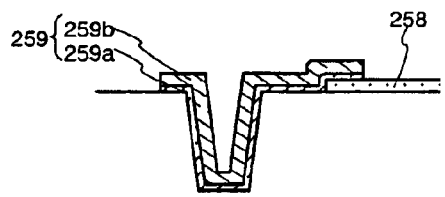

FIG. 17C is an example of first forming a transparent conductive film on the second interlayer insulating film, performing a patterning process and an etching process to form a pixel electrode 258, and then forming a drain wiring 259 by a portion that overlaps with the pixel electrode 258 without contact holes. As shown in FIG. 17D, the drain wiring 259 is provided by forming a Ti film 259a at a thickness of between 50 and 150 nm, forming a contact hole with a semiconductor film that forms the source or the drain region in an island semiconductor layer, and then forming an aluminum film 259b at a thickness of between 300 and 400 nm overlapping on the Ti film 259a. With this structure, the pixel electrode 258 is in contact only with the Ti film 259a that forms the drain wiring 259. Consequently, the transparent conductive film material and Al reacting from direct contact can definitely be prevented.

Materials such as indium oxide ($In_2O_3$), or an indium oxide/tin oxide alloy ($In_2O_3$—$SnO_2$; ITO) formed by sputtering or vacuum evaporation may be used as materials for the transparent conductive film. The etching treatment of these materials is performed with hydrochloric acid solutions. However, in particular, the etching of ITO readily generates residues. Therefore, an indium oxide/zinc oxide alloy ($In_2O_3$—ZnO) may be used in order to improve the etching workability. The indium oxide/zinc oxide alloy has excellent flat and smooth surface properties, and also has excellent thermal stability with regard to ITO. Accordingly, in the structure of FIGS. 24A and 24B, at an edge surface of a drain wiring 256 where the Al film 256b comes into contact with the pixel electrode 257, corrosion reaction with Al can be prevented. Similarly, zinc oxide (ZnO) is also a suitable material. In order to further improve the transmissivity of visible light and conductivity, zinc oxide (ZnO:Ga) doped with gallium (Ga) or the like may be used.

In Embodiment 6, an active matrix substrate that can be used for manufacturing the reflection type liquid crystal display device was fabricated by using 5 photomasks. The addition of one more photomask (a total of 6 photomasks) can thus complete an active matrix substrate corresponding to the transmission type liquid crystal display device. Though the steps of described in this embodiment are similar to those in Embodiment 6, this kind of structure can be applied to the active matrix substrate shown in Embodiment 7.

[Embodiment 9]

Figure 19A:
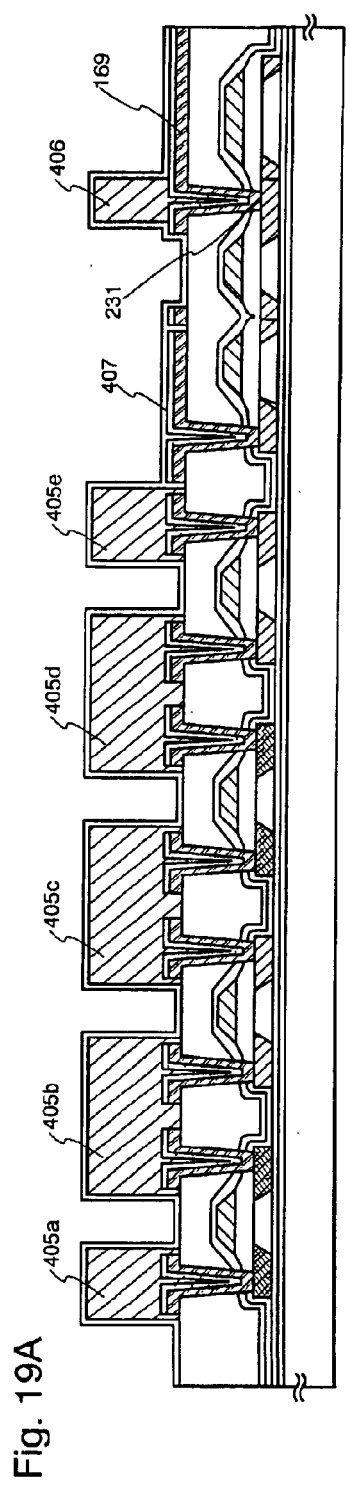
FIGS. 19A and 19B are sectional views showing the steps of fabricating an active matrix type liquid-crystal display device.

A process of manufacturing an active matrix liquid crystal display device from the active matrix substrate fabricated in Embodiment 6 will be explained here in this Embodiment. As shown in FIG. 19A, first a spacer made from a column-shape spacer is formed on the active matrix substrate in the state of FIG. 12B. The spacer may be provided by a method of spraying several mm of grains. A method of forming the spacer by patterning after forming a resin film on the entire surface of the substrate is adopted here in this embodiment. The material for such kind of spacer is not limited. For example, using the JSR product NN700, after application to the substrate by a spinner, a predetermined pattern is formed by exposure and development treatment. Furthermore, it is cured by being heated in a clean oven at 150° C. to 200° C. The shape of the spacer formed in this way may be made different depending on the conditions of the exposure and development treatment. The spacer is formed so that its shape becomes a column-shape with a flat top, which is a preferred shape because when an opposing substrate is bonded to this substrate, its mechanical strength as a liquid crystal display panel can be ensured. The shape of the spacer such as a conical shape or a pyramid shape is not specially limited thereto. For example, when the spacer is a conical shape, its specific measurements are as follows: the height is set between 1.2 and 5 μm, the average radius is set between 5 and 7 μm, and the ratio of the average radius and the radius of the bottom portion is set to 1 to 1.5. The taper angle of the side surface at this point is ±15° or less.

The arrangement of the spacers may be arbitrarily determined, but preferably it is appropriate to form a column-shape spacer 406 overlapping the contact area 231 of the pixel electrode 169 in the pixel portion so as to cover that overlapped portion as shown in FIG. 19A. Liquid crystal cannot be smoothly oriented in a portion where the levelness of the contact area 231 has been ruined. Hence, the column-shape spacer 406 is formed as in the form of filling the contact area 231 with resin used for the spacer, whereby disclination or the like can be prevented. In addition, spacers 405a to 405e are formed on the TFT of the driver circuit. These spacers may be formed extending over the entire surface of the driver circuit portion, and may also be formed so as to cover the source wiring and the drain wiring as shown in FIG. 19.

Thereafter, an alignment film 407 is formed. A polyimide resin is generally used for the alignment film of a liquid crystal element. After forming the alignment films, a rubbing treatment is performed so that the liquid crystal molecules are oriented with a certain fixed pre-tilt angle. The rubbing treatment is performed so that an area of 2 μm or less from the edge portion of the column-shape spacer 406 provided in the pixel portion to the rubbing direction, is not rubbed. Further, since the generation of static electricity from the rubbing treatment is often a problem, an effect of protecting the TFT from the static electricity can be attained by forming the spacers 405a to 405e formed on the TFT of the driver circuit. Although not described in the figures, the substrate may have a structure in which the alignment film 407 is formed before forming the spacers 406 and 405a to 405e.

Figure 19B:
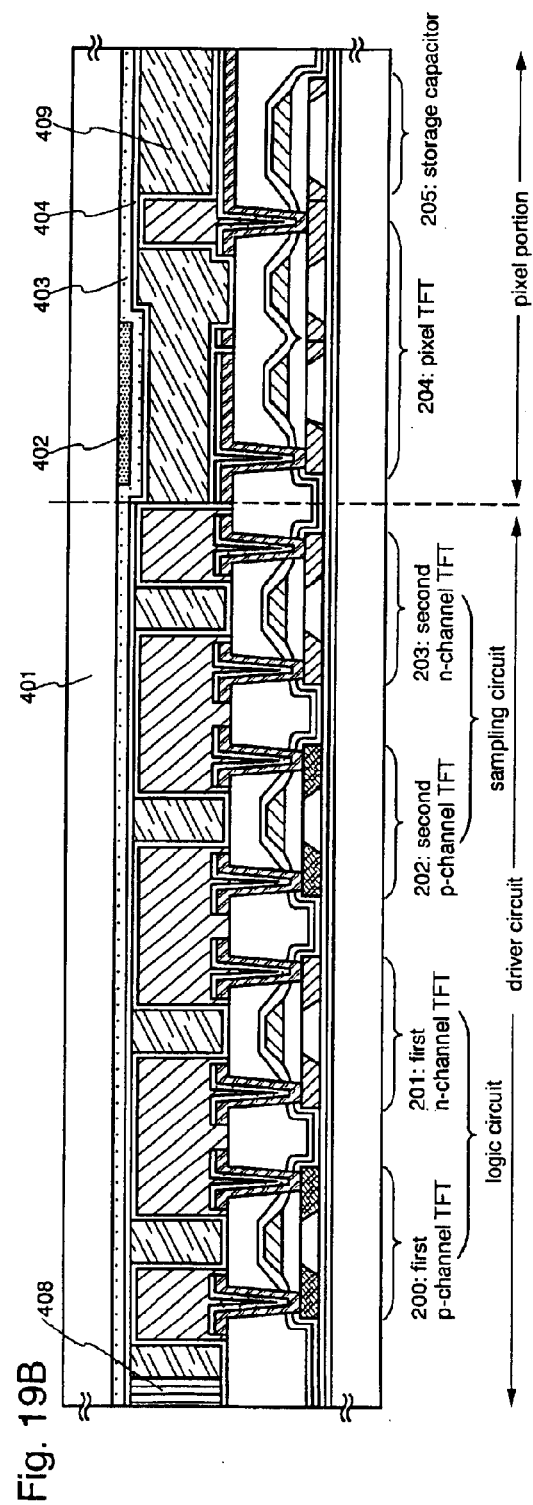

A light shielding film 402, a transparent conductive film 403, and an alignment film 404 are formed on an opposing substrate 401, which is opposed to the active matrix substrate. The light shielding film 402 is formed of films such as a Ti film, a Cr film, and an Al film at a thickness of between 150 and 300 nm. Then, the active matrix substrate on which the pixel portion and the driver circuit are formed, and the opposing substrate are then joined together by a sealant 408. A filler (not shown in the figures) is mixed into the sealant 408, and the two substrates are joined together with a uniform spacing by the filler and the spacers 406 and 405a to 405e. Next, a liquid crystal material 409 is injected between both substrates. A known liquid crystal material may be used as the liquid crystal material. For example, besides the TN liquid crystal, a thresholdness antiferroelectric mixed liquid crystal that indicates electro-optical response characteristics of continuously changing transmittance with respect to an electric field may also be used. Among such thresholdness antiferroelectric mixture liquid crystal, there is a type that indicates a V-shaped electro-optical response characteristic. In this way, the active matrix type liquid crystal display device shown in FIG. 19B is completed.

Figure 20:
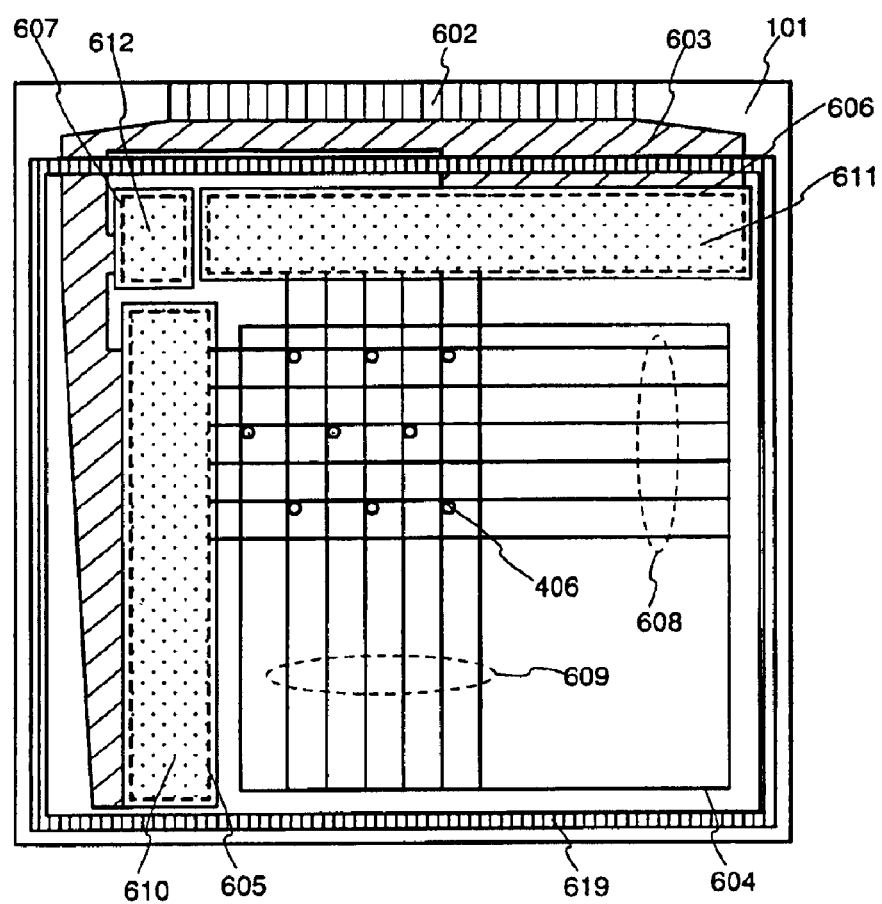
FIG. 20 is a top view for explaining the arrangement of the input/output terminals, wiring lines, circuit arrangements, spacers and sealant of the liquid-crystal display device.

FIG. 20 is a top view showing this type of active matrix substrate and the positional relation of the pixel portion and the driver circuit portion versus the spacers and the sealant. A scanning signal driver circuit 605 and an image signal driver circuit 606 as driver circuits are provided in the periphery of a pixel portion 604 on the glass substrate 101 described in Embodiment 6. In addition, a signal processing circuit 607 such as a CPU or a memory circuit may also be added. Then these driver circuits are connected to an external input/output terminal 602 by a connecting wiring 603. In the pixel portion 604, a set of gate wirings 608 extending from the scanning signal driver circuit 605 and a set of source wirings 609 extending from the image signal driver circuit 606 intersect in matrix to form pixels. Each pixel is provided with the pixel TFT 204 and the storage capacitor 205.

In FIG. 19, the column-shape spacer 406 provided in the pixel portion may be provided not only to every pixel, but also to every several pixels or several tens of the pixels arranged in a matrix manner as shown in FIG. 20. In other words, it is possible to set the ratio of the total number of pixels composing the pixel portion to the number of spacers between 20% and 100%. In addition, the spacers 405a to 405e provided in the driver circuits portion may be formed so as to cover the entire surface of the circuits, or may be provided in accordance with the position of the source wiring and the drain wiring of each TFT. In FIG. 20, reference numerals 610 to 612 denote the arrangement of the spacers provided in the driver circuit portion. In FIG. 20, the sealant 619 is formed on the exterior of the pixel portion 604, the scanning signal driver circuit 605, the image signal driver circuit 606, and the signal processing circuit 607 of the other circuits, and on the interior of an external input/output terminal 602, that are formed over the substrate 101.

Figure 21:
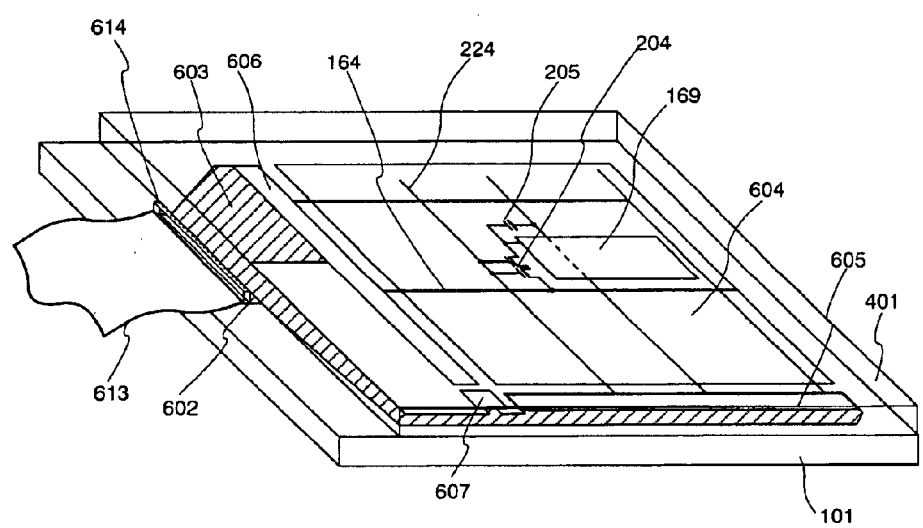
FIG. 21 is a perspective view showing the structure of the liquid-crystal display device.

Next, the structure of this kind of active matrix liquid crystal display device is explained using the perspective view of FIG. 21. In FIG. 21, the active matrix substrate comprises the pixel portion 604, the scanning signal driver circuit 605, the image signal driver circuit 606, and the signal processing circuit 607 of the other circuits formed over the glass substrate 101. The pixel TFT 204 and the storage capacitor 205 are provided in the pixel portion 604, and the driver circuit formed in the periphery thereof is structured based on a CMOS circuit. The scanning signal driver circuit 605 and the image signal driver circuit 606 are connected to the pixel TFT 204 by the gate wiring (which is equal to 224 in FIG. 12B when the gate wiring is formed subsequent to the gate electrode) and the source wiring 164, respectively, extending to the pixel portion 604. Further, an FPC (flexible printed circuit) 613 is connected to the external input terminal 602 to be utilized for inputting signals such as image signals. The FPC 613 is firmly adhered in this area by a strengthening resin 614. The connecting wiring 603 is connected to the respective driver circuits. Further, though not shown in the figure, a light shielding film and a transparent electrode are provided on the opposing substrate 401.

A liquid display device with this kind of structure can be formed by using the active matrix substrate described in Embodiments 6 to 8. The reflection type liquid crystal display device can be attained with employment of the active matrix substrate shown in Embodiment 6 whereas the transmission type liquid crystal display device can be attained with employment of the active matrix substrate shown in Embodiment 8.

[Embodiment 10]

Figure 22:
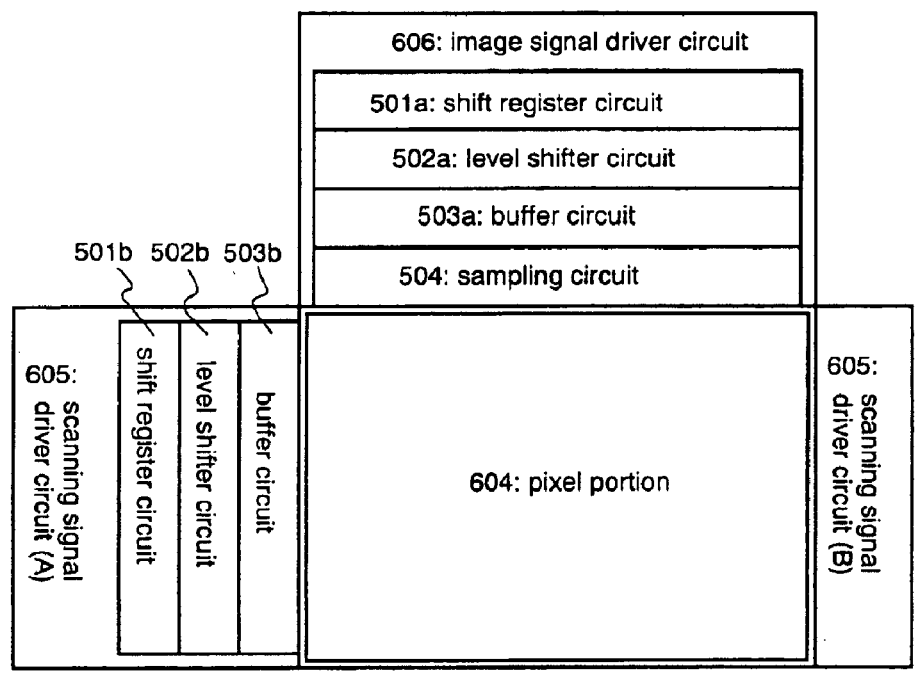
FIG. 22 is a block diagram for explaining the circuit configuration of the active matrix type display device.

FIG. 22 illustrates an example of the circuit structure of the active matrix substrate described in Embodiments 6 to 8, and shows the circuit structure of a direct-view type display device. This active matrix substrate is composed of the image signal driver circuit 606, the scanning signal driver circuits (A) and (B) 605, and the pixel portion 604. Note that the driver circuit stated throughout the present specification is a generic term including the image signal driver circuit 606 and the scanning signal driver circuits 605.

The image signal driver circuit 606 comprises a shift register circuit 501a, a level shifter circuit 502a, a buffer circuit 503a, and a sampling circuit 504. In addition, the scanning signal driver circuits (A) and (B) 605 comprises a shift register circuit 501b, a level shifter circuit 502b, and a buffer circuit 503b.

The driving voltages of the shift resister circuits 501a and 501b are between 5 and 16V (typically 10V). A TFT of a CMOS circuit for forming this circuit is formed of the first p-channel TFT 200 and the first n-channel TFT 201 of FIG. 12B, or the TFT may be formed of the first p-channel TFT 280 and the first n-channel TFT 281 shown in FIG. 16A. In addition, since the driving voltage of the level shifter circuits 502a and 502b and the buffer circuits 503a and 503b become as high as 14 to 16V, it is preferable that the TFT structure be formed into a multi-gate structure as shown in FIG. 16A. Forming the TFT into a multi-gate structure is effective in raising voltage-resistance and improving the reliability of the circuits.

The sampling circuit 504 comprises an analog switch and its driving voltage is between 14 to 16V. Since the polarity alternately reverses to be driven and there is a necessity to reduce the Off current value, it is desired that the sampling circuit 504 be formed of the second p-channel TFT 202 and the second n-channel TFT 203 as shown in FIG. 12B. Alternatively, the sampling circuit may be formed of the second p-channel TFT 282 and the second n-channel TFT 283 of FIG. 16B in order to effectively reduce the Off current value.

Further, the driving voltage of the pixel portion is between 14 and 16V. From a viewpoint of reducing power consumption, there is a demand to further reduce the Off current value than that of the sampling circuit. Accordingly, as a basic structure, the pixel portion is formed into a multi-gate structure as the pixel TFT 204 shown in FIG. 12B.

Note that the structure of this Embodiment can be readily realized by manufacturing the TFT in accordance with the steps shown in Embodiments 6 through 8. The structures of the pixel portion and the driver circuits only are shown in this embodiment. Other circuits such as a signal divider circuit, a frequency dividing circuit, a D/A converter, a γ-correction circuit, an op-amp circuit, and further signal processing circuits such as a memory circuit and a processing circuit, and still further a logic circuit, may all be formed on the same substrate in accordance with the processes of Embodiments 6 through 8. In this way, the present invention can realize a semiconductor device comprising a pixel portion and a driver circuit thereof on the same substrate, for example, a liquid crystal display device equipped with a signal controlling circuit and a pixel portion.

[Embodiment 11]

Figure 23A:
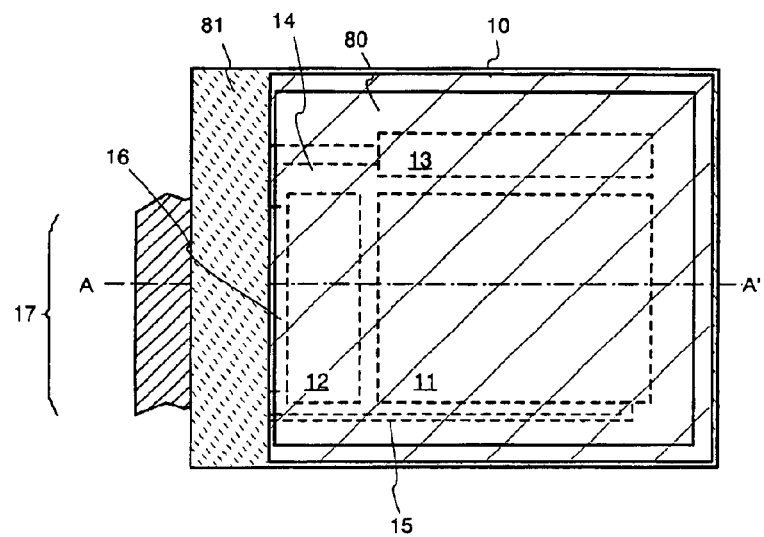
FIGS. 23A and 23B are a top view and a sectional view showing the structure of an EL display device.

In this embodiment, an example will be described where a display panel made from an EL (Electro Luminescence) material in a self-emitting type (hereinafter described as EL display device) is formed using an active matrix substrate whose forming method was shown above mentioned embodiment. The EL display device is also called a light emitting device or a light emitting diode. Further, the EL devices referred to in this specification include triplet-based light emission devices and/or singlet-based light emission devices, for example. FIG. 23A is a top view of an EL display panel using the present invention. In FIG. 23A, reference numeral 10 denotes a substrate, 11 denotes a pixel portion, 12 denotes a source-side driver circuit, and 13 denotes a gate-side driver circuit. Each driver circuit is connected to an FPC 17 through wirings 14 to 16 so as to be connected to external equipment.

Figure 23B:
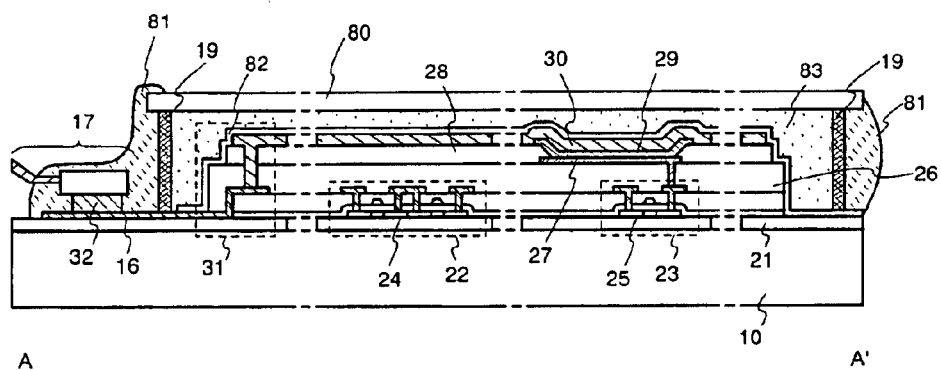

The FIG. 23B shows a sectional structure of A–A' of FIG. 23A. The counter substrate 80 is provided so as to cover at least surface of the pixel portion, preferably the driver circuits and the surface of the pixel portion. The counter substrate 80 is attached to the active matrix substrate, on which TFTs and EL layer are formed with a sealant 19. The sealant 19 is mixed with a filler (not shown in the figure), two substrate are attached together with the filler at equal spaces. Further, the outside of the sealant 19 and the top surface and the periphery portion of FPC 17 has a structure of being filled up by the sealant 81. As materials of the sealant 81, silicone resin, epoxy resin, phenol resin and butyl rubber are used.

As it is, the active matrix substrate 10 and the counter substrate 80 are attached together with a sealant 19, space is generated therebetween. A filler 83 is filled with the space. The filler 83 has an effect of attachment of the counter substrate 80. The PVC (polyvinyl chloride), epoxy resin, silicone resin, PVB (polyvinyl butyral), and EVA (ethylene vinyl acetate) can be used as the filler 83. An EL layer is weak to moisture such as water and is likely to be degraded, so that it is preferable to mix a drying agent such as barium oxide in the filler 83 so as to keep an effect of moisture absorption. Further, a passivation film 82 is formed on the EL layer by the silicon nitride film and silicon oxynitride film to protect from corrosion by alkali element which contains in the filler 83.

A glass plate, an aluminum plate, a stainless steel plate, an FRP (fiberglass-reinforced plastics) plate, a PVF (polyvinyl fluoride) film, a Mylar film (a product of DUPONT Corp.), a polyester film, and an acrylic film or acrylic plate can be used as the counter substrate 80. A sheet having a structure in which several ten μm thick aluminum foil is interposed between a PVF film and a Mylar film, is used to enhance resistance to moisture. In this manner, the EL element is completely sealed and is not exposed to the outside of air.

In FIG. 23B, the TFT 22 for a driving circuit (CMOS circuit which is composed of n-channel type TFT and p-channel type TFT is shown here), and the TFT 23 for a pixel portion (only TFT controlling current to an EL element is shown here) are formed on a substrate 10 and a base film 21. Among these TFTs, in particular, n-channel TFT is provided with an LDD region having the structure shown in the present embodiment so as to prevent the decrease of the n current value due to hot carrier, or the deterioration of the properties caused by Vth shift and bias stress.

For example, as the TFT 22 for a driver circuit, the p-channel TFT 200, 202 or the n-channel TFT 201, 203 shown in FIG. 12b may be used. Furthermore, as the TFT 23 for a pixel portion, a pixel TFT 204 shown in FIG. 12B or a p-channel TFT having a similar structure can be used.

Figure 13B:
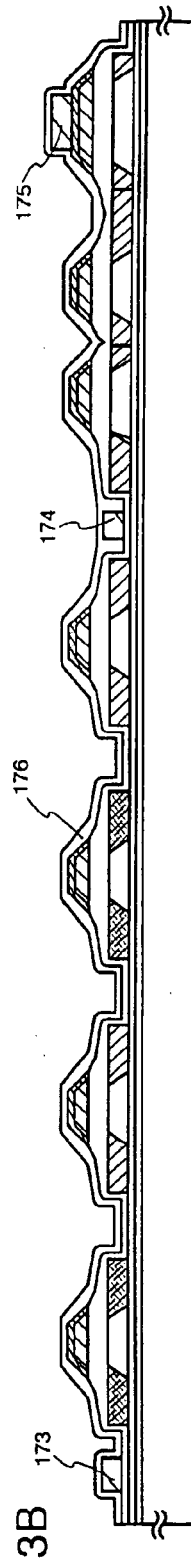

To manufacture the EL display device from an active matrix substrate in a state of FIG. 12B or FIG. 13B, an interlayer insulating film (a flatten film) 26 made of resin material, is formed on the source line and the drain line, and a pixel electrode 27 made of a transparent conductive film, which is connected electrically to drain of the TFT 23 for a pixel portion, is formed thereon. As a transparent conductive film, a compound of indium oxide and tin oxide (which is called as ITO), and a compound of indium oxide and zinc oxide can be used. Then after forming the pixel electrode 27, an insulating film 28 is formed, and an opening portion is formed on the pixel electrode 27.

Next, an EL layer 29 is formed. The EL layer 29 can have a lamination structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating, printing, and an ink jet method can be used.

In this embodiment, the EL layer is formed by vapor deposition, ink jet method or dispenser method using a shadow mask. By forming light-emitting layers (red light-emitting layer, green-light emitting layer, and blue light-emitting layer) capable of emitting light with different wavelengths on respective pixels, a color display can be performed. In addition, a combination of a color conversion layer (CCM) and a color filter, or a combination of a white light-emitting layer and a color filter may be used. Needless to say, an EL display device emitting single color light can also be used.

When the EL layer 29 is formed, a cathode 30 is formed thereon. It is desirable to remove moisture and oxygen present at an interface between the cathode 30 and the EL layer 29 as much as possible. Thus, it is required to continuously form the EL layer 29 and the cathode 30 in a vacuum, or to form the EL layer 29 in an inactive atmosphere, and form the cathode 30 in a vacuum without exposing the EL layer 29 to the outside air. In this embodiment, a film formation device of a multi-chamber system (cluster tool system) is used to make the above mentioned film formation possible.

In this embodiment, as the cathode 30, a lamination structure of a LiF (lithium fluoride) film and an Al (aluminum) film is used. More specifically, the LiF film is formed to a thickness of 1 nm on the EL layer 29 by vapor deposition, and an Al film is formed to a thickness of 300 nm thereon. It is appreciated that a MgAg electrode that is a known negative electrode material may be used. The cathode 30 is connected to the wiring 16 in a region denoted by reference numeral 31. The wiring 16 is a power supply line for supplying a predetermined voltage to the cathode 30, and is connected to the FPC 17 via anisotropic conductive paste material 32. A resin layer 80 is further formed on the FPC 17 so as to enhance adhesiveness in this portion.

In order to electrically connect the cathode 30 to the wiring 16 in the region 31, it is required to form contact holes in the interlayer insulating film 26 and the insulating film 28.

The contact holes may be formed during etching of the interlayer insulating film 26 (during formation of a contact hole for a pixel electrode) or during etching of the insulating film 28 (during formation of an opening portion before forming the EL layer). Furthermore, when the insulating film 28 is etched, the interlayer insulating film 26 may also be etched together. In this case, if the interlayer insulating film 26 and the insulating film 28 are made of the same resin material, the shape of the contact holes can be made fine.

Furthermore, the wiring 16 is electrically connected to the FPC 17 through a gap between the sealant 19 and the substrate 10 (the gap is filled with a sealant 81). Herein, although description is made with respect to the wiring 16, the other wirings 14 and 15 are also electrically connected to the FPC 17 through under a sealant 19.

Figures 24A, 24B:
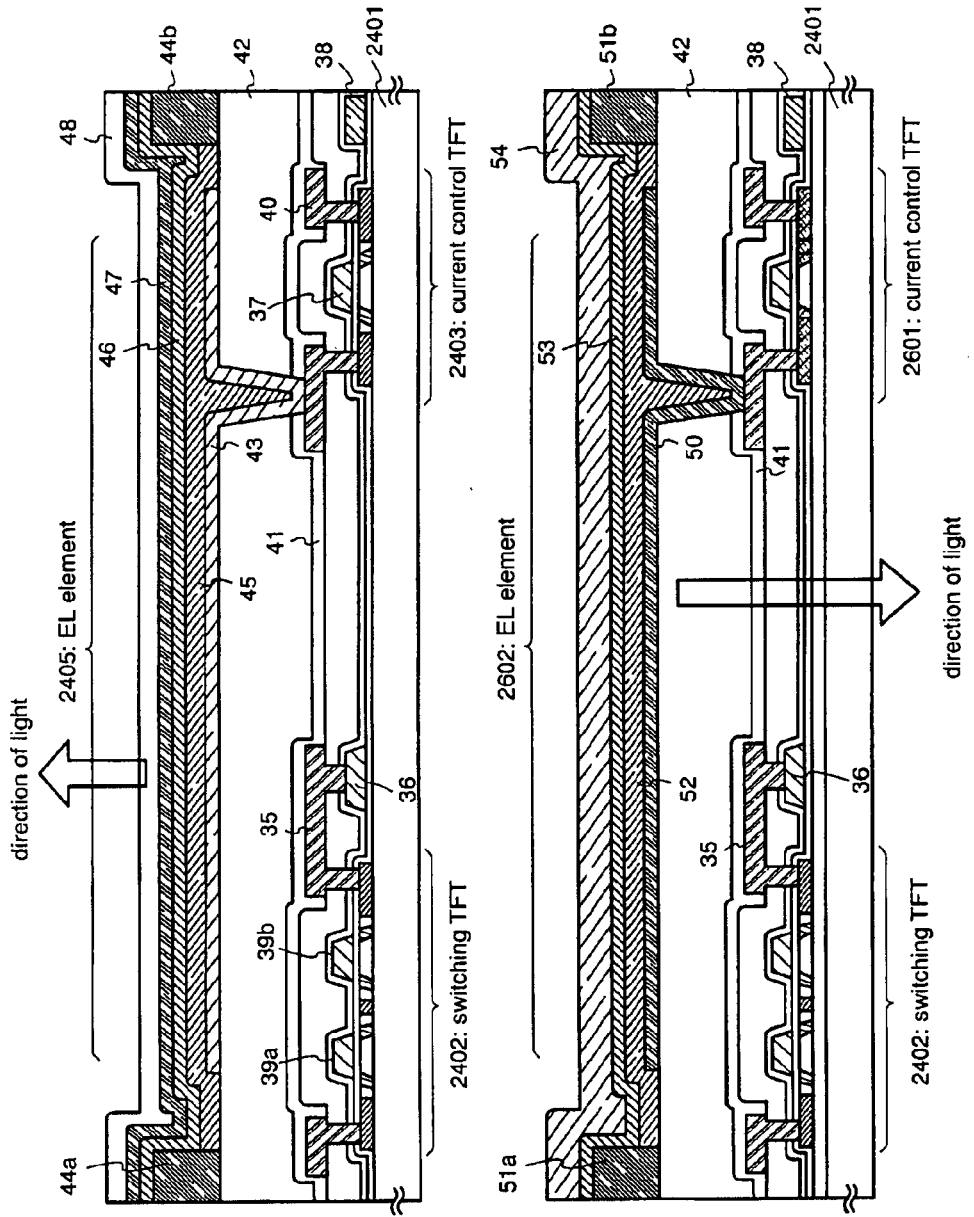
FIGS. 24A and 24B are sectional views each showing the pixel unit of the EL display device.
Figure 25A:
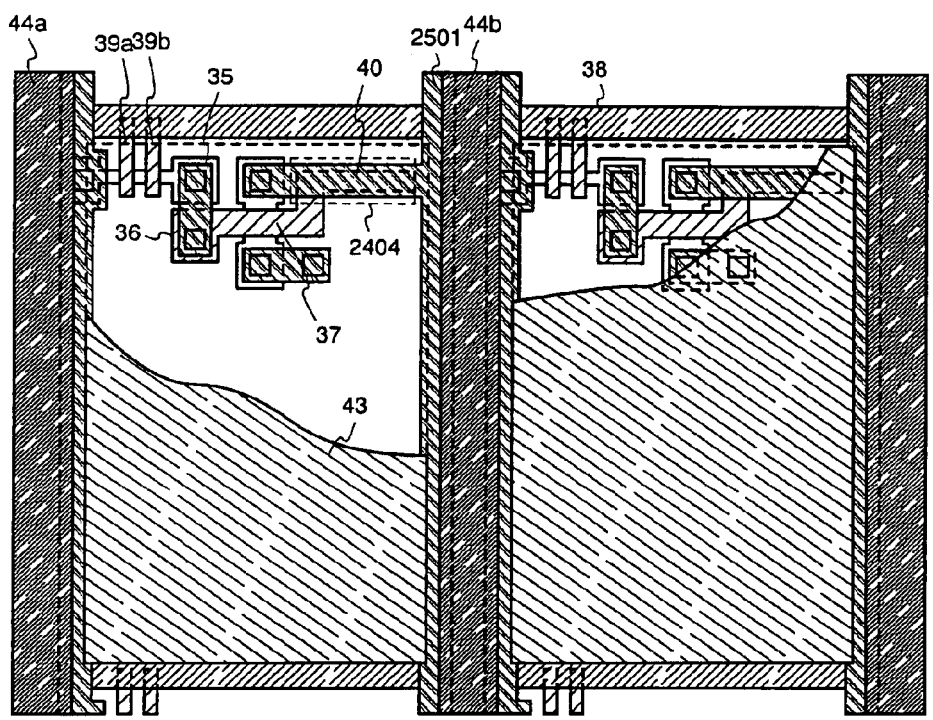
FIGS. 25A and 25B are a top view and a circuit diagram of the pixel unit of the EL display device, respectively.
Figure 25B:
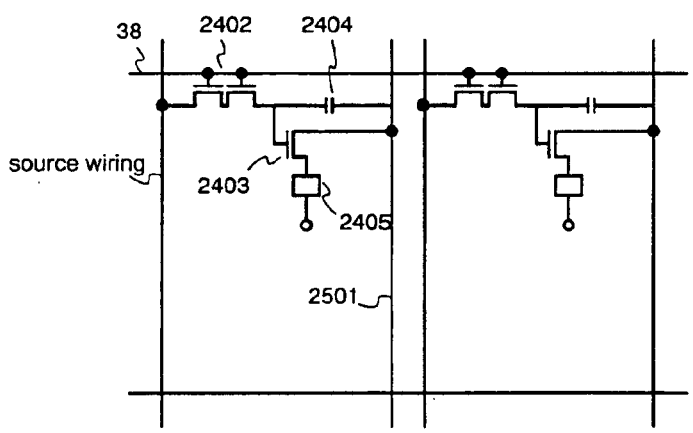

FIG. 24 shows a more detailed cross-sectional structure of the pixel portion. FIG. 25A shows a top view thereof, and FIG. 25B shows a circuit diagram thereof. In FIG. 24A, a switching TFT 2402 provided on a substrate 2401 is formed according to the same structure of the pixel TFT 204 shown in FIG. 12B of Embodiment 6. Due to the double-gate structure, there is an advantage in that substantially two TFTs are connected in series to reduce an OFF current value. In this embodiment, the TFT 2402 has a double-gate structure; however, it may have a triple gate structure, or a multi-gate structure having more gates.

A current controlling TFT 2403 is formed by using the n-channel TFT 201 shown in FIG. 12B. At this time, a drain wiring 35 of the switching TFT 2402 is electrically connected to a gate electrode 37 of the current controlling TFT by a wiring 36. Furthermore, a wiring 38 is a gate wiring electrically connected to gate electrodes 39a and 39b of the switching TFT 2402.

At this time, it is very important that the current controlling TFT 2403 has a structure of the present invention. The current controlling TFT functions as an element for controlling the amount of a current flowing through an EL element, so that the current controlling TFT 2403 is likely to be degraded by heat and hot carriers due to a large amount of current flown therethrough. Therefore, an LDD region overlapping with a gate electrode, is provided on the current controlling TFT, thereby preventing the deterioration of TFT and enhancing the stability of the operation.

Furthermore, in this embodiment, the current controlling TFT 2403 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 25A, a wiring to be the gate electrode 37 of the current controlling TFT 2403 overlaps a drain wiring 40 of the current controlling TFT 2403 via an insulating film in a region 2404. In the region 2404, a capacitor is formed. The capacitor 2404 functions for holding a voltage applied to a gate of the current controlling TFT 2403. The drain wiring 40 is connected to a current supply line (power source line) 2501 so as to be always supplied with a constant voltage.

A first passivation film 41 is provided on the switching TFT 2402 and the current controlling TFT 2403, and a flattening film 42 that is made of a resin insulating film is formed thereon. It is very important to flatten the step difference due to TFTs by using the flattening film 42. The step difference may cause a light-emitting defect because the EL layer to be formed later is very thin. Thus, it is desirable to flatten the step difference so that the EL layer is formed on a flat surface before forming a pixel electrode.

Reference numeral 43 denotes a pixel electrode (cathode of an EL element) that is made of a conductive film with high reflectivity and is electrically connected to the drain of the current controlling TFT 2403. As the pixel electrode 43, a low resistant conductive film such as an aluminum alloy film, a copper alloy film, and a silver alloy film, or a lamination film thereof can be preferably used. Needless to say, a lamination structure with other conductive films may also be used. A light-emitting layer 45 is formed in a groove (corresponding to a pixel) formed by banks 44a and 44b made of an insulating film (preferably resin). Herein, only one pixel is shown, however, light-emitting layers corresponding to each color R (red), G (green), and B (blue) may be formed. As an organic EL material for the light-emitting layer, a ठ-conjugate polymer material is used. Examples of the typical polymer material include polyparaphenylene vinylene (PPV), polyvinyl carbazole (PVK), and polyfluorene. There are various types of PPV organic EL materials. For example, materials as described in "H. Shenk, H. Becker, O. Gelsen, E. Kluge, W. Kreuder and H. Spreitzer, "Polymers for Light Emitting Diodes", Euro Display, Proceedings, 1999, pp. 33–37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm). The above-mentioned organic EL materials are merely examples for use as a light-emitting layer, so that the present invention is not limited thereto. A light-emitting layer, an electric charge transporting layer, or an electric charge injection layer may be appropriately combined to form an EL layer (for light emitting and moving carriers therefore). For example, in this embodiment, the case where a polymer material is used for the light-emitting layer has been described. However, a low molecular-weight organic EL material may be used. Furthermore, an inorganic material such as silicon carbide can also be used for an electric charge transporting layer and an electric charge injection layer. As these organic EL materials and inorganic materials, known materials can be used.

In this embodiment, an EL layer with a lamination structure is used, in which a hole injection layer 46 made of PEDOT (polythiophene) or PAni (polyaniline) is provided on the light-emitting layer 45. An anode 47 made of a transparent conductive film is provided on the hole injection layer 46. In this embodiment, light generated by the light-emitting layer 45 is irradiated to the upper surface (toward the upper of TFTs), so that the anode must be transparent to light. As a transparent conductive film, a compound of indium oxide and tin oxide, and a compound of indium oxide and zinc oxide can be used. The conductive film is formed after forming the light-emitting layer and the hole injection layer with low heat resistance, so that the conductive film that can be formed at a possibly low temperature is preferably used.

When the anode 47 is formed, the EL element 2405 is completed. The EL element 2405 refers to a capacitor composed of the pixel electrode (cathode) 43, the light-emitting layer 45, the hole injection layer 46, and the anode 47. As show in FIG. 26A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the anode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a pixel portion made of a pixel with a structure as shown in FIG. 25, and includes a switching TFT having a sufficiently low OFF current value and a current controlling TFT that is strong to the injection of hot carriers. Thus, an EL display panel having high reliability and is capable of displaying a satisfactory image, is obtained.

In this embodiment, referring to FIG. 24B, the case will be described where the structure of the EL layer is reversed. The current control TFT 2601 is formed using a p-channel type TFT 200 of FIG. 12B. The manufacturing process is referred to Embodiment 6. In this embodiment, a transparent conductive film is used as a pixel electrode (anode) 50. Specifically, a conductive film comprising a compound of indium oxide and zinc oxide. Needless to say, a conductive film made of a compound of indium oxide and tin oxide may be used.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 2602 is formed. In this embodiment, light generated by the light-emitting layer 53 is irradiated toward the substrate on which a TFT is formed as represented by an arrow. In the case of the structure of this embodiment, it is preferable that the current controlling TFT 2601 is formed of a p-channel TFT.

This embodiment can be realized by being appropriately combined with the structures of TFT in Embodiments 6 and 7. Furthermore, it is effective to use the EL display panel of this embodiment as a display portion of electronic equipment of Embodiment 13.

[Embodiment 12]

In this embodiment, referring to FIG. 26, the case will be described where a pixel having a structure different from that of the circuit diagram shown in FIG. 25B is used. Reference numeral 2701 denotes a source wiring of a switching TFT 2702, 2703 denotes a gate wiring of the switching TFT 2702, 2704 denotes a current controlling TFT, 2705 denotes a capacitor, 2706 and 2708 denote current supply lines, and 2707 denotes an EL element.

Figure 26A:
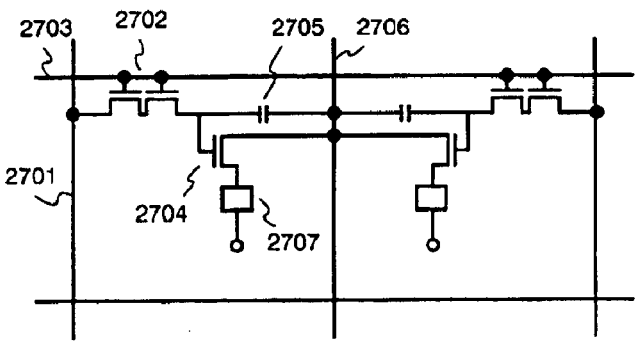
FIGS. 26A through 26C are circuit diagrams each showing an example of the pixel unit of the EL display device.

FIG. 26A shows the case where two pixels share the current supply line 2706. More specifically, two pixels are formed so as to be axisymmetric with respect to the current supply line 2706. In this case, the number of power supply lines can be reduced, so that the pixel portion is allowed to have a higher definition.

Figure 26B:
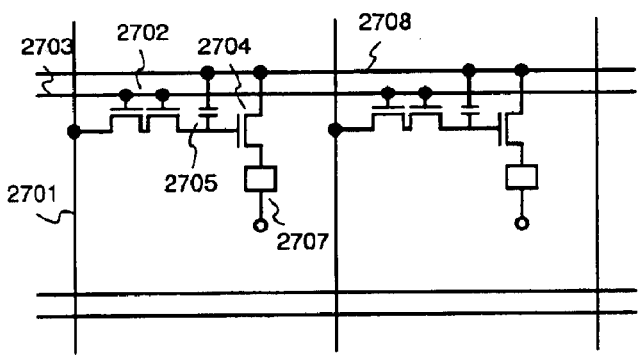

Furthermore, FIG. 26B shows the case where the current supply line 2708 and the gate wiring 2703 are provided in parallel. In FIG. 26B, although the current supply line 2708 does not overlap the gate wiring 2703, if both lines are formed on different layers, they can be provided so as to overlap each other via an insulating film. In this case, the current supply line 2708 and the gate wiring 2703 can share an occupied area, so that a pixel portion is allowed to have higher definition.

Figure 26C:
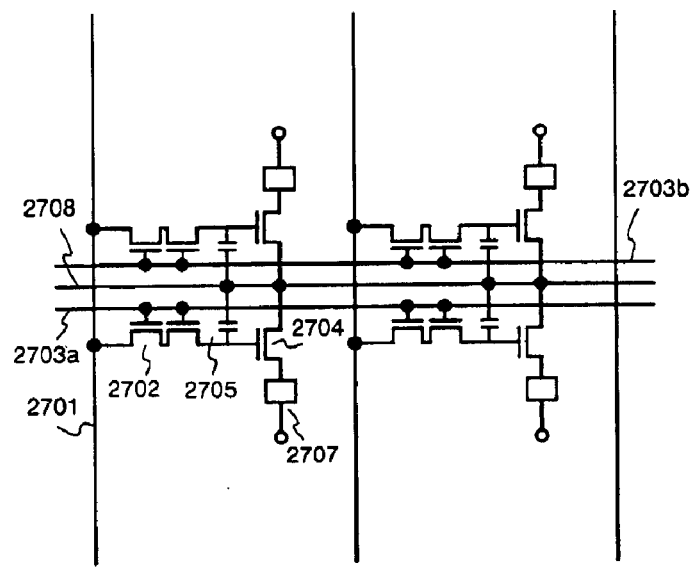

Furthermore, FIG. 26C shows the case where the current supply line 2708 and gate wiring 2703a, and 2703b are provided in parallel in the same way as in FIG. 26B, and two pixels are formed so as to be axisymmetric with respect to the current supply line 2708. It is also effective to provide the current supply line 2708 so as to overlap one of the gate wirings 2703. In this case, the number of the power supply lines can be reduced, so that a pixel portion is allowed to have higher definition. In FIGS. 26A and 26B, the capacitor 2705 is provided so as to hold a voltage applied to a gate of the current controlling TFT 2704. However, the capacitor 2705 can be omitted.

Since the n-channel TFT according to the present invention as shown in FIG. 24A is used as the current controlling TFT 2403, the current controlling TFT 2403 has an LDD region provided so as to overlap a gate electrode via a gate insulating film. In this overlapping region, a parasitic capacitor called as a gate capacitor is generally formed. This embodiment is characterized in that the parasitic capacitor is actively used in place of the capacitor 2705. The capacitance of the parasitic capacitor is varied depending upon the area in which the above-mentioned gate electrode overlaps the LDD region. Therefore, the capacitance is determined by the length of the LDD region included in the region. Similarly, in the structure shown in FIGS. 26A, 26B, and 26C, the capacitor 2705 can also be omitted.

This embodiment can be realized by being appropriately combined with the structures of TFT in Embodiments 6 and 7. Furthermore, it is effective to use an EL display panel of this embodiment as a display portion of electronic equipment of Embodiment 13.

[Embodiment 13]

The CMOS circuit and the pixel portion formed by implementing the present invention can be used in various electro-optical devices (active matrix type liquid crystal display device, active matrix type EL display device, and active matrix EC display). That is, the present invention can be implemented in all electronic equipment that incorporate these electro-optical devices as a display portion.

The following can be given as such electronic equipment: a video camera, a digital camera, a projector (a rear type or a front type), a head mount display (goggle type display), a car navigation system, a car stereo, a personal computer, a portable information terminal (such as a mobile computer, a cellular phone, and an electronic book) etc. Some examples of these are shown in FIG. 27, FIG. 28 and FIG. 29.

Figure 27A:
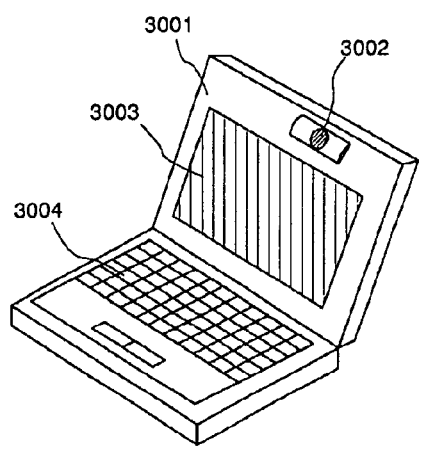
FIGS. 27A through 27F are schematic views each showing an example of a semiconductor device.

FIG. 27A shows a personal computer that is comprised of a main body 3001, an image input portion 3002, a display portion 3003, and a keyboard 3004. The present invention can be applied to the image input portion 3002, the display portion 3003 and the other signal control circuit.

Figure 27B:
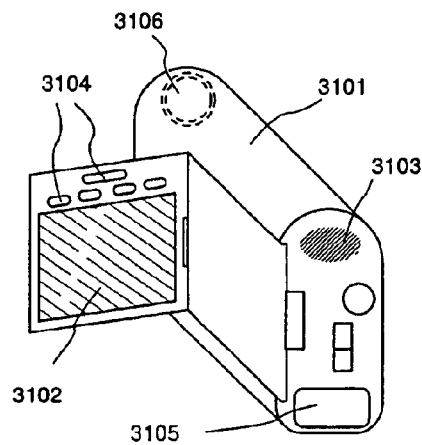

FIG. 27B shows a video camera that is comprised of a main body 3101, a display portion 3102, an audio input portion 3103, operation switches 3104, a battery 3105, and an image receiving portion 3106. The present invention can be applied to the display portion 3102, and other signal control circuit.

Figure 27C:
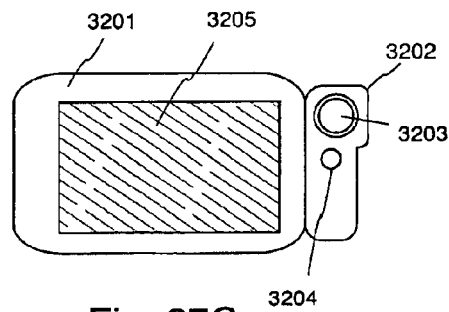

FIG. 27C shows a mobile computer that is composed of a main body 3201, a camera portion 3202, an image receiving portion 3203, operation switches 3204, and a display portion 3205. The present invention can be applied to the display portion 3205 and other signal control circuit.

Figure 27D:
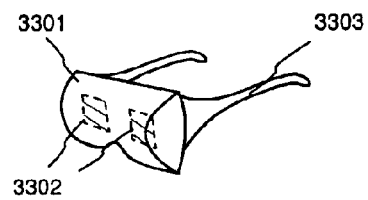

FIG. 27D shows a goggle type display that is comprised of a main body 3301, display portions 3302, and arm portions 3303. The present invention can be applied to the display portion 3302 and other signal control circuit.

Figure 27E:
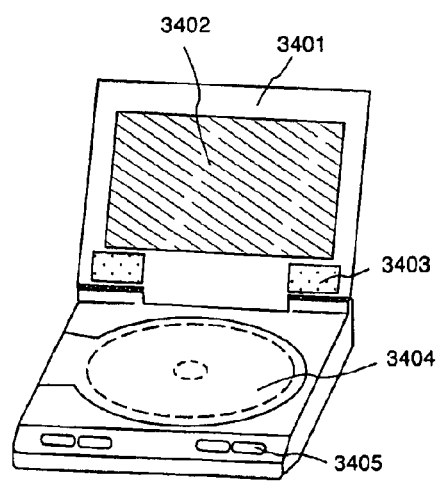

FIG. 27E shows a player which uses a recording medium in which a program is stored (hereinafter referred to as a recording medium) and which is comprised of a main body 3401, a display portion 3402, speaker portions 3403, a recording medium 3404, and operation switches 3405. A DVD (Digital Versatile Disc), a CD or the like is used as the recording medium to enable the player to appreciate music and the movies, and play a game or the Internet. The present invention can be applied to the display portion 3402 and other signal control circuit.

Figure 27F:
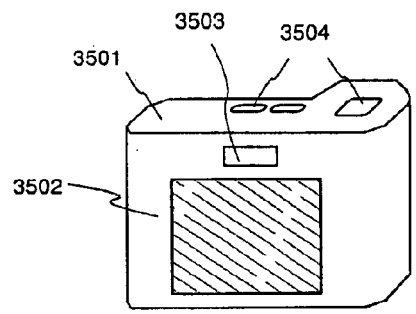

FIG. 27F shows a digital camera that is comprised of a main body 3501, a display portion 3502, an eye-piece portion 3503, operation switches 3504, and an image receiving portion (not shown in the figure). The present invention can be applied to the display portion 3502 and other signal control circuit.

Figure 28A:
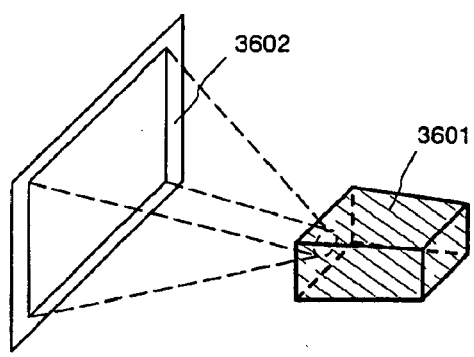
FIGS. 28A through 28D are schematic views each showing an example of a semiconductor device.

FIG. 28A shows a front type projector that is comprised of a projection unit 3601, a screen 3602, and the like. The present invention can be applied to a liquid crystal display device 3808 which is a part structuring the projection unit 3601 and other signal control circuit.

Figure 28B:
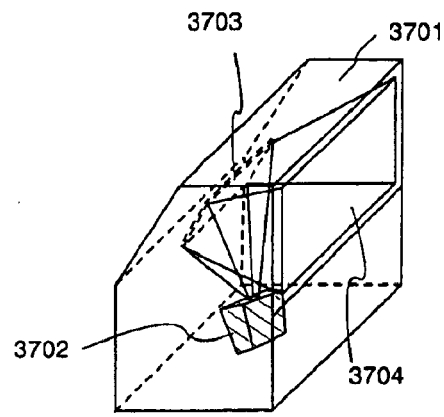

FIG. 28B shows a rear type projector that is comprised of a main body 3701, a projection unit 3702, a mirror 3703, a screen 3704, and the like. The present invention can be applied to the liquid crystal display device 3808 which is a part structuring the projection unit 3702 and other signal control circuit.

Figure 28C:
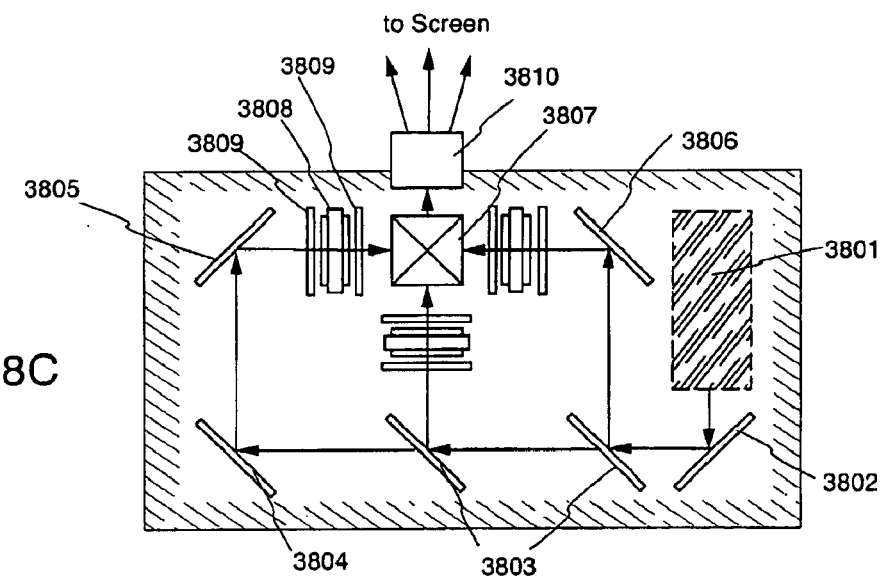

Illustrated in FIG. 28C is an example of the structure of the projection units 3601 and 2702 that are shown in FIGS. 28A and 28B, respectively. Each of the projection units 3601 and 2702 is comprised of a light source optical system 3801, mirrors 3802 and 3804 to 3806, dichroic mirrors 3803, a prism 3807, liquid crystal display devices 3808, phase difference plates 3809, and a projection optical system 3810. The projection optical system 3810 is constructed of an optical system including projection lenses. An example of a three plate system is shown in the present embodiment, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 28C.

Figure 28D:
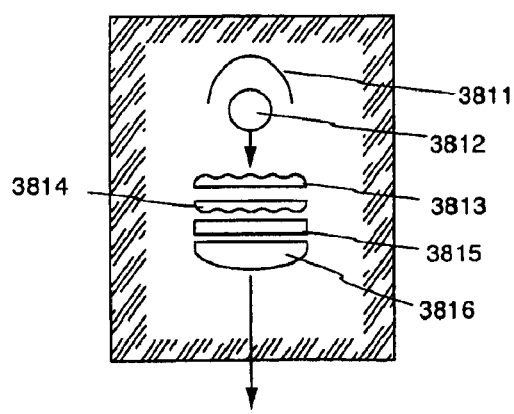

In addition, FIG. 28D shows an example of the structure of the light source optical system 3801 of FIG. 28C. In the present embodiment, the light source optical system 3801 is composed of a reflector 3811, a light source 3812, a lens array 3813 and 3814, a polarizing conversion element 3815, and a condenser lens 3816. Note that the light source optical system shown in FIG. 28D is an example, and it is not limited to the illustrated structure. For example, the operator may suitably set optical systems such as optical lenses, polarizing film, film to regulate the phase difference, and IR film.

The projector illustrated in FIG. 28, show the electro-optical device of transparent type but the example of the electro-optical device of reflection type and the EL display device.

Figure 29A:
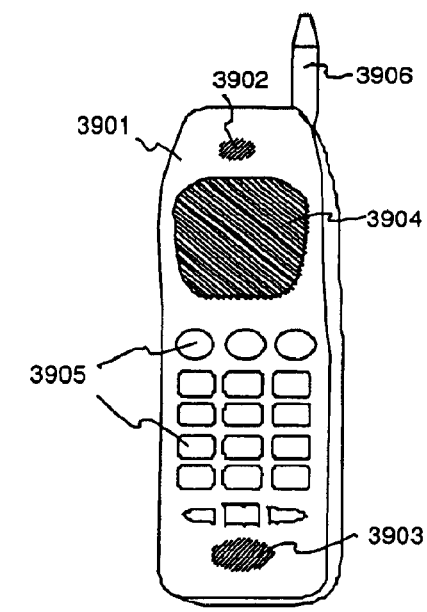
FIGS. 29A through 29C are schematic views each showing the construction of a liquid-crystal display device of projection type.

FIG. 29A shows a cellular phone that is comprised of a main body 3901, an audio output portion 3902, an audio input portion 3903, a display portion 3904, an operation switches 3905 and an antenna 3906 etc. The present invention can be applied to the audio output portion 3902, the audio input portion 3903, the display portion 3904 and other signal control circuit.

Figure 29B:
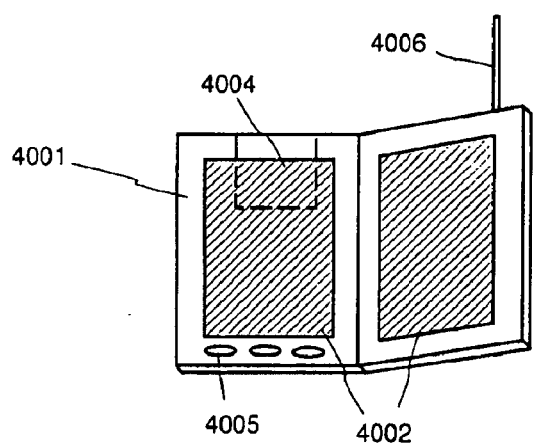

FIG. 29B shows a mobile book (electronic book) that is comprised of a main body 4001, a display portion 4002, 4003, a recording medium 4004, an operation switches 4005 and a antenna 4006 etc. The present invention can be applied to the display portion 4002, 4003 and other signal control circuit.

Figure 29C:
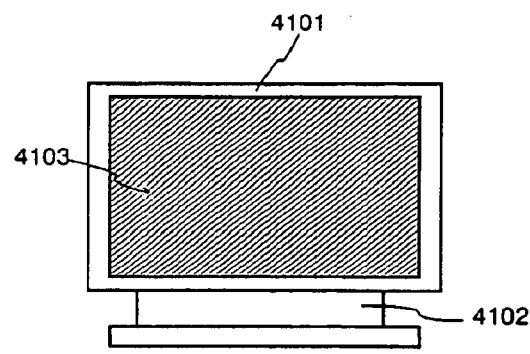

FIG. 29C shows a display that is comprised of a main body 4101, a support stand 4102 and display portion 4103 etc. The present invention can be applied to the display portion 4103. They are especially advantageous for cases in which the screen is made large, and is favorable for displays having a diagonal greater than or equal to 10 inches (especially one which is greater than or equal to 30 inches).

Thus, the application range for the present invention is extremely wide, and it may be applied to electronic equipment in all fields. Further, the electronic equipment of this Embodiment can be realized with a composition that uses any combination of Embodiments 4 to 12.

With an optical system for a rectilinear laser beam according to the present invention, the positional adjustments of the optical system become very easy. Besides, since the optical system is entirely constructed of reflectors, the rectilinear laser beam can be easily elongated. The elongation brings forth the effect that a large-area substrate can be irradiated with the laser beam at a high throughput. When the techniques of the present invention are applied to, for example, a mass-production line for low-temperature poly-silicon TFTs, the TFTs of favorable operating characteristics can be efficiently fabricated.

What is claimed is:

1. A beam homogenizer for forming a laser beam elongated in one direction on an irradiated surface, comprising:

two reflectors for reflecting and splitting said laser beams, wherein one of said two reflectors comprises a plurality of convex mirrors, and the other one of said two reflectors comprises a plurality of concave mirrors.

2. A beam homogenizer of claim 1, wherein said laser beam has a length of 600 mm or more along said one direction on said irradiated surface.

3. A beam homogenizer for forming a laser beam elongated in one direction on an irradiated surface, comprising:

two reflectors for reflecting and splitting said laser beam, wherein one of said two reflectors comprises a plurality of convex and concave mirrors, and the other one of said two reflectors comprises a plurality of concave mirrors.

4. A beam homogenizer of claim 3, wherein said laser beam has a length of 600 mm or more along said one direction on said irradiated surface.

5. A beam homogenizer for forming a laser beam elongated in one direction on an irradiate surface, comprising:

two reflectors for reflecting and splitting said laser beam wherein one of said two reflectors comprises a plurality of concave mirrors, and the other one of said two reflectors comprises a plurality of plane mirrors.

6. A beam homogenizer of claim 5, wherein said laser beam has a length of 600 mm or more along said one direction on said irradiated surface.

7. A laser irradiation apparatus for forming a laser beam elongated in one direction on an irradiate surface, comprising:

a laser oscillator; and two reflectors for reflecting and splitting said laser beam, wherein one of said two reflector comprises a plurality of convex mirrors, and the other one of said two reflectors comprises a plurality of concave mirrors.

8. A laser irradiation apparatus of claim 7, wherein said laser beam has a length of 600 mm or more along said one direction on said irradiated surface.

9. A laser irradiation apparatus of claim 7, wherein said laser oscillator is a member selected from the group consisting of an excimer laser, a YAG laser and a glass laser.

10. A laser irradiation apparatus of claim 7, wherein said laser oscillator is a member selected from the group consisting of a $YVO_4$ laser, a YLF laser and an Ar laser.

11. A laser irradiation apparatus for forming a laser beam elongated in one direction on an irradiate surface, comprising:

a laser oscillator; and two reflectors for reflecting and splitting said laser beam, wherein one of said two reflectors comprises a plurality of convex and concave mirrors, and the other one of said two reflectors comprises a plurality of concave mirrors.

12. A laser irradiation apparatus of claim 11, wherein said laser beam has a length of 600 mm or more along said one direction on said irradiated surface.

13. A laser irradiation apparatus of claim 11, wherein said laser oscillator is a member selected from the group consisting of an excimer laser, a YAG laser and a glass laser.

14. A laser irradiation apparatus of claim 11, wherein said laser oscillator is a member selected from the group consisting of a $YVO_4$ laser, a YLF laser and an Ar laser.

15. A laser irradiation apparatus for forming a laser beam elongated in one direction on an irradiate surface, comprising:

a laser oscillator;

a first reflector for reflecting and splitting said laser beam, said first reflector including a plurality of concave mirrors; and a second reflector for reflecting said laser beam, said second reflector including a plurality of plane mirrors.

16. A laser irradiation apparatus of claim 15, wherein said laser beam has a length of 600 mm or more along said one direction on said irradiated surface.

17. A laser irradiation apparatus of claim 15, wherein said laser oscillator is a member selected from the group consisting of an excimer laser, a YAG laser and a glass laser.

18. A laser irradiation apparatus of claim 15, wherein said laser oscillator is a member selected from the group consisting of a $YVO_4$ laser, a YLF laser and an Ar laser.

* * * * *